US012213297B2

(12) United States Patent
Lin et al.

(10) Patent No.: US 12,213,297 B2
(45) Date of Patent: Jan. 28, 2025

(54) SEMICONDUCTOR DEVICES WITH THRESHOLD VOLTAGE MODULATION LAYER

(71) Applicant: Taiwan Semiconductor Manufacturing Company, Ltd., Hsin-Chu (TW)

(72) Inventors: Shih-Hao Lin, Hsinchu (TW); Chih-Hsiang Huang, Hsinchu County (TW); Shang-Rong Li, Hsinchu (TW); Chih-Chuan Yang, Hsinchu (TW); Jui-Lin Chen, Taipei (TW); Ming-Shuan Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 480 days.

(21) Appl. No.: 17/464,245

(22) Filed: Sep. 1, 2021

(65) Prior Publication Data

US 2022/0352180 A1    Nov. 3, 2022

Related U.S. Application Data

(60) Provisional application No. 63/182,662, filed on Apr. 30, 2021.

(51) Int. Cl.
*H01L 21/8238* (2006.01)
*H01L 21/02* (2006.01)
(Continued)

(52) U.S. Cl.
CPC ..... *H10B 10/125* (2023.02); *H01L 21/02532* (2013.01); *H01L 21/0259* (2013.01); *H01L 21/28088* (2013.01); *H01L 21/823807* (2013.01); *H01L 21/823814* (2013.01); *H01L 21/823842* (2013.01); *H01L 21/823864* (2013.01); *H01L 29/0665* (2013.01);
(Continued)

(58) Field of Classification Search
None
See application file for complete search history.

(56) References Cited

U.S. PATENT DOCUMENTS

2020/0381432 A1\* 12/2020 Lee ............... H01L 29/78696
2021/0082918 A1    3/2021 Cheng
2021/0083054 A1\* 3/2021 Liaw ............ H01L 29/78696

\* cited by examiner

*Primary Examiner* — Sue A Purvis
*Assistant Examiner* — Carnell Hunter, III
(74) *Attorney, Agent, or Firm* — HAYNES AND BOONE, LLP

(57) ABSTRACT

A method comprises forming a first fin including alternating first channel layers and first sacrificial layers and a second fin including alternating second channel layers and second sacrificial layers, forming a capping layer over the first and the second fin, forming a dummy gate stack over the capping layer, forming source/drain (S/D) features in the first and the second fin, removing the dummy gate stack to form a gate trench, removing the first sacrificial layers and the capping layer over the first fin to form first gaps, removing the capping layer over the second fin and portions of the second sacrificial layers to from second gaps, where remaining portions of the second sacrificial layers and the capping layers form a threshold voltage ($V_t$) modulation layer, and forming a metal gate stack in the gate trench, the first gaps, and the second gaps.

20 Claims, 55 Drawing Sheets

(51) Int. Cl.
*H01L 21/28* (2006.01)
*H01L 29/06* (2006.01)
*H01L 29/423* (2006.01)
*H01L 29/49* (2006.01)
*H01L 29/66* (2006.01)
*H01L 29/786* (2006.01)
*H10B 10/00* (2023.01)

(52) U.S. Cl.
CPC .... *H01L 29/42392* (2013.01); *H01L 29/4908* (2013.01); *H01L 29/66545* (2013.01); *H01L 29/66553* (2013.01); *H01L 29/66742* (2013.01); *H01L 29/78618* (2013.01); *H01L 29/78696* (2013.01)

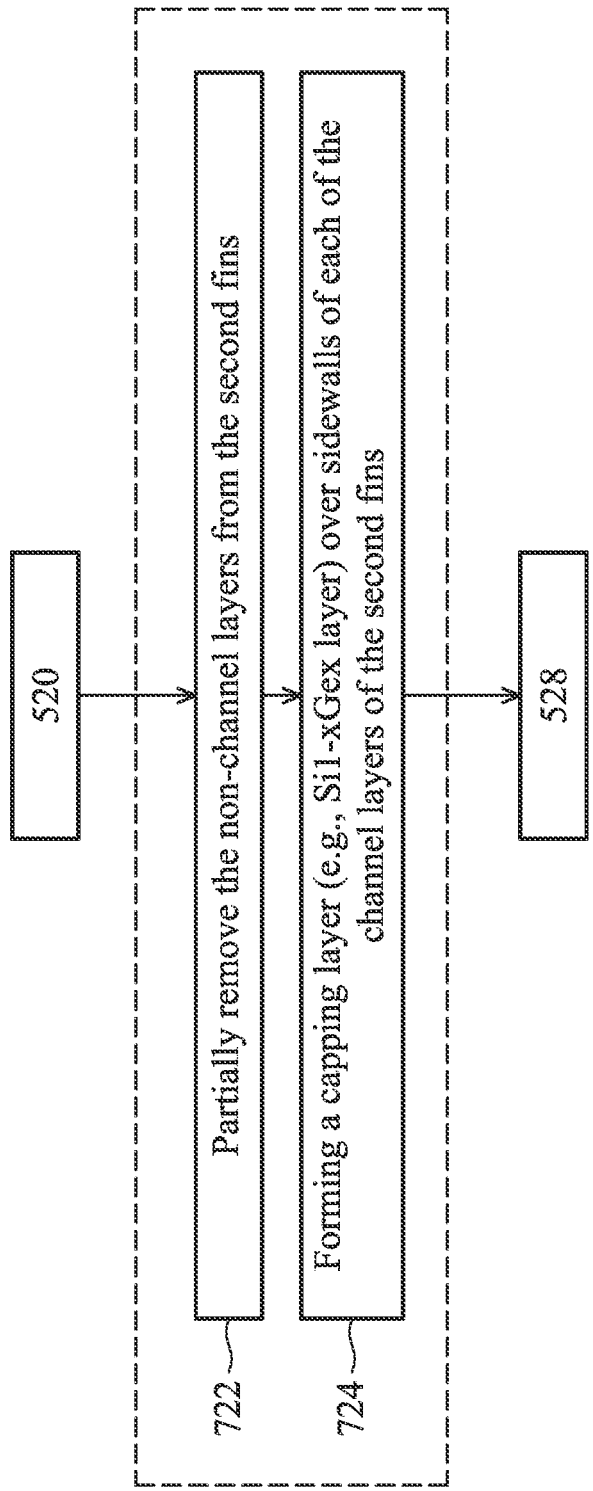

SEMICONDUCTOR DEVICES WITH THRESHOLD VOLTAGE MODULATION LAYER

CROSS-REFERENCE TO RELATED APPLICATIONS

This application claims priority to U.S. Provisional Patent Application Ser. No. 63/182,662 entitled "Sheet Formation for Semiconductor Devices" filed on Apr. 30, 2021, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, the complex patterning process of forming the metal gates and the metal gate boundary diffusion between different types of metal-oxide-semiconductor field-effect transistor (MOSFETs) may have serious bearings on the overall performance of an IC device. In some examples, metal gate boundary diffusion may lead to unstable threshold voltage ($V_t$) when separation distances between the active device regions are reduced to meet design requirements of smaller technology nodes. While methods of reducing parasitic capacitance in IC devices have been generally adequate for their intended purposes, they have not been entirely satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 27 illustrates a flow chart of a method for fabricating an IC device according to various aspects of the present disclosure.

DETAILED DESCRIPTION

Figures 1, 2:
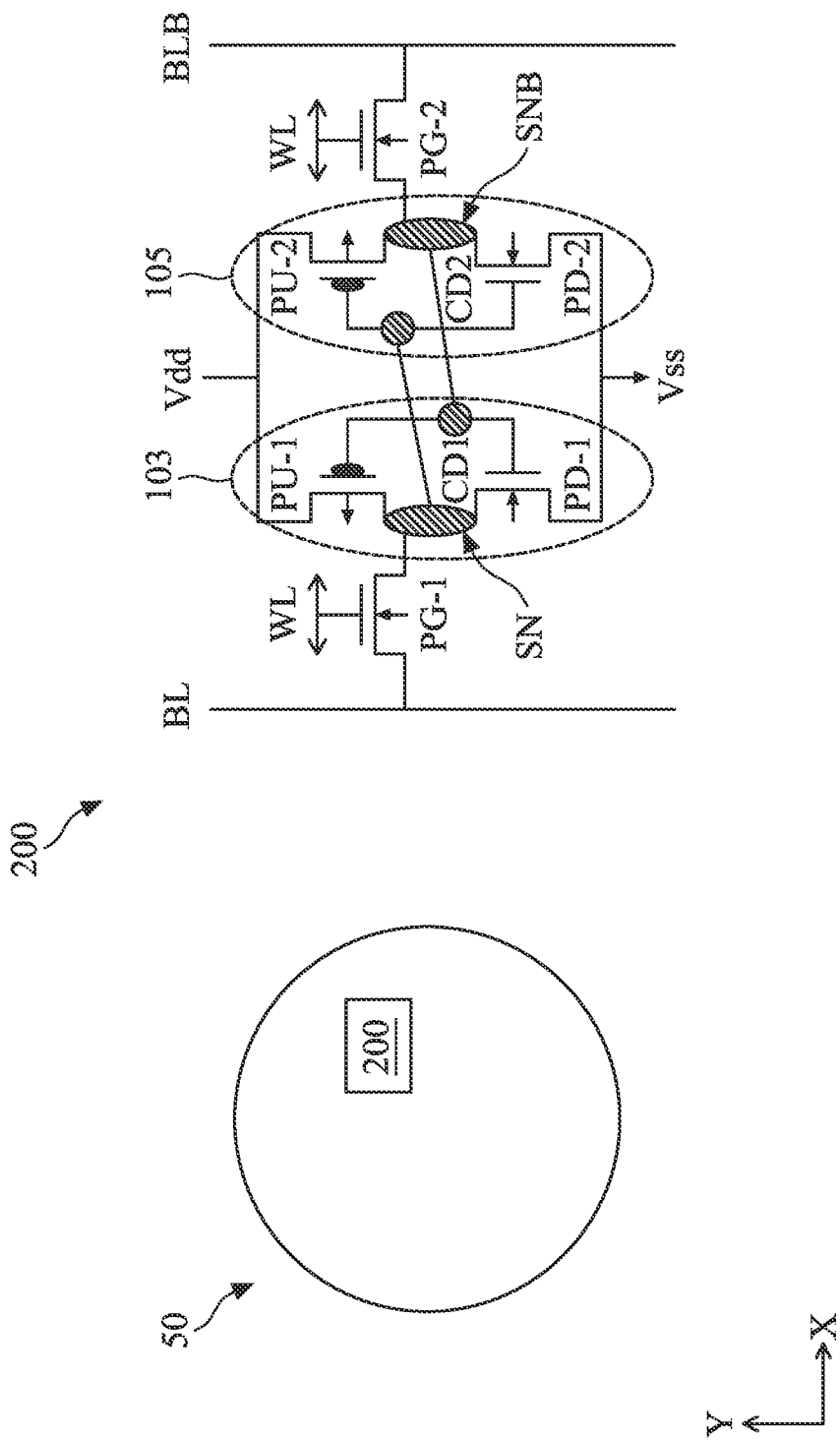
FIG. 1 is a diagrammatic plan view of an IC structure, in portion or entirety, according to various aspects of the present disclosure.
FIG. 2 is a circuit diagram of a SRAM cell, which can be implemented in a memory cell of a memory macro, according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices including field-effect transistors (FETs), such as fin field-effect transistors (FinFETs), especially three-dimensional nanostructure (NS) FETs (alternatively referred to as gate-all-around, or GAA, FETs), in memory and/or standard logic cells of an integrated circuit (IC) structure. Generally, an NS FET includes a plurality of vertically stacked sheets (e.g., nanosheets), wires (e.g., nanowires), or rods (e.g., nanorods) in a channel region of the FET, thereby allowing better gate control, lowered leakage current, and improved scaling capability for various IC applications. The present disclosure includes multiple embodiments. Different embodiments may have different advantages, and no particular advantage is necessarily required of any embodiment.

As length scales in semiconductor devices continue to decrease, reduced separation distance between vertically stacked nanostructures (e.g., nanosheets, nanorods, nanowires) in an NS FET is desired for purposes of reducing resistance in S/D features as well as capacitance between the gate (e.g., a metal gate stack) and the S/D features of a device, among others. However, in some instances, tightened separation distance between vertically stacked nanostructures may limit the formation and the performance of a metal gate stack configured to wrap around each nanostructure and may lead to a lack of flexibility in tuning the threshold voltage ($V_t$) of the metal gate stack due to a reduced number of work function metal (WFM) layers that can be formed. In addition, tightened separation distance may lead to metal gate boundary diffusion between WFM layers of n-type FETs and p-type FETs, thereby causing unstable $V_t$. Thus, for at least these reasons, improvements in the fabrication of metal gate stacks in NS FETs are desired.

Referring to FIG. 1, the present disclosure provides an IC structure (e.g., an IC chip) 50 formed over a semiconductor substrate and includes at least one IC device 200 (hereafter referred to as device 200). The device 200 is provided for illustration purposes and does not necessarily limit the embodiments of the present disclosure to any number of transistors, any number of regions, or any configuration of structures or regions. Furthermore, the device 200, or a portion thereof, may include memory devices (e.g., static random-access memory (SRAM), dynamic random-access memory (DRAM)), standard logic circuits, passive components such as resistors, capacitors, and inductors, and active components such as p-type FETs (PFETs), n-type FETs (NFETs), multi-gate FETs such as FinFETs and NS FETs, metal-oxide semiconductor field effect transistors (MOSFETs), complementary metal-oxide semiconductor FET (CMOSFET), bipolar transistors, high voltage transistors, high frequency transistors, other memory cells, and combinations thereof. Additional features can be added to the device 200 and/or the IC structure 50, and some of the features described below can be replaced, modified, or eliminated in other embodiments of the IC structure 50.

FIG. 2 illustrates an example circuit diagram of a device 200 (e.g., SRAM cell, which can be a portion of a larger SRAM array), according to various aspects of the present disclosure. FIG. 2 has been simplified for the sake of clarity to better understand the inventive concepts of the present disclosure. For example, the illustrated device 200 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Device 200 is thus referred to as a 6-transistor (6-T) SRAM cell. The 6-T SRAM cell is used for illustration and to explain the features but does not limit the embodiments or the appended claims. This non-limiting embodiment may be further extended to an 8-T SRAM cell, a 10-T SRAM cell, and to content addressable memory (CAM) cells.

In operation, pass-gate transistor PG-1 and pass-gate transistor PG-2 provide access to a storage portion of device 200, which includes a cross-coupled pair of inverters, an inverter 103 and an inverter 105. Inverter 103 includes pull-up transistor PU-1 and pull-down transistor PD-1, and inverter 105 includes pull-up transistor PU-2 and pull-down transistor PD-2. In some implementations, pull-up transistors PU-1 and PU-2 are configured as p-type field-effect transistors (PFETs), and pull-down transistors PD-1 and PD-2 are configured as n-type filed-effect transistors (NFETs). In some implementations, pass-gate transistors PG-1 and PG-2 are also configured as NFETs.

A gate of pull-up transistor PU-1 interposes a source (electrically coupled with a power supply voltage (VDD) and a first common drain (CD1), and a gate of pull-down transistor PD-1 interposes a source (electrically coupled with a power supply voltage (VSS)) and the first common drain. A gate of pull-up transistor PU-2 interposes a source (electrically coupled with power supply voltage (VDD)) and a second common drain (CD2), and a gate of pull-down transistor PD-2 interposes a source (electrically coupled with power supply voltage (VSS)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1 and PG-2 are electrically coupled with a word line WL. In some implementations, pass-gate transistors PG-1 and PG-2 provide access to storage nodes SN and SNB during read operations and/or write operations. For example, pass-gate transistors PG-1 and PG-2 couple storage nodes SN and SNB respectively to bit lines BL and BLB in response to voltage applied to the gates of pass-gate transistors PG-1 and PG-2 by word lines WLs.

When the device 200 is read from, a positive voltage is placed on the word line WL, and the pass gates PG-1 and PG-2 allow the bit lines BL and BLB to be coupled to, and receive the data from, the storage nodes SN and SNB. Unlike a dynamic memory or DRAM cell, a SRAM cell does not lose its stored state during a read, so no data "write back" operation is required after a read. The bit lines BL and BLB form a complementary pair of data lines. As is known to those skilled in the art, these paired data lines may be coupled to a differential sense amplifier (not shown); and the differential voltage read from SRAM cells can be sensed and amplified, as is known in the art. This amplified sensed signal, which is at a logic level voltage, may then be output as read data to other logic circuitry in the device.

Figure 3:
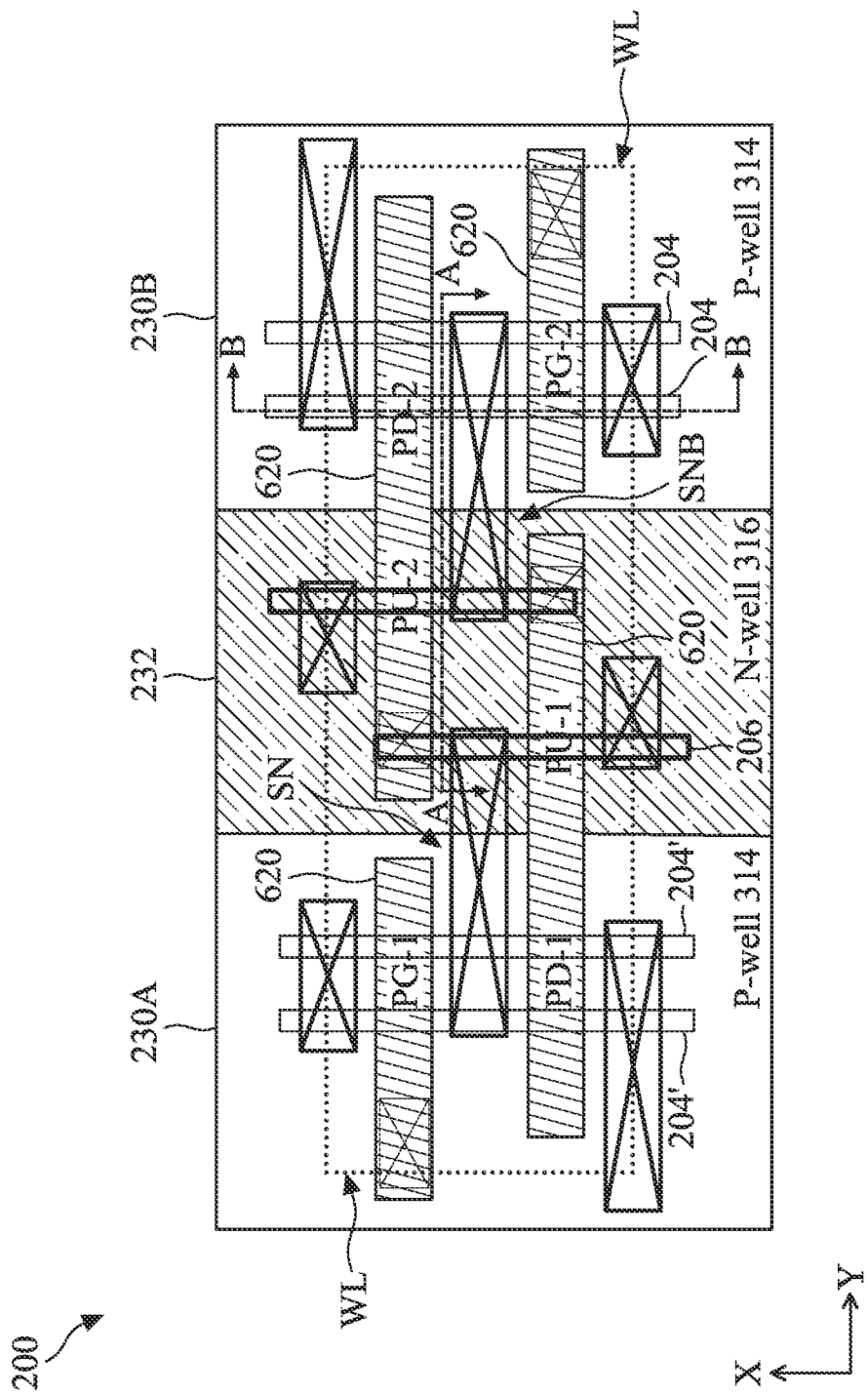
FIG. 3 is a diagrammatic plan view of a SRAM cell, which can be implemented in a memory cell of a memory macro, according to various aspects of the present disclosure.

Referring to FIG. 3, an example device 200 includes three regions 230A, 232, and 230B disposed along the Y-axis, where regions 230A and 230B are configured to include p-type three-dimensional fin-like active regions 204 and 204' disposed in a p-type doped region 314 (hereafter referred to as p-well 314), and n-type three-dimensional fin-like active regions 206 disposed in an n-type doped region 316 (hereafter referred to as n-well 316), where the n-well 316 is disposed between the two p-wells 314. Each of the fin-like active regions 204, 204', and 206 may include a fin, channel regions in the formation of fins, or multiple nanostructures vertically stacked in a fin-like shape. The fins 204 and 204' (collectively as fins 204), as well as the fins 206 are oriented lengthwise along the X-axis and spaced from each other along the Y-axis.

Device 200 further includes gate stacks (or metal gate stack) 620 oriented substantially perpendicular to the fins 204 and the fins 206 (i.e., disposed along the Y-axis). As will be discussed in detail below, a top portion 620A of each of the gate stacks 620 is disposed over top surfaces of the fins 204 and the fins 206, while a bottom portion 620B of each of the gate stacks 620 wraps around channel regions of the fins 204 and the fins 206. Each of the gate stacks 620 includes multiple layers, such as an interfacial layer 602, a gate dielectric layer 604, a WFM layer 606, a liner layer 608 and a metal fill layer 610, as explained in detail below.

Figure 4:
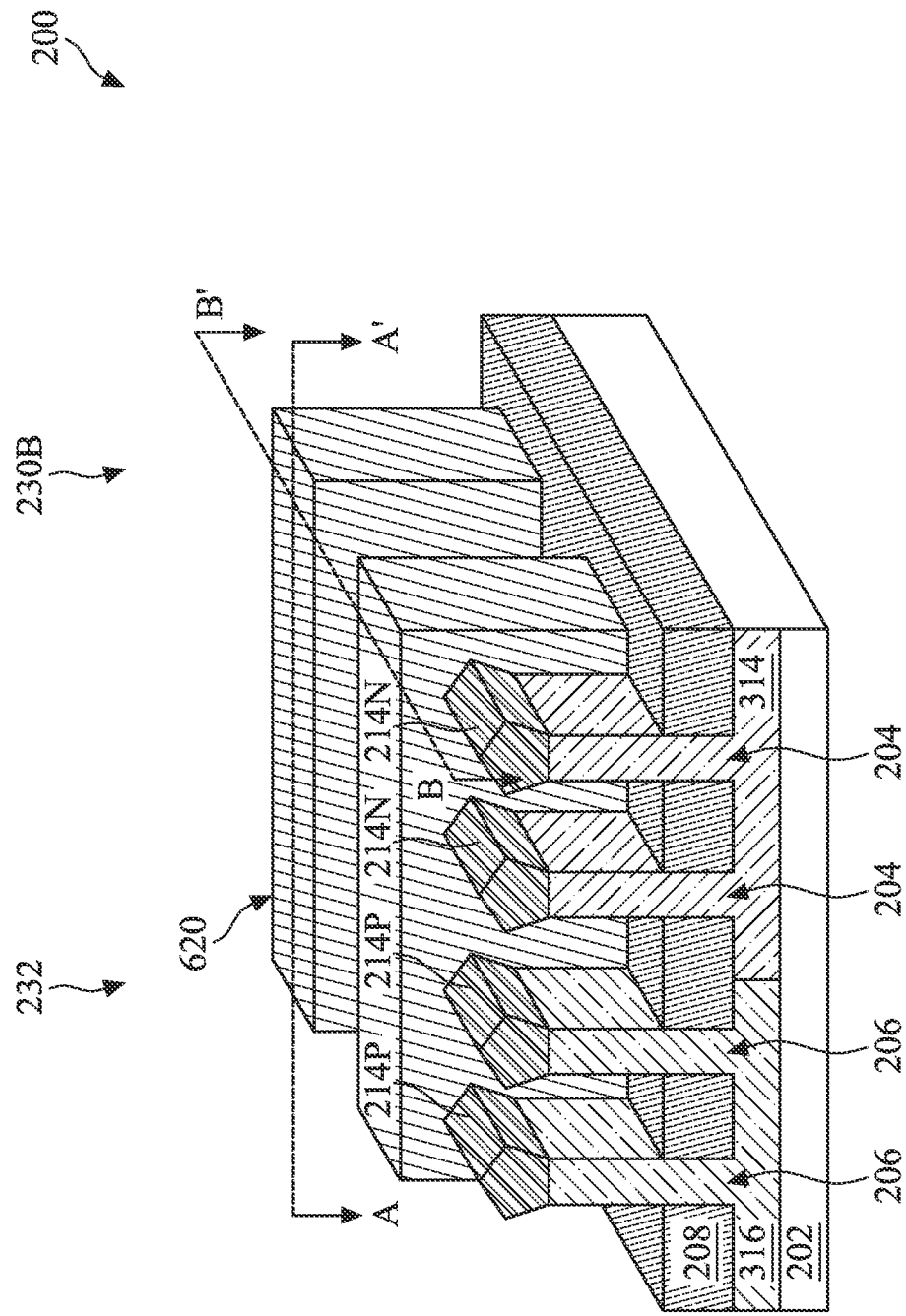
FIG. 4 is a three-dimensional perspective view of a portion of an IC device according to various embodiments of the present disclosure.
Figure 5A:
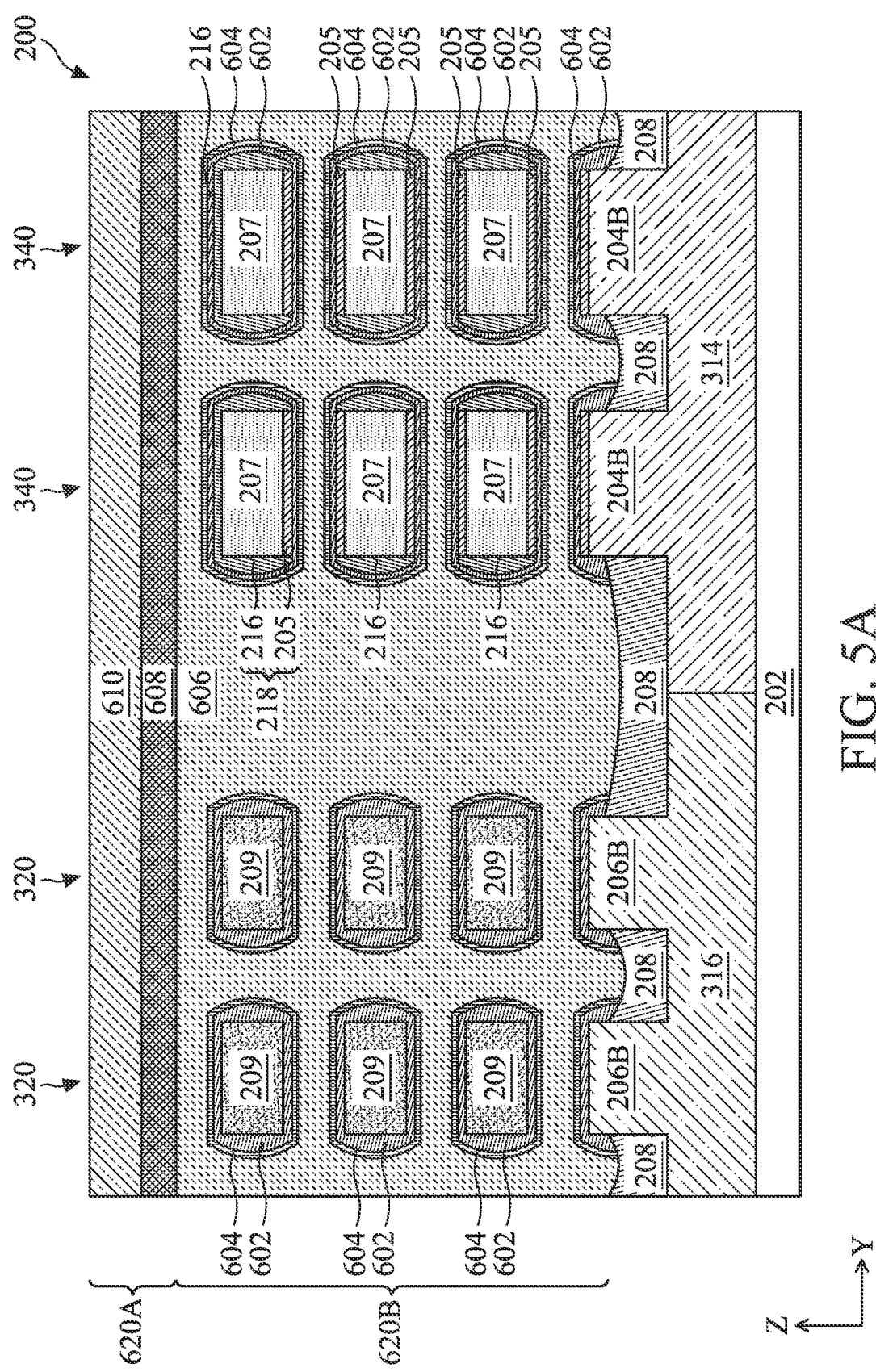
FIGS. 5A and 5B are cross-sectional views of the IC device taken along line A-A' and B-B', respectively, as shown in FIG. 4 according to various embodiments of the present disclosure.
Figure 5B:
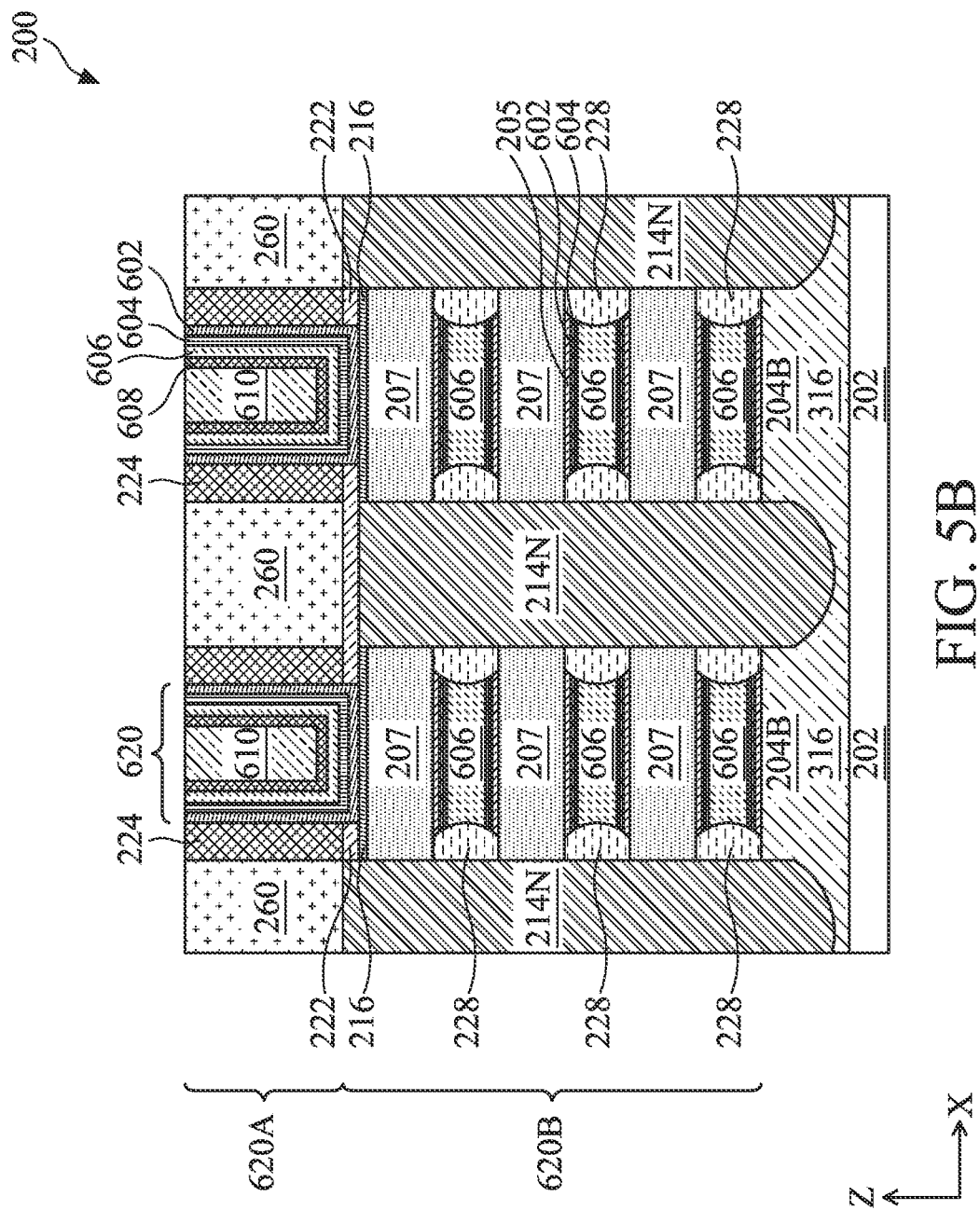

Various embodiments of the device 200 are discussed in detail below. For example, FIG. 4 is a perspective view of portions of the regions 232 and 230B of device 200. FIG. 5A is a schematic cross-sectional view of FIG. 4 taken along line A-A' and FIG. 5B is a schematic cross-sectional view of FIG. 4 taken along line B-B'. It is noted that FIGS. 2-5B have each been simplified for the sake of clarity to better illustrate embodiments of the present disclosure. As such, additional features can be added to the device 200, and some of the features described below can be replaced, modified, or eliminated in other embodiments of the device 200.

Referring now to FIGS. 4, 5A and 5B collectively, the gate stacks 620 (e.g., including the interfacial layer 602, the gate dielectric layer 604, the WFM layer 606, the liner layer 608, and the metal fill layer 610) engage with each of the fins 204 to form an n-type NS FET (hereafter referred to as a NS NFET) 340, and each of the fins 206 to form a p-type NS FET (hereafter referred to as a NS PFET) 320, where a threshold voltage ($V_t$) modulation layer 218 (e.g., a $Si_{1-x}Ge_x$ layer, a $Si_{1-x}Ga_x$ layer, a $Si_{1-x}As_x$ layer, and/or a $Si_{1-x}C_x$ layer, where 0<x<1) wrapping around each of the channel layers 207 is controlled to fine tune the $V_t$ between the NS NFET 340 and the NS PFET 320, such that the NS NFET 340 and the NS PFET 320 can share the same WFM layer 606 (e.g., in composition and/or structure, etc.). Such configuration avoids the complex patterning process during the forming of gate stacks 620 and avoids the otherwise possible gate boundary diffusion between the NS NFET 340 and the NS PFET 320. Furthermore, each of the channel layers 207 are interposed between n-type source/drain (S/D) features 214N, and each of the channel layers 209 are interposed between p-type S/D features 214P (as depicted in FIG. 4). In some embodiments, the gate stacks 620 each includes top gate spacers 224 disposed on sidewalls of the top portion 620A and inner gate spacers 228 disposed on sidewalls of the bottom portion 620B (as depicted in FIG. 5B).

Components of the device 200 are disposed over the substrate 202, which includes n-wells 316 and p-wells 314 over which the fins 206 and fins 204 are formed, respectively. The device 200 further includes the isolation structures 208 disposed over the substrate 202 to electrically separate various active regions formed over the substrate 202. In the present embodiments, the isolation structures 208 include shallow trench isolation (STI) features. In the depicted embodiments, each of the fins 204 includes a stack of the channel layers 207 disposed over a base fin 204B, and each of the fins 206 includes a stack of channel layers 209 disposed over a base fin 206B, where the base fins 204B and the base fins 206B protrude from the substrate 202 and are separated by the isolation structures 208.

Each of the channel layers 207 and each of the channel layers 209 may include Si, Ge, SiC, SiGe, GeSn, SiGeSn, SiGeCSn, other suitable semiconductor materials, or combinations thereof. In the present embodiments, each of the channel layers 207 and each of the channel layers 209 include elemental Si in the form of a nanosheet, a nanowire (e.g., a nanowire having a hexagonal cross-section), a nanorod (e.g., a nanorod having a square or circular cross-section), or other suitable configurations. In some embodiments, each of the fins 204 and each of the fins 206 includes two to ten channel layers 207 and channel layers 209, respectively. In the present embodiments, the fins 204 and the fins 206 each include no more than four channel layers 207 and channel layers 209, respectively. For example, the fins 204 and the fins 206 may each include three channel layers 207 and channel layers 209, respectively. Of course, the present disclosure is not limited to such configurations and the number of channel layers may be tuned according to design requirements for the device 200.

Generally, the WFM layer of the NS NFETs 340 is configured to be different from the WFM layers of the NS PFETs 320, such that the work function of the NS NFET 340 is different from the work function of the NS PFET 320, thereby allowing the $V_t$ of the resulting device 200 to be tuned separately according to a given design requirement. In one such example, the NS NFETs 340 may include TiAl while the NS PFETs 320 may include TaN. The reduction in device sizes introduces challenges in the fabrication of the metal gate stack, such as complexity of the pattering process to form the metal gate stack and the metal gate boundary diffusion. For example, the elements of the NS NFETs 340 (e.g., aluminum) may diffuse into the adjacent NS PFET 320, thereby causing issues such as $V_t$ instability and undermining the device performance.

Figure 5C:
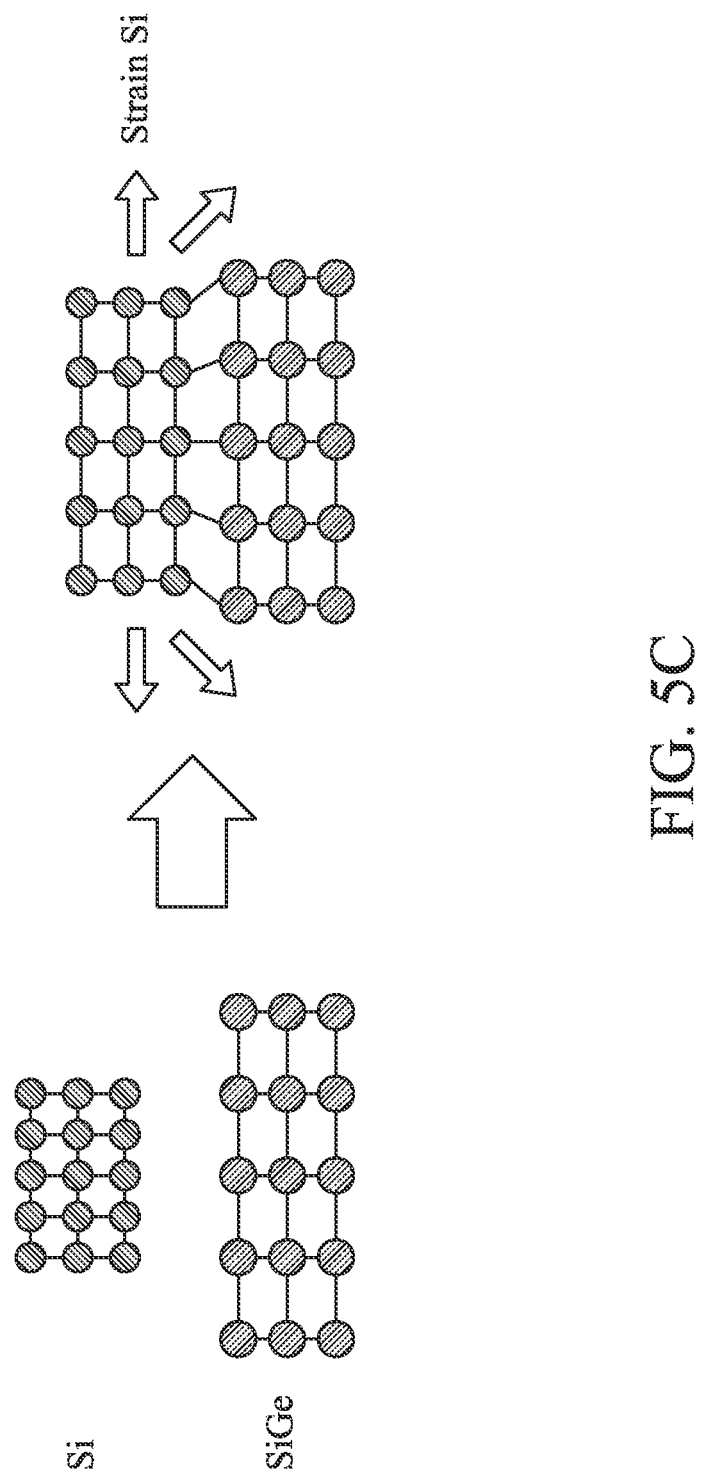
FIG. 5C is a schematic illustration of the interaction of the $V_t$ modulation layer and the channel layer of the IC device according to various embodiments of the present disclosure.

The present embodiments provide greater design flexibility in tuning (or modulating) the $V_t$ between the NS NFETs 340 and the NS PFETs 320 by forming a threshold voltage ($v_t$) modulation layer 218 (e.g., including the capping layer 216 and remaining (or residual) portions of the sacrificial layers 205) over the fins 204 as depicted in FIGS. 5A and 5B. The $V_t$ can be fine-tuned by adjusting the $V_t$ modulation layer 218 (e.g., the composition and/or the thickness) based on the design requirements. Accordingly, by modulating $V_t$ through the Vt modulation layer, the WFM layer of the NS NFETs 340 and the WFM layer of the NS PFETs 320 can be the same (e.g., in composition and/or structure) and be formed at the same time without otherwise needed complex patterning process. Such configuration, among other benefits, also avoids the metal gate boundary diffusion between the WFM layers of the NS NFET 340 and the NS PFET 320 by using the same WFM layers. In addition, the $V_t$ modulation layer 218 also helps forming heterostructures between the $V_t$ modulation layer 218 and the channel layers 207, thereby enlarging the lattice constant (or the lattice volume) and enhancing the electron and hole mobilities to improve device performance. The enlarging of the lattice constants by the heterostructures engineering is referred to as strain effect. One such example is illustrated in FIG. 5C, where the $V_t$ modulation layer 218 includes $Si_{1-x}Ge_x$ ($0.4 \leq x \leq 1$) and the channel layers 207 include Si. In another example, the $Si_{1-x}Ge_x$ has a Ge % from 40% to 50%. The $Si_{1-x}Ge_x$ has larger spaces between atoms compared to Si, thereby creating larger lattice constants on the Si substrate attached thereto. In some examples, the electron mobility can be enhanced by about 2 times and the hole mobility can be enhanced by about 5 to about 8 times.

Referring to FIGS. 5A and 5B, the $V_t$ modulation layer 218 (including the capping layer 216 and portions of the sacrificial layers 205) wraps around each of the channel layers 207, while the channel layers 209 are free of the $V_t$ modulation layer. The $V_t$ modulation layer 218 is different from the channel layers 207 (e.g., in composition and/or structure), such that the interaction between the $V_t$ modulation layer 218 and the channel layers 207 modulate the $V_t$ between the NS PFETs 320 and the NS NFETs 340, where the NS PFET 320 is free of the $V_t$ modulation layer 218. In the present embodiments, the $V_t$ modulation layer includes a portion of the sacrificial layers 205 attached on the top and the bottom surfaces of each of the channel layers 207 (except the top surface of the topmost channel layer 207), and the top surface of the base fin 204B. The $V_t$ modulation layer also includes a capping layer 216 disposed on sidewalls of the channel layers 207 and the base fin 204B. In some embodiments, the $V_t$ modulation layer 218 includes the capping layer 216 wrapping around the top surfaces, the bottom surfaces, and the sidewalls of each of the channel layers 207 and the base fins 204B. In some embodiments, the capping layer 216 may include the same composition as that of the sacrificial layers 205, alternatively, the capping layer 216 may be different from the sacrificial layers 205 in composition. In the present embodiments, a thickness of the $V_t$ modulation layer is about 10% to about 50% of a thickness of each of the channel layers 207. In the present embodiments, the fins 206 is free of the $V_t$ modulation layer 218.

Still referring to FIGS. 5A and 5B, the device 200 includes gate stacks 620 having a top portion 620A disposed over a bottom portion 620B. The bottom portion 620B includes an interfacial layer 602 wrapping around each channel layers 207 and each channel layers 209. Portions of the sacrificial layers 205 and portions of the capping layer 216 are disposed between the interfacial layer 602 and each of the channel layers 207. In the present embodiments, an additional portion of the interfacial layer 602 is disposed over the base fins 204B and the base fins 206B, where portions of the sacrificial layers 205 is disposed between the base fins 204B and the interfacial layer 602. In some embodiments, the interfacial layer includes an oxide, such as silicon oxide.

Still referring to FIGS. 5A and 5B, the gate stacks 620 further includes a gate dielectric layer 604 disposed over and wraps around the interfacial layer 602. The gate dielectric layer 604 may include any suitable material, such as silicon oxide, silicon oxynitride, a high-k dielectric material (i.e., having a dielectric constant greater than that of silicon oxide, which is about 3.9) such as hafnium oxide, tantalum oxide, aluminum oxide, zirconium oxide, lanthanum oxide, titanium oxide, yttrium oxide, strontium titanate, other suitable dielectric materials, or combinations thereof. In some embodiments, the gate dielectric layer 604 has a dielectric constant k of greater than about 9. In some examples, the gate dielectric layer 604 may be about 0.5 nm to about 3 nm in thickness; though the present embodiments are not limited to such dimension.

The bottom portion 620B further includes a work-function metal (WFM) layer 606 disposed over the gate dielectric layer 604. In the present embodiments, the WFM layers 606 completely fills the space disposed between the fins 204 and the fins 206. In other words, the WFM layers 606 defines a sidewall of the bottom portion 620B of the gate stacks 620. In some embodiments, the WFM layers 606 extends laterally to directly contact the gate isolation features (not depicted), which separate the gate stacks 620 from an adjacent gate stacks (not depicted). In other words, gate isolation feature defines an outer sidewall of the WFM layers 606.

In some embodiments, the WFM layer 606 includes one or more WFM, such as TiN, TaN, TiAl, TaAl, TaAlC, TiAlN, TiAlC, TaC, TaCN, TaSiN, WN, WNC, other suitable WFMs, or combinations thereof. In the present embodiments, the WFM layers 606 is substantially free of W, Cu, Ru, Co, or combinations thereof. In the present embodiments, the WFM layer 606 of the NS NFET 340 are the same as the WFM layer of the NS PFET 320 (e.g., in composition and/or structure). In some embodiments, the gate stacks 620 includes additional material layer, such as a barrier layer, disposed between the gate dielectric layer 604 and the WFM layer 606.

As discussed above, the top portion 620A of the gate stacks 620 is disposed over the bottom portion 620B. In the present embodiments, the top portion 620A includes a metal fill layer (also referred to as a bulk conductive layer) 610 disposed over portions of the WFM layers 606 that extend beyond a top surface of the fins 204 and the fins 206. In the present embodiments, sidewalls of the metal fill layer 610 are continuous with the outer sidewalls of the WFM layers 606 along the Z-axis, such that the sidewalls of the metal fill layer 610 are in direct contact with the gate isolation features (not shown), which isolates the gate stacks 620 from adjacent gate stacks. In some embodiments, the top portion 620A may further include a liner layer 608 between the WFM layer 606 and the metal fill layer 610. In some embodiments, the liner layer 608 includes TiN and is configured to reduce the diffusion of the elements (e.g., aluminum) in the WFM layer 606 into the metal fill layer 610. Notably, the present embodiments provide that the bottom portion 620B of the gate stacks 620 is free of the metal fill layer 610 and the liner layer 608, which is included in the top portion 620A of the gate stacks 620. In other words, the space between the channel layers 207 and the channel layer 209 is free of the metal fill layer 610.

In the present embodiments, the metal fill layer 610 includes W, Cu, Ru, Co, or combinations thereof and is substantially free of any of the WFM material discussed above with respect to the WFM layer 606. In an example embodiment, the metal fill layer 610 includes W. In some embodiments, the composition of the metal fill layer 610 is selected such that the resistance of the metal fill layer 610 is less than the resistance of the WFM layer 606.

In some embodiments, the gate stacks 620 each includes top gate spacers 224 disposed on sidewalls of the top portion 620A (as depicted in FIG. 5B) and inner gate spacers 228 disposed on sidewalls of the bottom portion 620B (as depicted in FIG. 5B). In some embodiments, the top gate spacers 224 have substantially the same composition as the inner gate spacers 228. In some embodiments, the top gate spacers 224 differ in the composition from the inner gate spacers 228.

The device 200 may further include an etch-stop layer (ESL; not shown) disposed over the gate stacks 620, i.e., over the metal fill layer 610, and an interlayer dielectric (ILD) layer (not shown) disposed over the ESL. The ESL may include any suitable dielectric material, such as silicon nitride, silicon carbide, oxygen-doped silicon nitride (SiON), carbon-doped silicon nitride (SiCN), aluminum nitride, other suitable materials, or combinations thereof. The ILD layer may include a low-k dielectric material, silicon oxide, doped silicate glass, other suitable materials, or combinations thereof. In the present embodiment, the ESL and the ILD layer differ in composition to ensure adequate etching selectivity therebetween during subsequent fabrication processes.

Referring to FIG. 5B, which is a cross-sectional view of FIG. 4 taken along line B-B', i.e., through one of the fins 204 along the X-axis. In the depicted embodiments, each gate stack 620 is disposed between two n-type S/D features 214N along the X-axis, where the top portion 620A of the gate stacks 620 is disposed over the bottom portion 620B, i.e., over the topmost channel layers 207. The bottom portions 620B of the gate stacks 620 are interleaved with the channel layers 207. In the present embodiments, the bottom portions 620B includes the interfacial layer 602 disposed over and wraps around the channel layers 207, the gate dielectric layer 604 disposed over and wraps around the interfacial layer 602, and the WFM layer 606 disposed over the gate dielectric layer 604. The interfacial layer 602, the gate dielectric layer 604, the WFM layer 606, and the portions of the sacrificial layers 205 (optional) completely fill the openings between the channel layers 207 as shown in FIG. 5B. Notably, the bottom portion 620B is free of the metal fill layer 610 as discussed above with respect to FIG. 5A. The top portion 620A includes the interfacial layer 602, the gate dielectric layer 604 disposed over the interfacial layer 602, the WFM layer 606 disposed over the gate dielectric layer 604, and the metal fill layer 610 disposed over the top surface of the WFM layer 606. As discussed above, the device 200 may further include the ESL (not shown) disposed over the top surface of the gate stacks 620 to accommodate subsequent fabrication of components such as the S/D contacts.

In the present embodiments, still referring to FIG. 5B, the device 200 further includes the top gate spacers 224 disposed along the sidewalls of the top portion 620A, and the inner gate spacers 228 disposed on sidewalls on the bottom portion 620B to separate the bottom portion 620B of the gate stacks 620 from the adjacent n-type S/D features 214N. Each of the inner gate spacers 228 is in contact with the interfacial layer 602 wrapping around the channel layers 207, the gate dielectric layer 604 disposed thereover, and the WFM layer 606. Each of the top gate spacers 224 and the inner gate spacers 228 may be a single-layer structure or a multi-layer structure and may include silicon oxide, silicon nitride, silicon carbide, oxygen-doped silicon nitride (SiON), carbon-doped silicon nitride (SiCN), oxygen-and-carbon-doped silicon nitride (SiOCN), oxygen-doped silicon carbide (SiOC), a low-k dielectric material, tetraethylorthosilicate (TEOS), doped silicon oxide (e.g., borophosphosilicate glass (BPSG), fluoride-doped silicate glass (FSG), phosphosilicate glass (PSG), boron-doped silicate glass (BSG), etc.), other suitable materials, or combinations thereof. In some embodiments, the top gate spacers 224 and the inner gate spacers 228 have different compositions. In some embodiments, the top gate spacers 224 and/or the inner gate spacers 228 includes an air gap.

Figure 6:
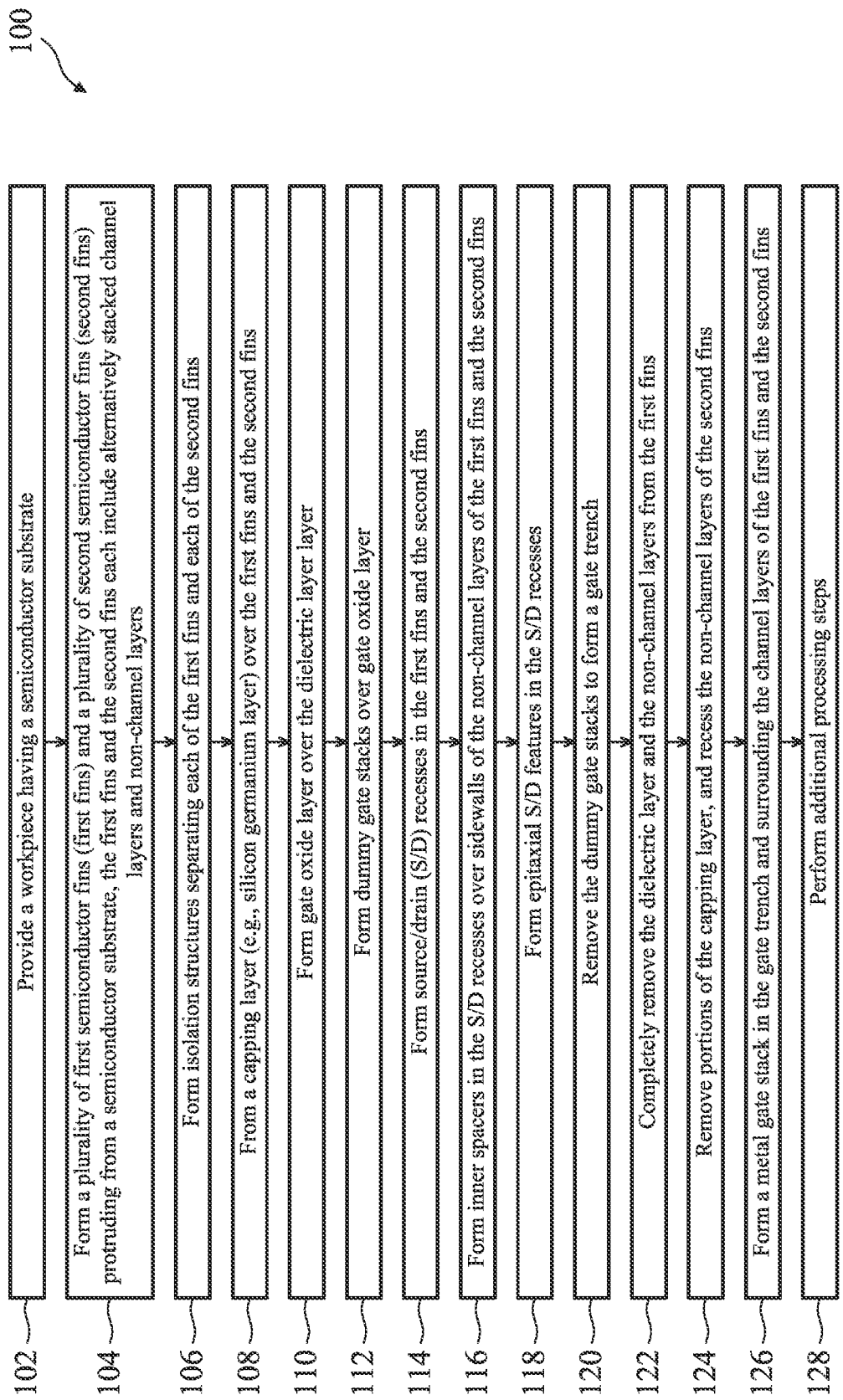
FIG. 6 illustrates a flow chart of a method for fabricating an IC device according to various aspects of the present disclosure.

FIG. 6 illustrates a method 100 for forming the device 200, or portions thereof, in accordance with some embodiments of the present disclosure. The methods 100 is discussed in reference to FIGS. 7A-20B, where FIGS. 7A, 8A, 9A, 10A, 11A, 12A, 13A, 14A, 15A, 16A, 17A, 18A, 19A, and 20A are cross-sectional views of FIG. 4 taken along line A-A', and FIGS. 7B, 8B, 9B, 10B, 11B, 12B, 13B, 14B, 15B, 16B, 17B, 18B, 19B, and 20B are cross-sectional views of FIG. 4 taken along line B-B', all at intermediate steps of the methods 100. It is noted that method 100 is merely an example and are not intended to limit the present disclosure beyond what is explicitly recited in the claims. Additional operations can be performed before, during, and after the method 100, and some operations described can be replaced, eliminated, or moved around for additional embodiments of the methods.

Figure 7A:
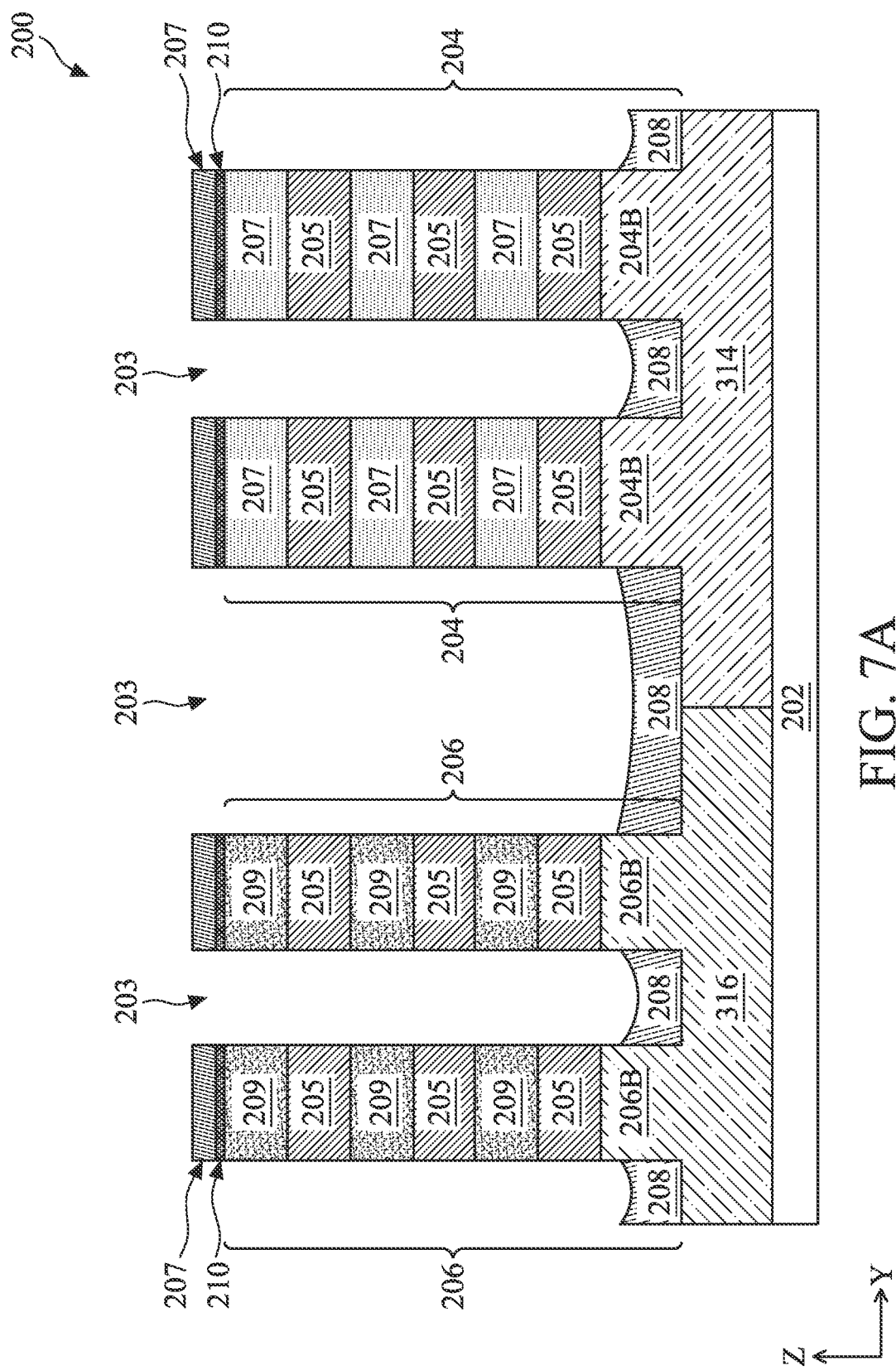
FIGS. 7A, 8A, 9A, 10A, 11A, 12A, 13A, 14A, 15A, 16A, 17A, 18A, 19A, and 20A are cross-sectional views of the semiconductor device taken along line A-A' as shown in FIG. 4 during intermediate stages of the method shown in FIG. 6 according to various embodiments of the present disclosure.
Figure 7B:
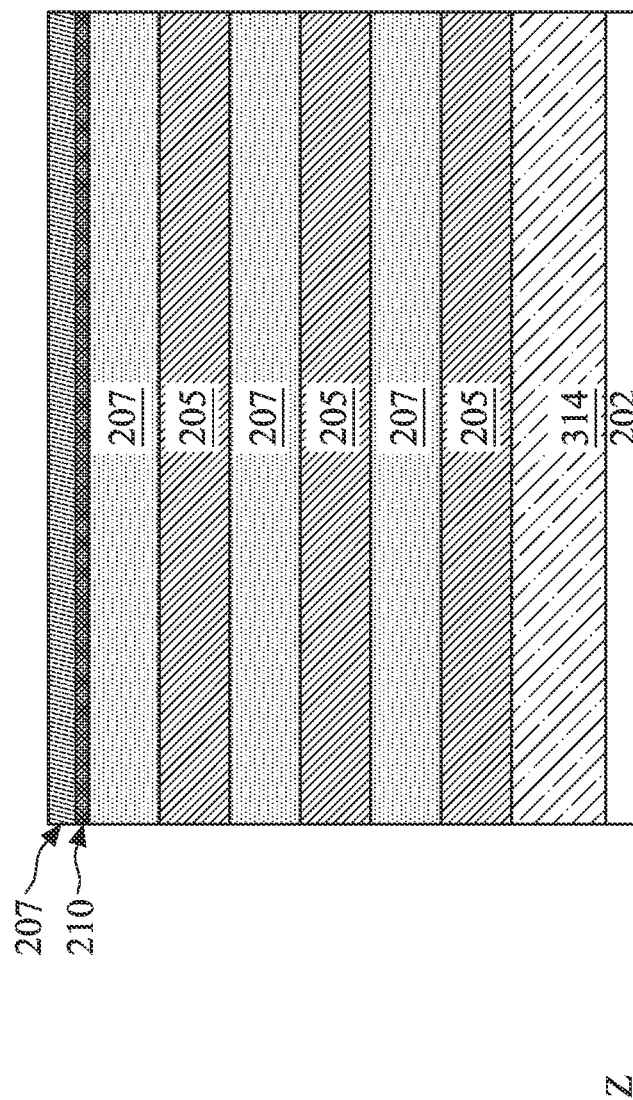
FIGS. 7B, 8B, 9B, 10B, 11B, 12B, 13B, 14B, 15B, 16B, 17B, 18B, 19B, and 20B are cross-sectional views of the semiconductor device taken along line B-B' as shown in FIG. 4 during intermediate stages of the method shown in FIG. 6 according to various embodiments of the present disclosure.

Operations 102 and 106 of the method 100 are discussed in reference to FIGS. 7A and 7B collectively. At operation 102, the method 100 provides a substrate 202 including various doped regions (e.g., the n-wells 316 and p-wells 314) formed in or over the substrate 202. In the present embodiments, the substrate 202 includes silicon. Alternatively, or additionally, the substrate 202 includes another elementary semiconductor, such as germanium; a compound semiconductor, such as silicon carbide, silicon phosphide, gallium arsenide, gallium phosphide, indium phosphide, indium arsenide, and/or indium antimonide; an alloy semiconductor, such as SiGe, SiPC, NSsP, AlInAs, AlNSs, GaInAs, GaInP, and/or GaInAsP; or combinations thereof. In some embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, other suitable methods, or combinations thereof.

N-well 316 may be doped with an n-type dopant, such as phosphorus, arsenic, other n-type dopants, or combinations thereof. Each p-well 314 may be doped with a p-type dopant, such as boron, indium, other p-type dopants, or combinations thereof. In some embodiments, the substrate 202 includes doped regions formed with a combination of p-type dopants and n-type dopants. The various doped regions can be formed directly on and/or in the substrate 202 providing, for example, a p-well structure, an n-well structure, a dual-well structure, a raised structure, or combinations thereof. Each of the various doped regions may be formed by performing an ion implantation process, a diffusion process, other suitable doping processes, or combinations thereof.

At operation 104, the method 100 forms a multi-layer stack of semiconductor materials (hereafter referred to as the "multi-layer stack" for short) over the substrate 202. In the present embodiments, the fins 204 and the fins 206 are formed from the multi-layer stack at subsequent operations of the method 100. In the present embodiments, the multi-layer stack includes alternating layers of a first semiconductor material (e.g., epitaxially grown Si-containing layers of the fins 204 and fins 206 that are substantially free of Ge) and a second semiconductor material (e.g., epitaxially grown SiGe-containing layers 205) grown in a series of epitaxy processes. The first semiconductor material and the second semiconductor material stack vertically along the Z-direction. The epitaxy process may include chemical vapor deposition (CVD) deposition techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable selective epitaxial growth (SEG) processes, or combinations thereof. The epitaxy process may use gaseous and/or liquid precursors, which interact with the composition of the underlying material layers. In some examples, the layers of the multi-stack may be provided in the form of nanosheets, nanowires, or nanorods. Subsequent processing may remove (or partially remove) the second semiconductor layers (e.g., the SiGe-containing layers 205), leaving behind the first semiconductor layers (e.g., the Si-containing layers 207 and 209) separated by openings. Such a process may be referred to as the "wire release process" or "sheet formation process," depending upon the configuration of the layers in the multi-layer stack. In the present embodiments, the remaining stack of Si-containing layers 204 and 206 become the channel layers 207 and channel layers 209, respectively, configured to form a NS NFETs and NS PFET, respectively, in the device 200, and the removed (or partially removed) SiGe-containing layers 205 is hereafter referred to as the sacrificial layers 205.

Thereafter, the method 100 forms the fins (or fin active regions) 204 and the fins (or fin active regions) 206 from the multi-layer stack. Accordingly, the semiconductor fins of the present embodiments include alternating layers of Si (the channel layers 207 or the channel layers 209) and SiGe (the sacrificial layers 205) as discussed above. In some embodiments, the device 200 additionally includes semiconductor fins (not depicted herein) having a single semiconductor material rather than alternating layers of different semiconductor materials. The fins 204 and the fins 206 may be fabricated by directly patterning and subsequently etching the multi-layer stack having alternating layers of epitaxially grown Si- and SiGe-containing layers. The fabrication process may include forming a masking element including a photoresist layer, lithographically patterning the masking element, and subsequently etching the multi-layer stack (and portions of the substrate 202) using the patterned masking element as an etch mask. The etching process may include dry etching, wet etching, reactive ion etching (RIE), other suitable processes, or combinations thereof. The resulting fins (or fin active regions) 204 and the fins 206 may be doped with various dopants consistent with desired design requirements.

Additionally, or alternatively, other embodiments of methods for forming fins 204 and the fins 206 may also be suitable. For example, the multi-layer stack (and the substrate 202) may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the multi-layer stack to form the fins 204 and the fins 206.

At operation 106, the method 100 forms the isolation structures 208 to insulate various components formed over the substrate 202. The isolation structures 208 may include STI, field oxide, local oxidation of silicon (LOCOS), other suitable features comprising silicon oxide, silicon nitride, silicon oxynitride, other suitable dielectric materials, or combinations thereof. The isolation structures 208 may be formed by any suitable method. In some embodiments, the isolation structures 208 are formed by filling trenches formed between the semiconductor fins in the multi-layer stack with a dielectric material, followed by applying a chemical mechanical planarization (CMP) process and an etch-back process. In some embodiments, the isolation structures 208 are formed by depositing a dielectric material over sidewalls of the fins 204 and the fins 206 without completely filling the trenches between them. The isolation structures 208 may include a multi-layer structure, for example, having one or more thermal oxide liner layers.

Figure 8A:
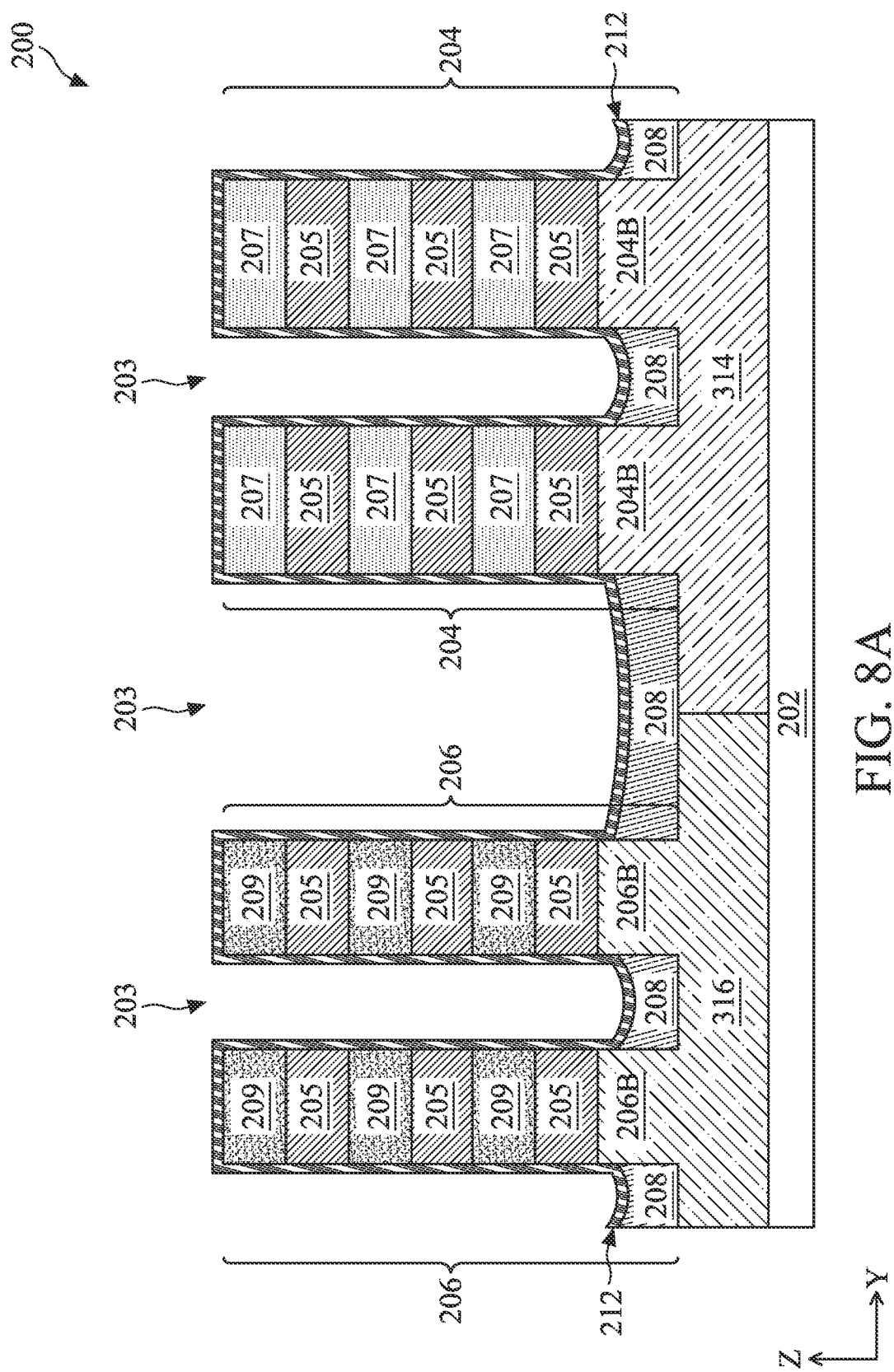
Figure 8B:
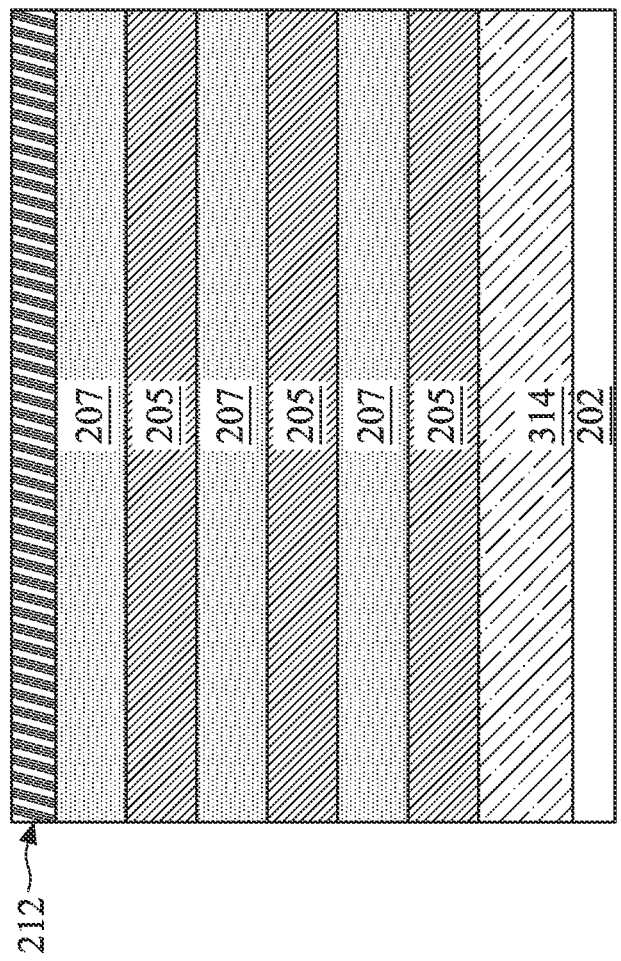

At operation 108, referring to FIGS. 8A and 8B, the method 100 forms a capping layer 212 over the fins 204 and the fins 206. The capping layer 212 covers top surfaces and sidewalls of the fins 204 and the fins 206. In some embodiments, the capping layer 212 is deposited conformally, where the capping layer 212 also covers the isolation structures 208. In some embodiments, the capping layer 212 includes a semiconductor material. In the present embodiments, the capping layer 212 has a composition the same as that of the channel layers 207 and the channel layers 209, while different from that of the sacrificial layers 205. Alternatively, the capping layer 212 may include materials different from these of the channel layers 207 and the fins 206. In the present embodiments, the capping layer 212 includes silicon. The capping layer 212 may be formed by any suitable method, such as CVD, flowable CVD (FCVD), spin-on-glass (SOG), other suitable methods, or combinations thereof. The capping layer 212 is subsequently treated (e.g., doped, thinned, and/or recessed) to modulate (or fine tune) the $V_t$ between the NS NFETs 340 and the NS PFETs 320.

Figure 9A:
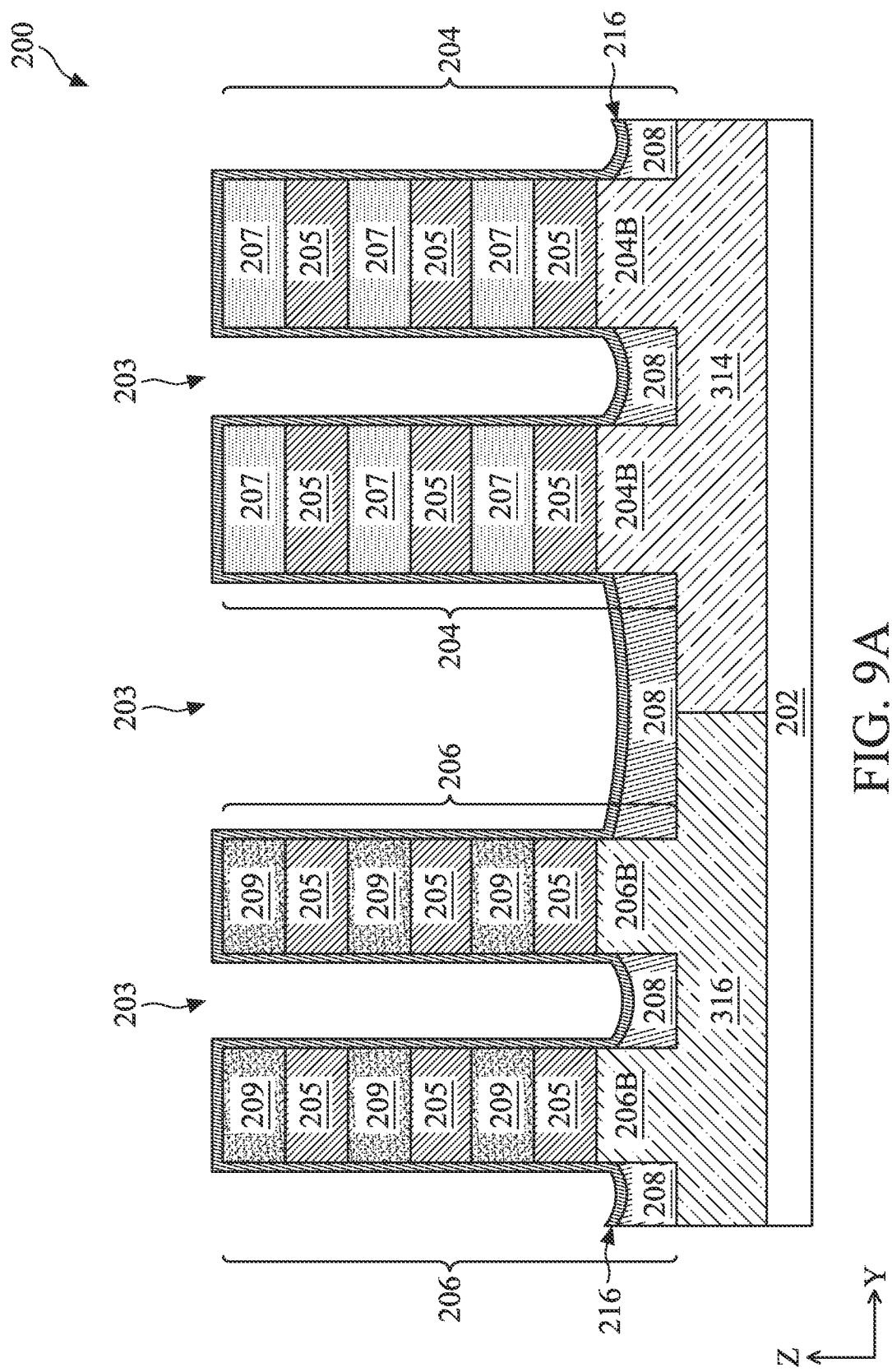
Figure 9B:
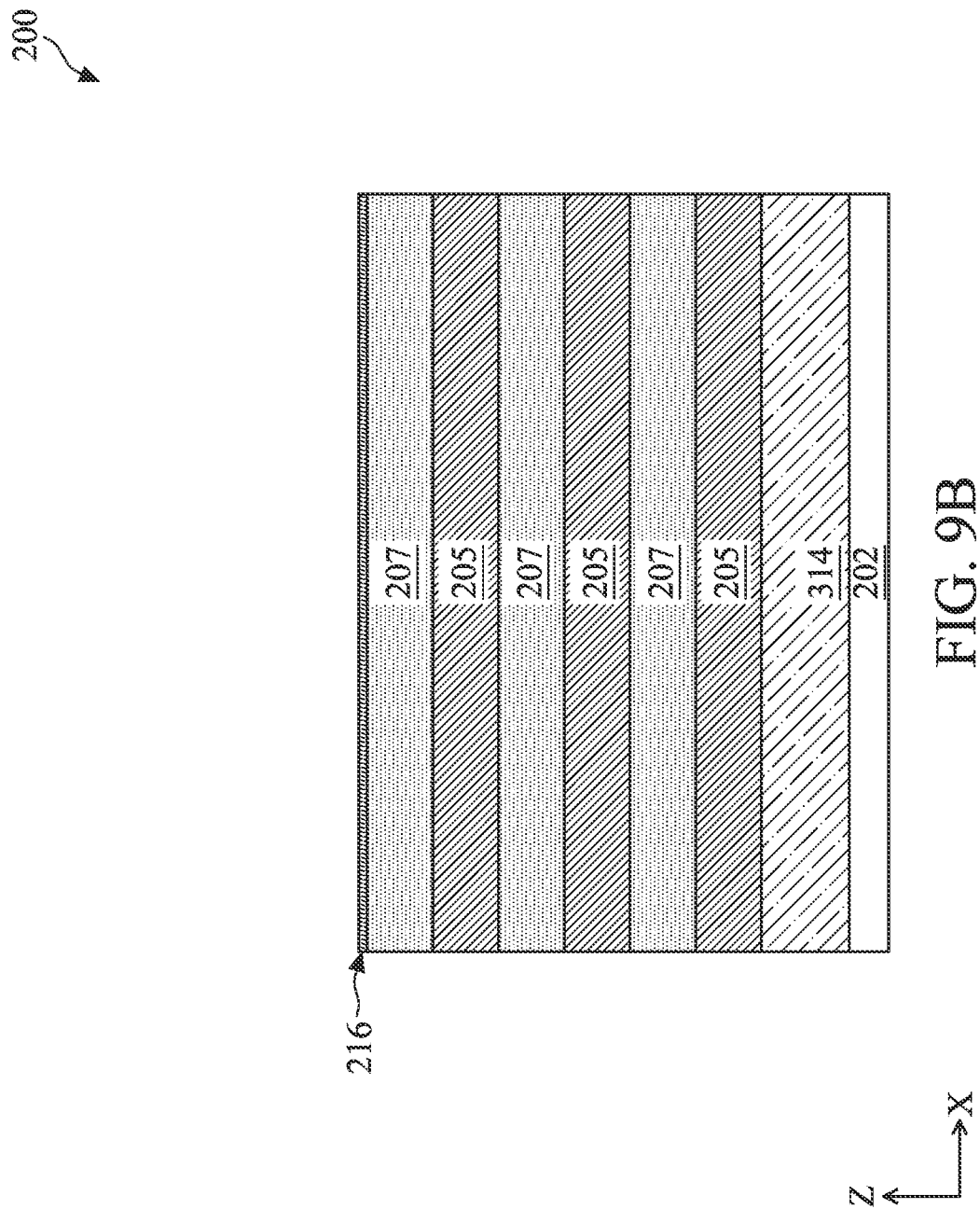

Referring to FIGS. 9A and 9B, the method 100 subsequently performs a treatment on the capping layer 212 to form a capping layer 216. In the present embodiments, the treatment includes a doping process, such as ion implantation, a diffusion process, other suitable doping processes, or combinations thereof. The treatment changes a composition of the capping layer 212, such that the capping layer 216 has a composition different from that of the capping layer 212. In some embodiments, the capping layer 216 has the same composition as that of the sacrificial layers 205, while different from that of the channel layers 207 and the channel layers 209. In some embodiments, the capping layer 216 has a composition similar to but different from that of the sacrificial layers 205. For example, the capping layer 216 includes $Si_{1-x}Ge_x$ ($0.4 \leq x \leq 1$) and the sacrificial layers 205 includes $Si_{1-y}Ge_y$ ($0 \leq y \leq 1$) where x is different from y (e.g., x>y). In another example, the percentage of the Ge (Ge %) in the capping layer 216 and the sacrificial layers 205 are the same (x=y) while the crystallinity of the capping layer 216 is different from (e.g., higher than) that of the sacrificial layers 205. The differences in crystallinity may be derived from the differences in methods of forming the capping layer 216 (e.g., epitaxially growing) and the sacrificial layers 205 (e.g., depositing). The differences between the capping layer 216 and the sacrificial layers 205 provide etching selectivity, for example, to allow the sacrificial layers 205 be removed faster in subsequent processes compared to the capping layer 216.

Figure 10A:
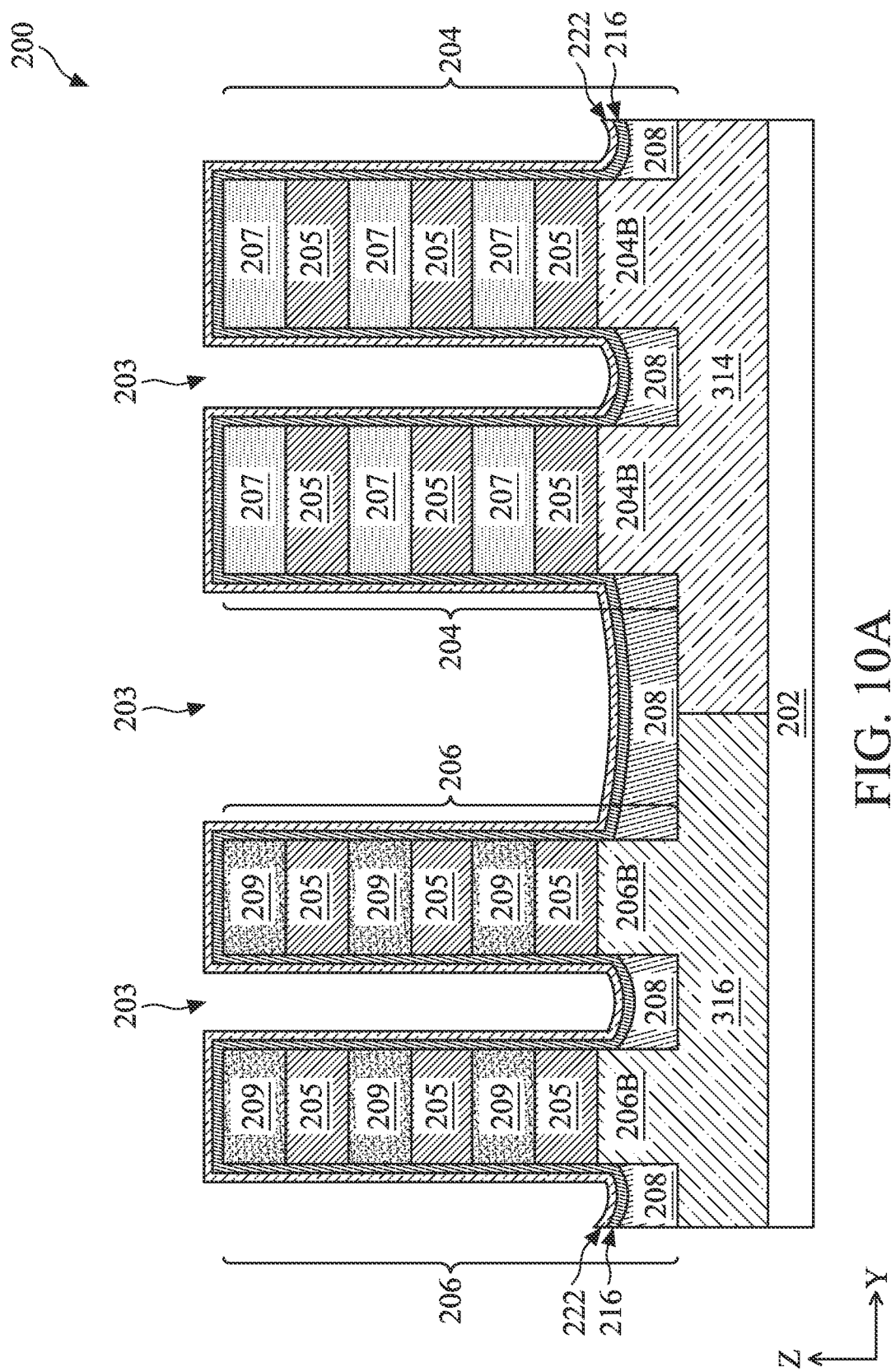
Figure 10B:
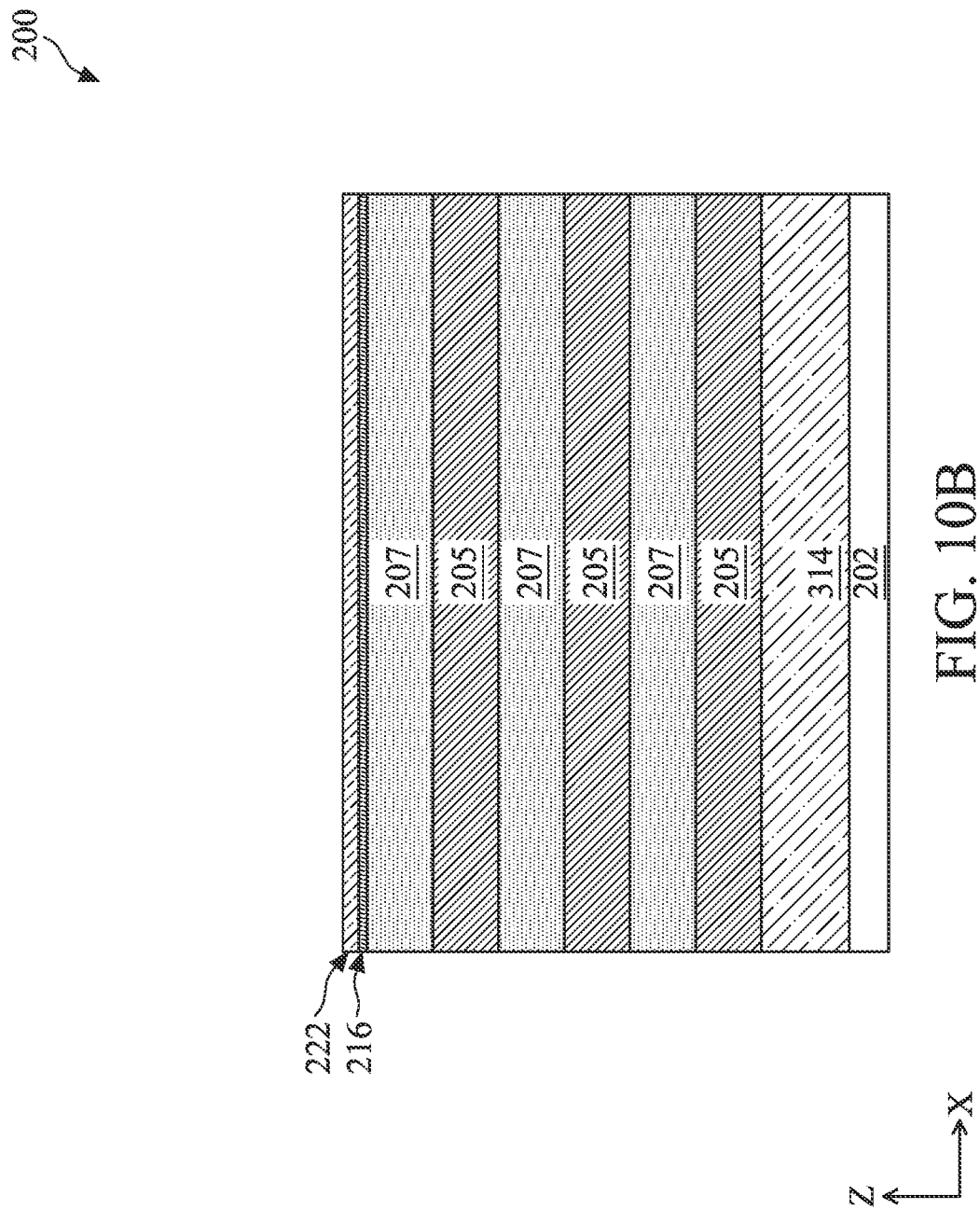

At operation 110, referring to FIGS. 10A and 10B, the method 100 forms a sacrificial dielectric layer 222 over the capping layer 216. In some embodiments, the sacrificial dielectric layer 222 may include $SiO_2$, silicon nitride, a high-K dielectric material and/or other suitable material. In various examples, the sacrificial dielectric layer 222 may be deposited by a CVD process, a subatmospheric CVD (SACVD) process, a flowable CVD process, an ALD process, a PVD process, or other suitable process. By way of example, the sacrificial dielectric layer 222 may be used to prevent damages to the fins 204 and the fins 206 by subsequent processes (e.g., subsequent formation of the dummy gate stacks). In some embodiments, after formation of the dummy gate stacks 220, the sacrificial dielectric layer 222 is removed from the S/D regions of the fins 204 and the fins 206 in an etch process. The etch process may include a wet etch, a dry etch, and/or a combination thereof. The etch process is chosen to selectively etch the sacrificial dielectric layer 222 without substantially etching the underlying capping layer 216.

Figure 11A:
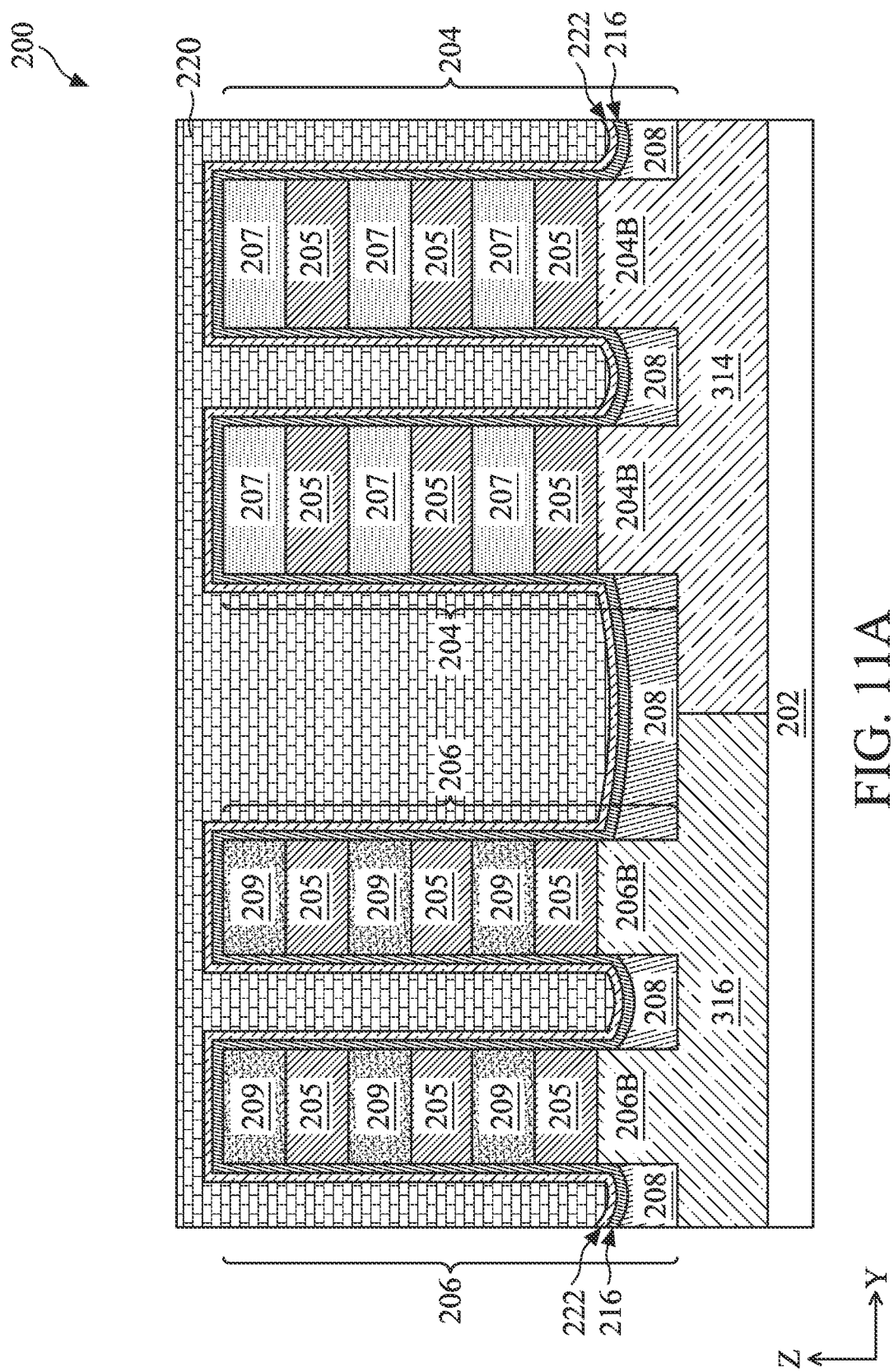
Figure 11B:
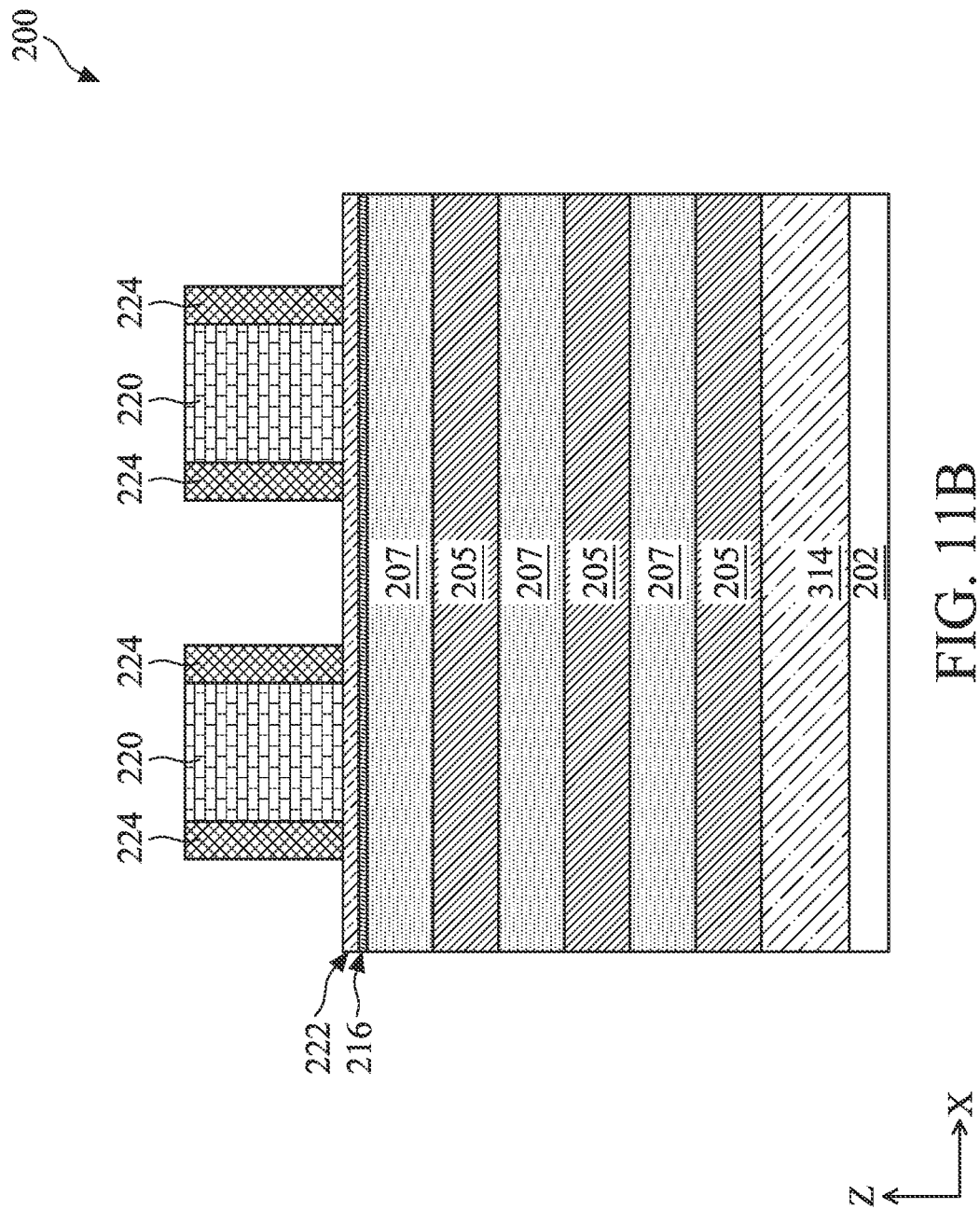

At operation 112, referring to FIGS. 11A and 11B, the method 100 forms a dummy gate stack (or a placeholder gate) 220 disposed over the fins 204 and the fins 206. After forming other components (e.g., the n-type S/D features 214N and the p-type S/D features 214P) of the device 200, the dummy gate stacks 220 is removed to form a gate trench in which at least a gate dielectric layer (e.g., the gate dielectric layer 604) and a metal gate electrode (e.g., including the WFM layer 606 and the metal fill layer 610) are subsequently formed to complete the fabrication of the gate stacks 620. Various material layers of the dummy gate stacks 220 may be first deposited as a blanket layer over the semiconductor fins and subsequently patterned, followed by one or more etching process, to form the dummy gate stacks 220 in a desired configuration in the device 200. The various material layers of the dummy gate stacks 220 may be formed by any suitable method, such as chemical oxidation, thermal oxidation, CVD, atomic layer deposition (ALD), physical vapor deposition (PVD), electroplating, other suitable methods, or combinations thereof.

The method 100 proceeds to forming the top gate spacers 224 on sidewalls of the dummy gate stacks 220. The top gate spacers 224 may be a single-layer structure or a multi-layer structure and may include any suitable dielectric material discussed above with respect to FIGS. 5A and 5B. The top gate spacers 224 may be formed by first depositing at least one spacer layer over the device 200 and subsequently performing an anisotropic etching process to the spacer layer, leaving behind the top gate spacers 224 on the sidewalls of the dummy gate stacks 220.

Figure 12A:
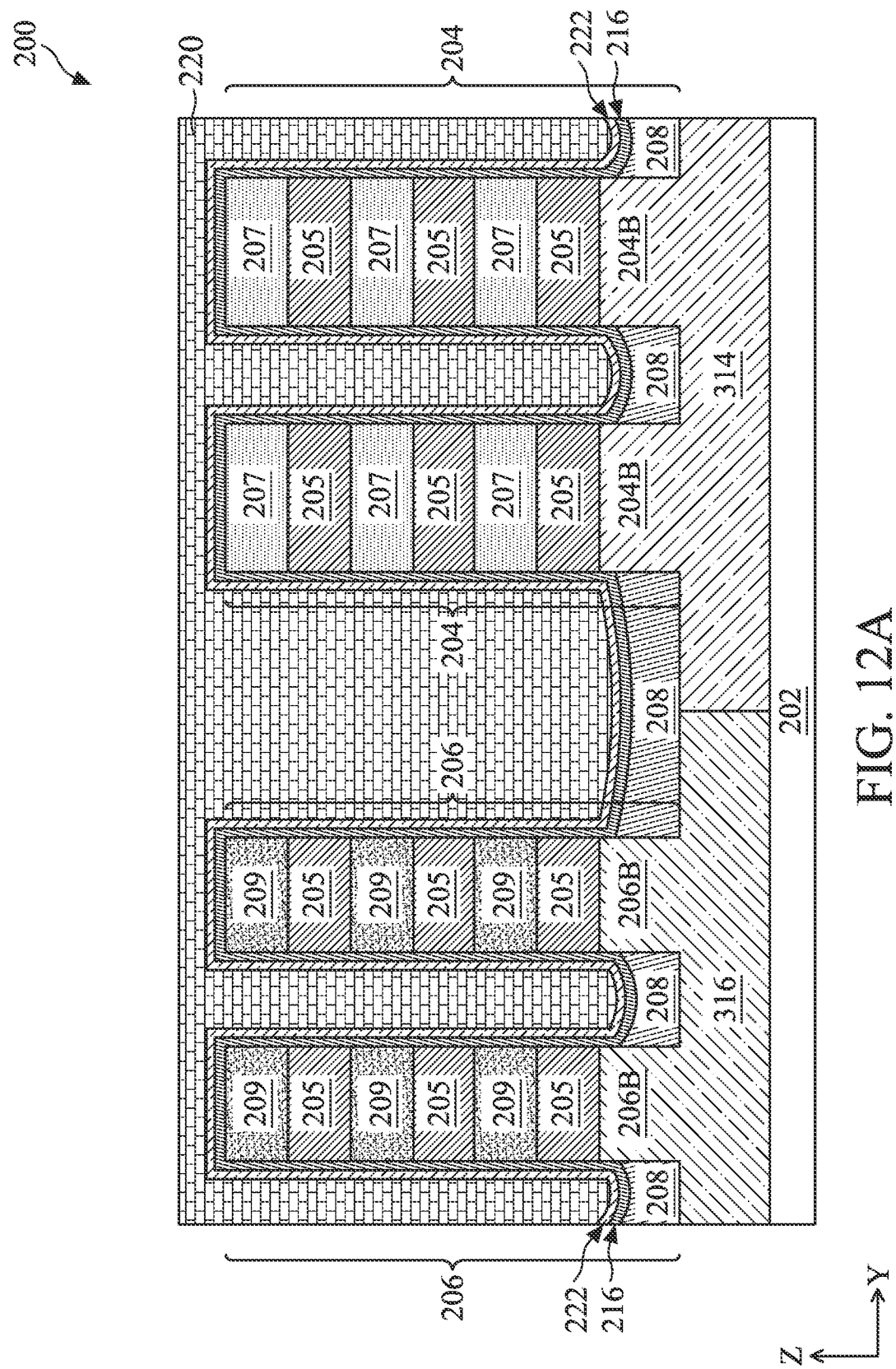
Figure 12B:
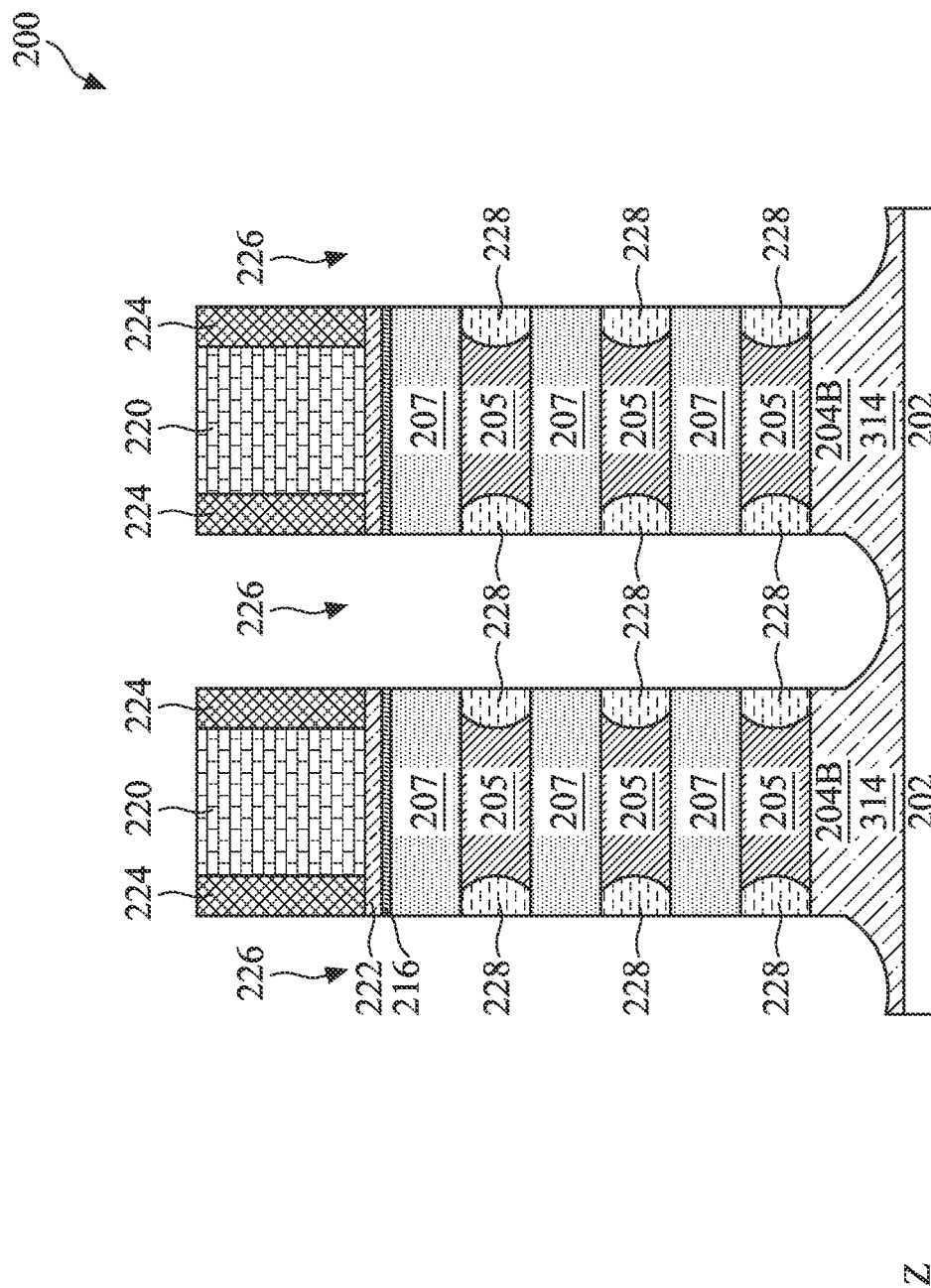

At operation 114, referring to FIGS. 12A and 12B, the method 400 then removes portions of the fins 204 (and the fins 206) to form the S/D recesses 226 and expose sidewalls of the multi-layer stack therein. Subsequently, the method 100 forms the inner gate spacers 228 on the exposed sidewalls of the sacrificial layers 205 at operation 116. In some embodiments, forming the inner gate spacers 228 includes selectively removing portions of the sacrificial layers 205 without removing (or substantially removing) the channel layers 207 and the fins 206 to form openings (not depicted), depositing a spacer layer in the openings, and performing one or more etch-back process to form the inner gate spacers 228 in the openings (FIG. 12B). The inner gate spacers 228 may be a single-layer structure or a multi-layer structure and may include any suitable dielectric material discussed above with respect to FIGS. 5A and 5B.

Figure 13A:
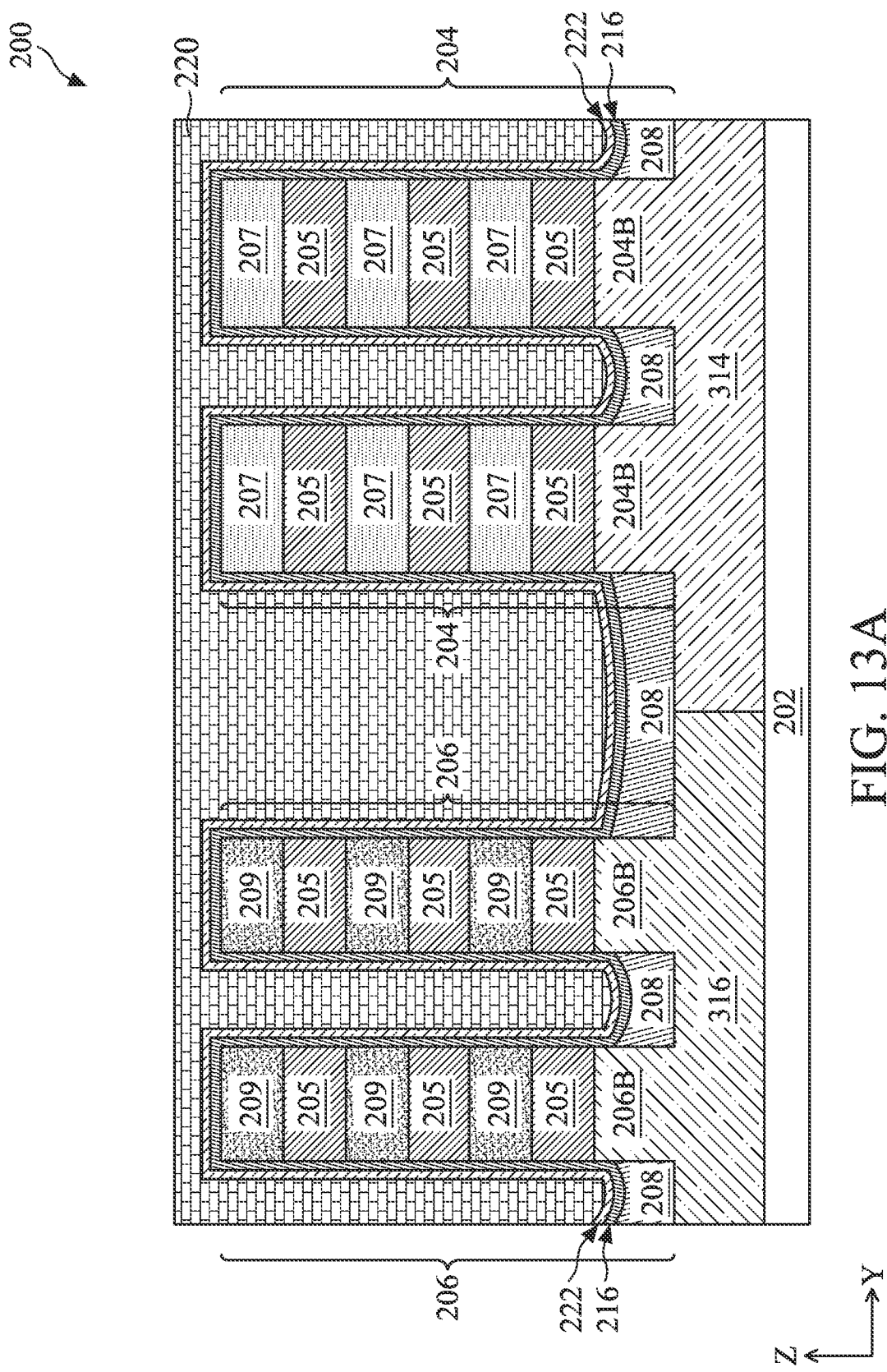
Figure 13B:
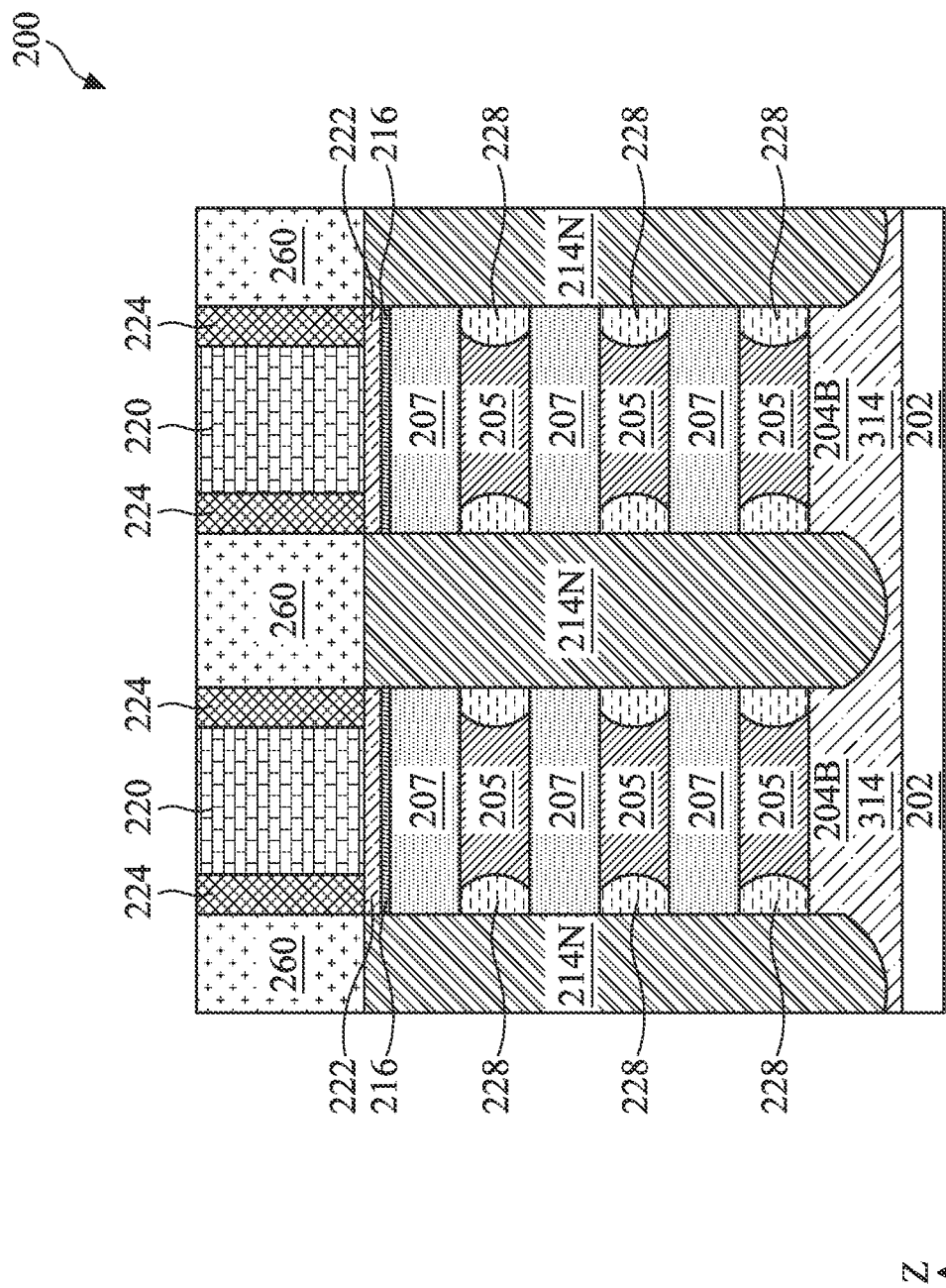

At operation 118, referring to FIGS. 13A and 13B, the method 100 forms the n-type S/D feature 214N and the p-type S/D features 214P (not shown) in the S/D recesses. In the present embodiments, one or more epitaxy growth processes similar to those discussed above with respect to forming the multi-stack layer are performed to grow the n-type S/D features 214N and the p-type S/D features 214P. In some embodiments, the n-type S/D features 214N includes an epitaxial material, such as silicon (epi Si) or silicon carbon (epi SiC), where the silicon or silicon carbon is doped with an n-type dopant such as arsenic, phosphorus, and/or other n-type dopant. In some embodiments, the p-type S/D features 214P includes an epitaxial material, such as epi SiGe, doped by adding a suitable p-type dopant such as boron, germanium, indium, and/or other p-type dopants dopant during the epitaxy growth process. In the present embodiments, the p-type S/D feature 214P includes SiGe, where the Ge % of the p-type S/D feature 214P is different from (e.g., greater than) the Ge % of the capping layer 216. In some embodiments, the epitaxial material is doped by an ion implantation process after performing a deposition process. In some embodiments, annealing processes are performed to activate dopants in the p-type S/D features 214P and/or other S/D regions, such as HDD regions and/or LDD regions. The sacrificial dielectric layer 222 protects the capping layer 216, the fins 204, and the fins 206 during the annealing processes.

Figure 14A:
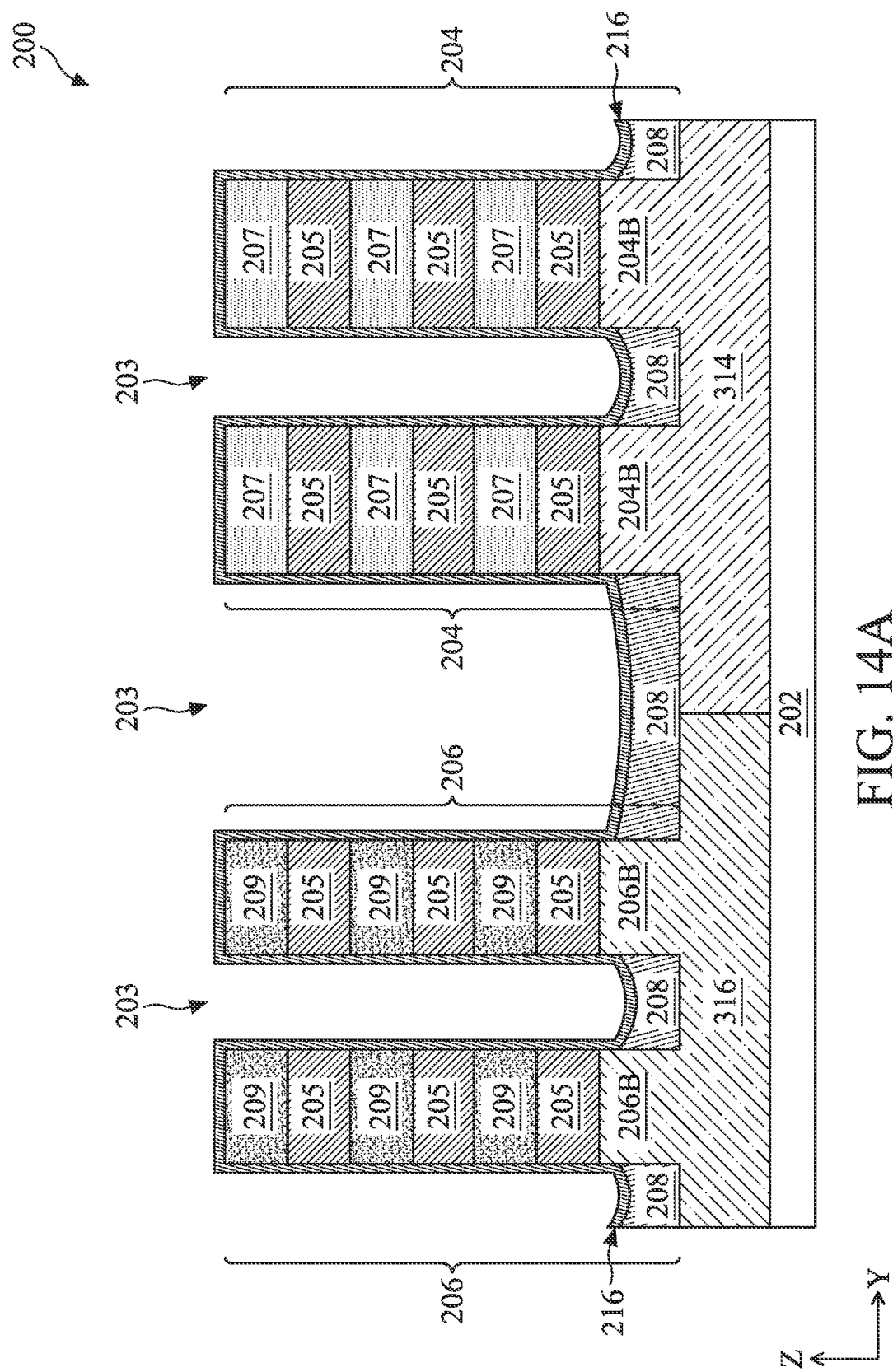
Figure 14B:
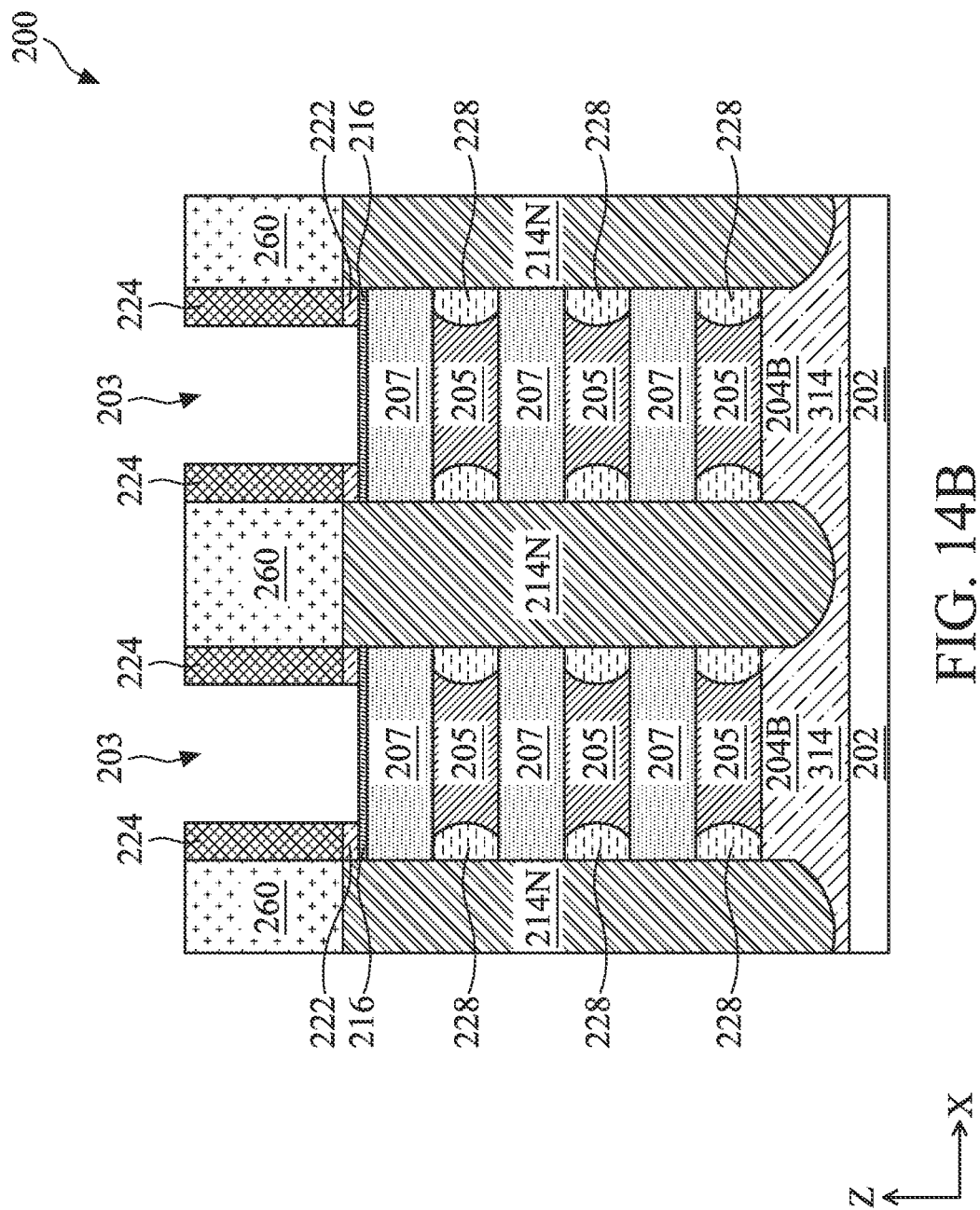

At operation 120, referring to FIGS. 14A, and 14B, the method 100 removes the dummy gate stacks 220 to form a gate trench 203 between the top gate spacers 224, and between the fins 204 and the fins 206. In the present embodiments, prior to the removing of the dummy gate stacks 220, the method 100 forms an ILD layer 260 over the p-type S/D features 214P and the n-type S/D features 214N. The ILD layer 260 may include a low-k dielectric material, silicon oxide, doped silicate glass, other suitable materials, or combinations thereof, and may be formed by any suitable method, such as spin-on-glass or FCVD. A top surface of the ILD layer 260 may be planarized using one or more CMP process. Thereafter, the method 100 proceeds to removing the dummy gate stacks 220 from the device 200 by any suitable method, such as a dry etching process and/or a wet etching process, resulting in the gate trench 203 between the top gate spacers 224, and between the fins 204 and the fins 206. Thereafter, the method 100 removes the sacrificial dielectric layer 222, where remaining portions of the sacrificial dielectric layer 222 are disposed between the capping layer 216 and the top gate spacers 224.

Figure 15A:
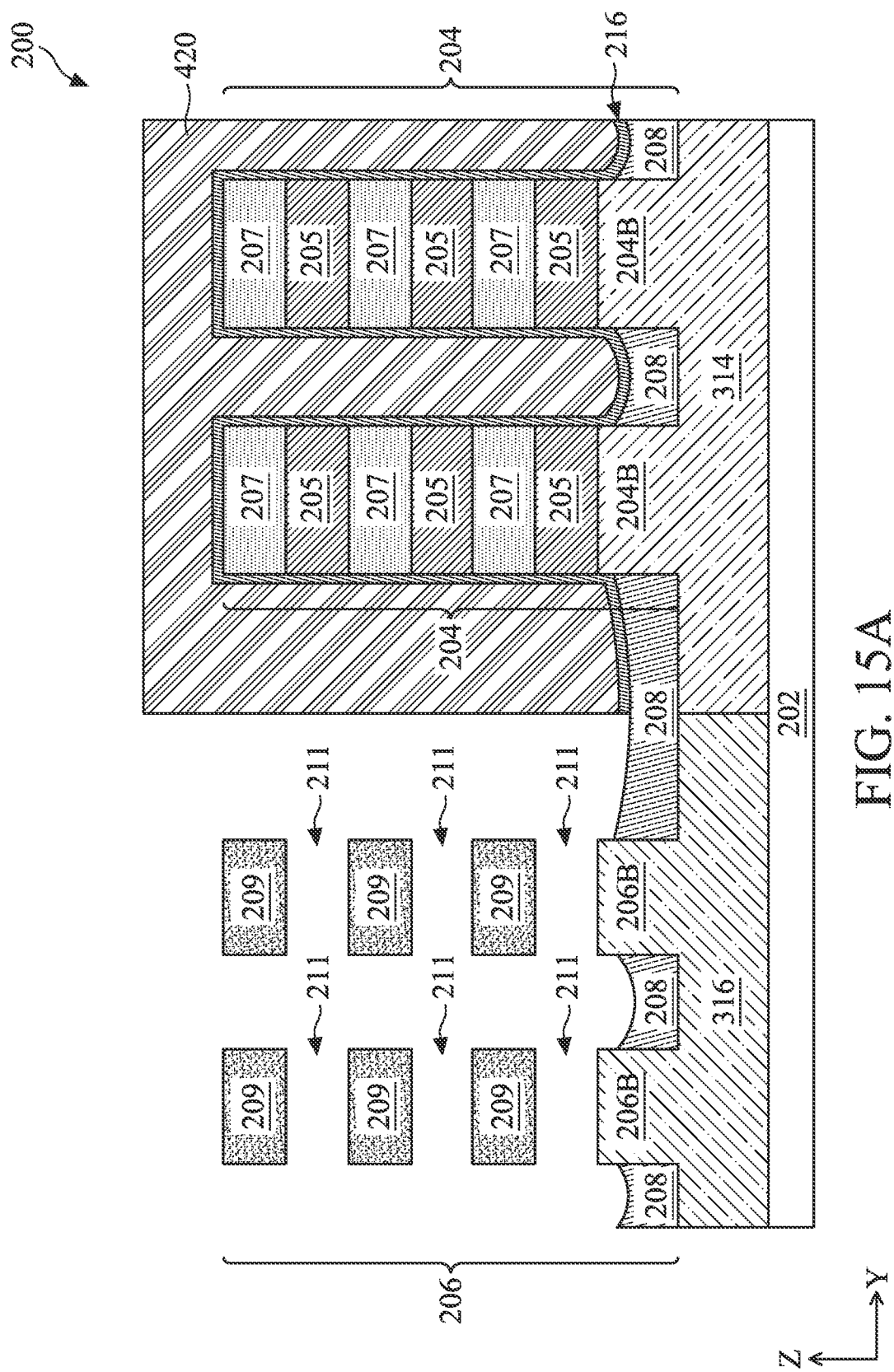
Figure 15B:
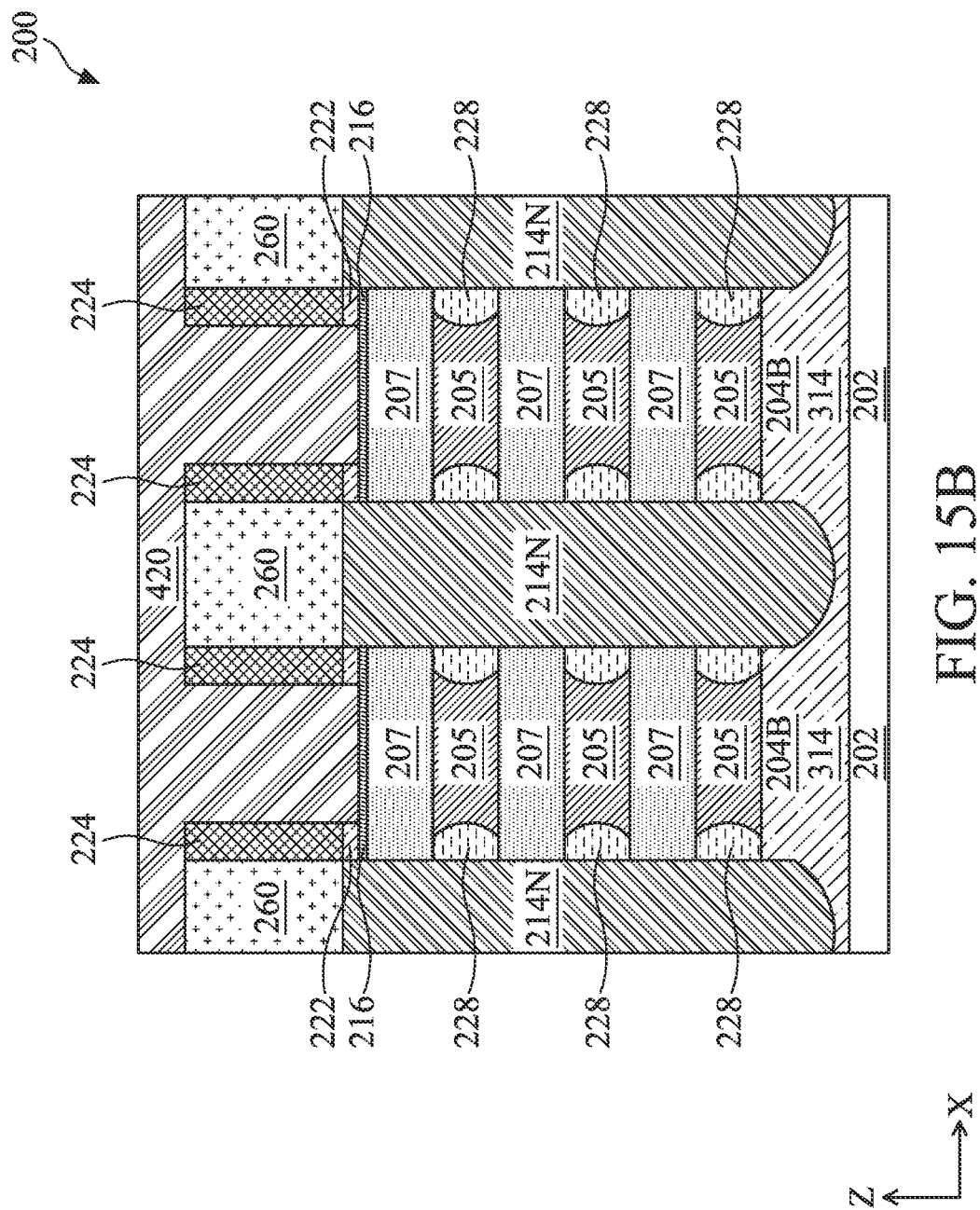

At operation 122, referring to FIGS. 15A and 15B, the method 100 removes the capping layer 216 and the sacrificial layers 205 (e.g., the SiGe-containing layers) from the multi-layer stack of the fins 206. A mask (e.g., a photoresist mask) 420 is formed over the capping layer 216 and the fins 204 first, the method 100 then performs one or more etching process, such as a dry etching process and/or a wet etching process, to remove the sacrificial layers 205 and leave behind the channel layers 209 (e.g., the Si-containing layers). In other words, after removing the sacrificial layers 205, openings 211 are inserted between or interleaved with the channel layers 209. In the present embodiments, the one or more etching process selectively remove the capping layer 216 and the sacrificial layers 205 completely without removing or substantially removing the channel layers 209. The capping layer 216 and the sacrificial layers 205 of the fins 204 under the mask 420 are intact or substantially intact during the removing of the capping layer 216 and the sacrificial layers 205 of the fins 206. The mask 420 is subsequently removed using any suitable process, such as ashing and/or resist stripping.

At operation 124, referring to FIGS. 16A to 16D, the method 100 removes portions of the capping layer 216 and portions of the sacrificial layers 205 (e.g., the SiGe-containing layers) from the multi-layer stack of the fins 204, thereby forming openings 211 between the channel layers 207. A mask (e.g., a photoresist mask) 440 is formed over the channel layers 209 first, the method 100 then performs one or more etching process, such as a dry etching process and/or a wet etching process, to selectively remove portions of the capping layer 216 over sidewalls of the sacrificial layers 205, without removing or substantially removing the capping layer 216 over sidewalls of the channel layers 207. The etching selectivity comes from the differences in bond strength and Ge % caused by the different interactions of the capping layer 216 with the channel layers 207 and the sacrificial layers 205. The bond strength between the capping layer 216 and the channel layer 207 is weaker than the bond strength between the capping layer 216 and the sacrificial layer 205. The Ge % is higher in the portions of the capping layer 216 disposed on sidewalls of the sacrificial layer 205 compared to the Ge % in the portions of the capping layer 216 disposed on sidewalls of the channel layer 207.

The method 100 then proceed to remove portions of the sacrificial layers 205, leaving remaining portions of the sacrificial layers 205 over the top and bottom surfaces of the channel layers 207 (except the topmost channel layer 207). The remaining portions of the capping layer 216 and the remaining portions of the sacrificial layers 205 are collectively referred to as the $V_t$ modulation layer 218. In another aspect, the $V_t$ modulation layer 218 includes remaining portions of capping layer 216 covering the top surface of the topmost channel layer of the fins 204, sidewalls of the fins 204 (including sidewalls of the base fin 204B). In addition, the $V_t$ modulation layer 218 includes portions of the sacrificial layers 205 covering the top and bottom surfaces of the channel layers 207 except the top surface of the topmost channel layer 207.

The mask 440 is removed after the forming of the $V_t$ modulation layer 218 (including portions of the capping layer 216 and portions of the sacrificial layers 205) using any suitable process, such as ashing and/or resist stripping. In the present embodiments, a first etching process including dry etching is used to remove portions of the mask 420 over the isolation structure and sidewalls of the fins 206. A second etching process including wet etching is used to remove portions of the mask 420 between the channel layers 209. In some embodiments, dry etching and wet etching are implemented alternatively to remove the mask 420 completely.

Figure 16A:
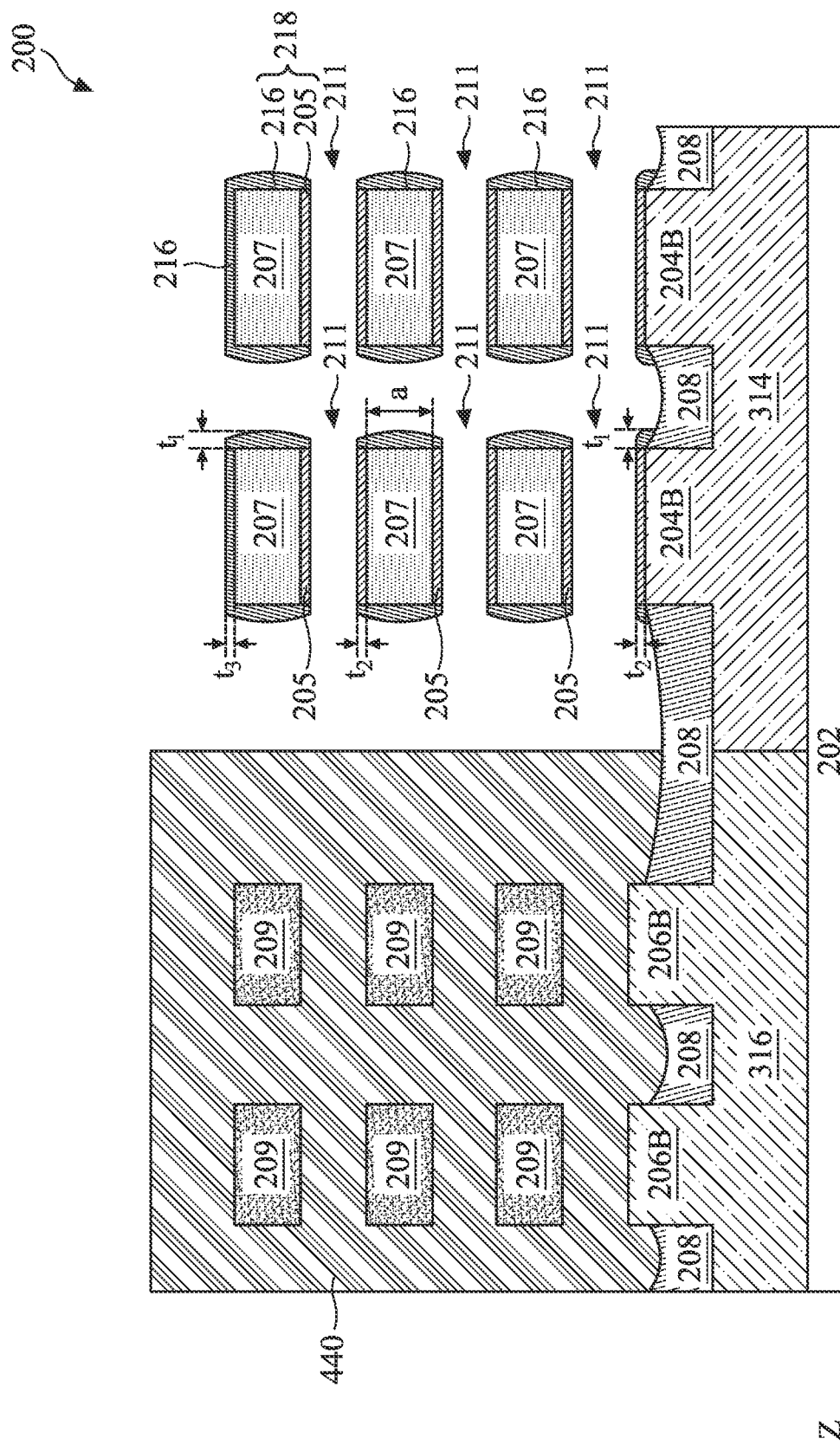
Figure 16B:
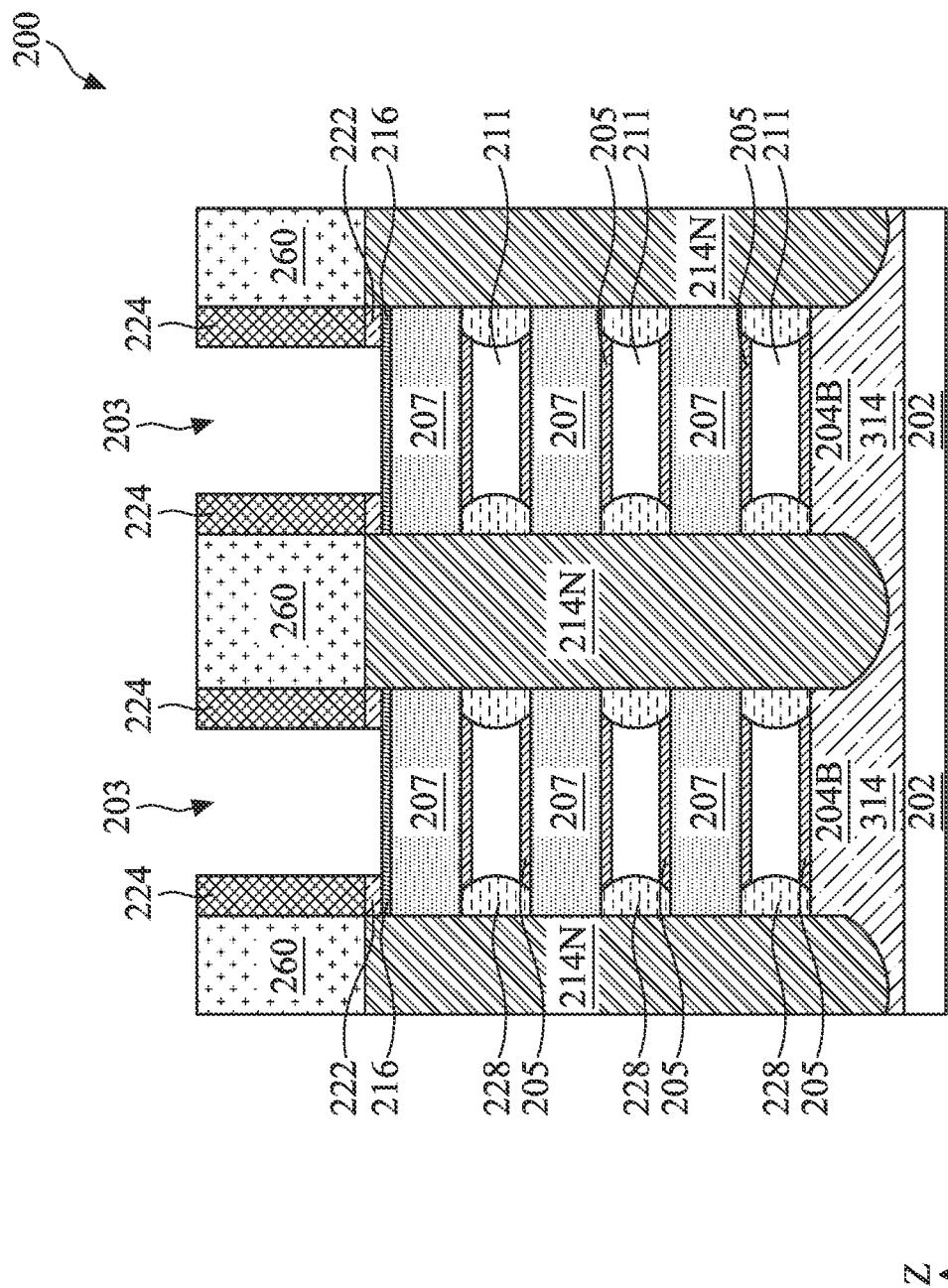

Referring to FIG. 16A, the remaining portions of the capping layer 216 on sidewalls of the channel layers 207 has a thickness $t_1$; each of the remaining portions of the sacrificial layers 205 has a thickness $t_2$; and the portions of the capping layer 216 over the top of the fins 204 has a thickness $t_3$. In the present embodiments, the thickness $t_1$ is greater than $t_2$, and the thickness $t_3$ about the same as the thickness $t_2$. The thicknesses $t_1$, $t_2$, and $t_3$ are such designed to accommodate the design requirements on the vertical height of the fins 204 for improved performance, such as reduced parasitic capacitance. It is noted that the present embodiments are not limited to such configuration. For example, the thickness $t_1$ may equal to $t_2$. The top surfaces and sidewalls of the base fins 204B are also covered by the remaining portions of the sacrificial layers 205 and the capping layer 216, respectively.

Figure 16C:
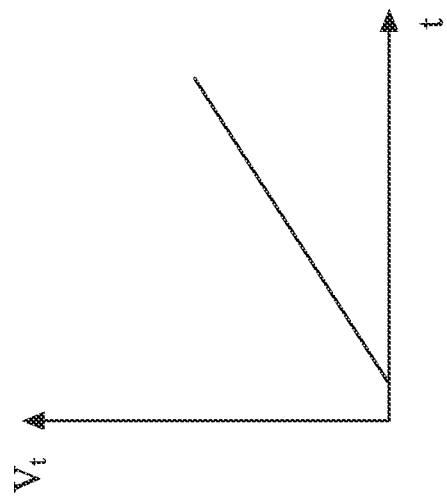
FIGS. 16C and 16D illustrate the threshold voltage (Vt) changes according to the changes of the $V_t$ modulation layer thickness and the Ge percentage in the $V_t$ modulation layer.

Referring to FIG. 16C, the thickness t (average of $t_1$, $t_2$ and $t_3$) of the $V_t$ modulation layer 218 can be controlled to fine-tune (or modulate) the $V_t$ since the $V_t$ increases with the increasing thickness t. In some embodiments, the value of $V_t$ is proportional to the thickness t. For example, the tuning range of $V_t$ increases by about 5 times when the thickness t increases by 5 times. In another example, the thickness t is about 10% to about 50% of a thickness a of the channel layers 207. In the present embodiments, the $V_t$ ranges from −20 mV to about −100 mV when the thickness t is adjusted from about 10% to about 50% of the thickness a.

Figure 16D:
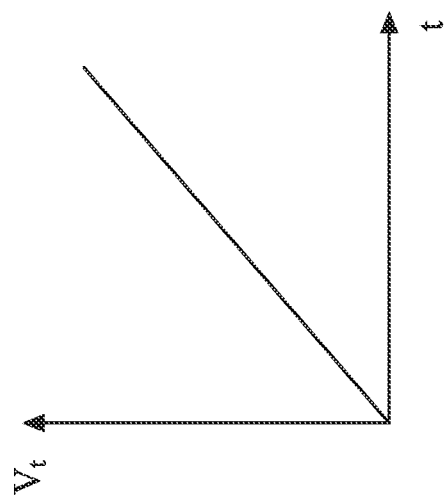

Referring to FIG. 16D, the composition of the $V_t$ modulation layer 218 (including portions of the capping layer 216 and portions of the sacrificial layers 205) is consisting with that discussed with respect to the FIGS. 5A and 5B. In the present embodiments, the capping layer 216 and the sacrificial layers 205 both include $Si_{1-x}Ge_x$ (0.4<x<1) with the same Ge %. Alternatively, the Ge % in the capping layer 216 may be different from that in the sacrificial layers 205. For example, the Ge % in the capping layer 216 may be greater than that in the sacrificial layers 205. The Ge % is used to fine-tune (or modulate) the $V_t$ since the value of $V_t$ increases with the increasing Ge % (e.g., the value of $V_t$ is proportional to the Ge %). In one example, the tuning range of $V_t$ increases by 2.5 times when the Ge % increases from about 40% to about 100%. In another example, the $V_t$ is fine-tuned (or modulated) in a range of about −20 mV to about −50 mV.

At operation 126, referring to FIGS. 17A-20B collectively, the method 100 forms gate stacks 620. Structures and compositions of various components of the gate stacks 620 are consistent with discussion with respect to FIGS. 5A and 5B and will thus be omitted for the discussion of the method 500 below for purposes of simplicity.

Figure 17A:
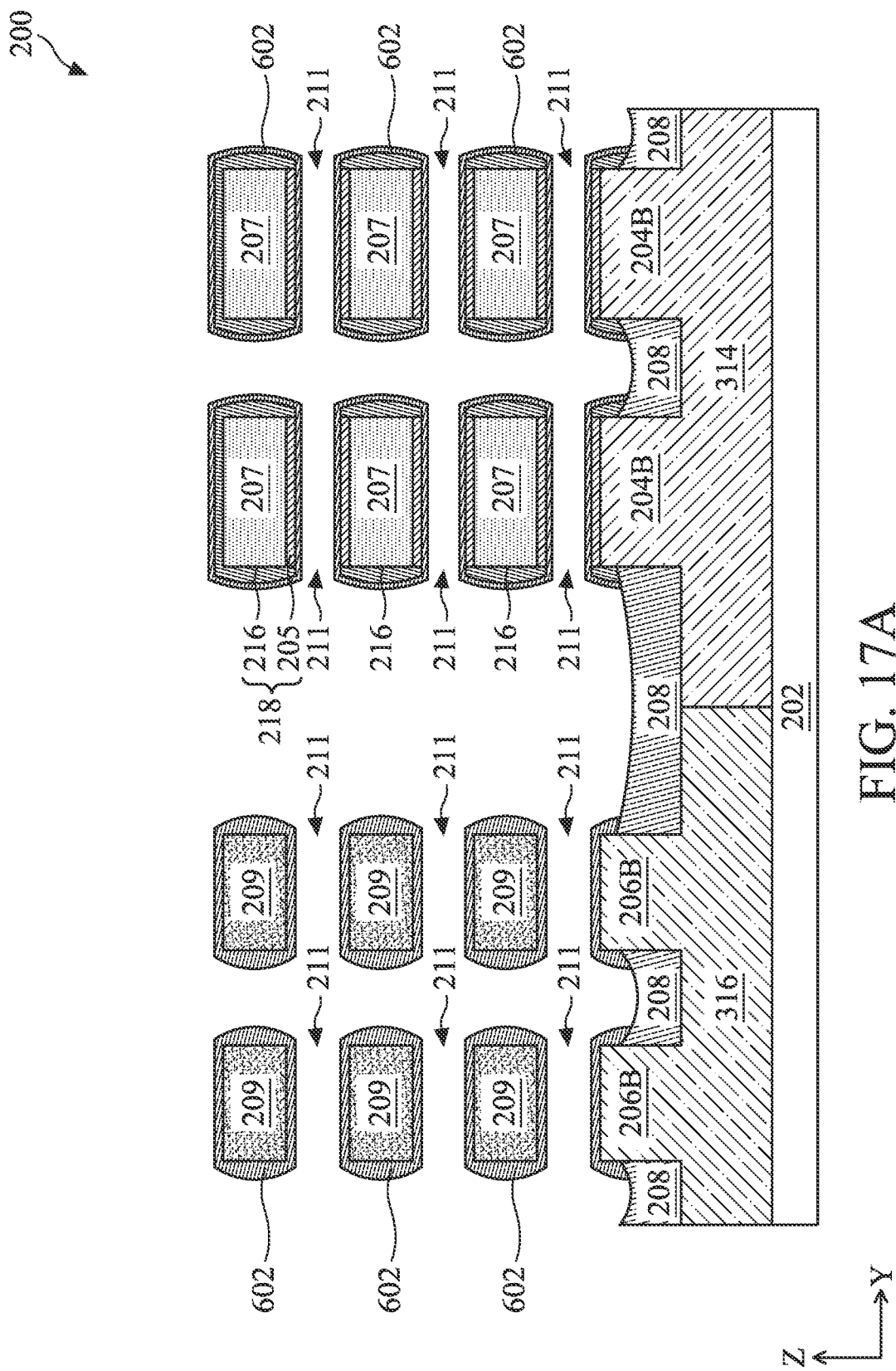
Figure 17B:
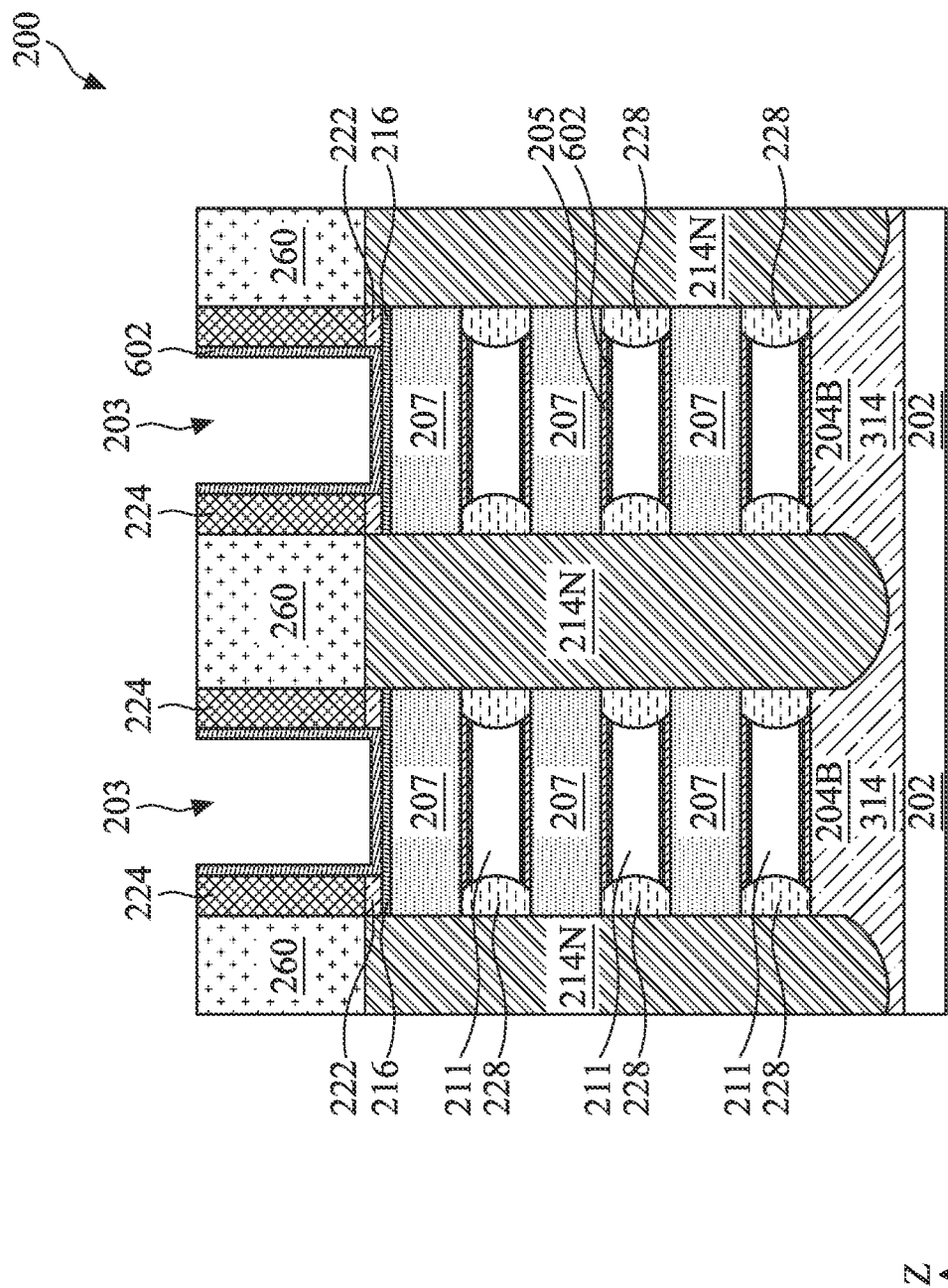

Referring to FIGS. 17A and 17B, the method 100 first forms the interfacial layer 602 in the gate trench 203 and the openings 211, such that the interfacial layer 602 is conformally deposited on surfaces of each of the channel layers 207, the base fins 204B, and the $V_t$ modulation layer 218 (including the remaining portions of the capping layer 216 and the remaining portions of the sacrificial layers 205). The interfacial layer 602 may include a dielectric material such as silicon oxide ($SiO_2$), HfSiO, or silicon oxynitride (SiON), combinations thereof, or other suitable material. The interfacial layer 602 may be formed by chemical oxidation, thermal oxidation, atomic layer deposition (ALD), chemical vapor deposition (CVD), and/or other suitable method.

Figure 18A:
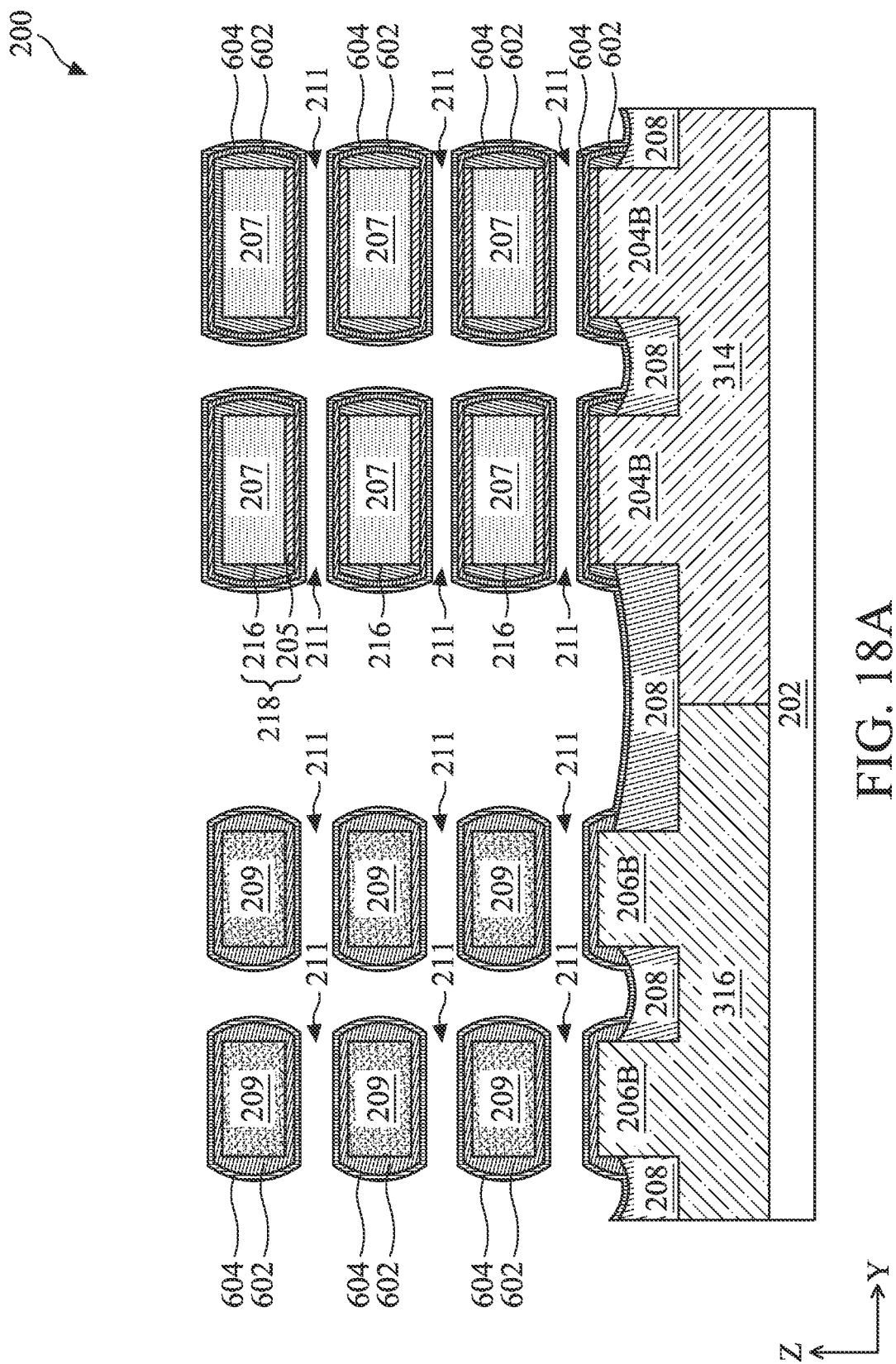
Figure 18B:
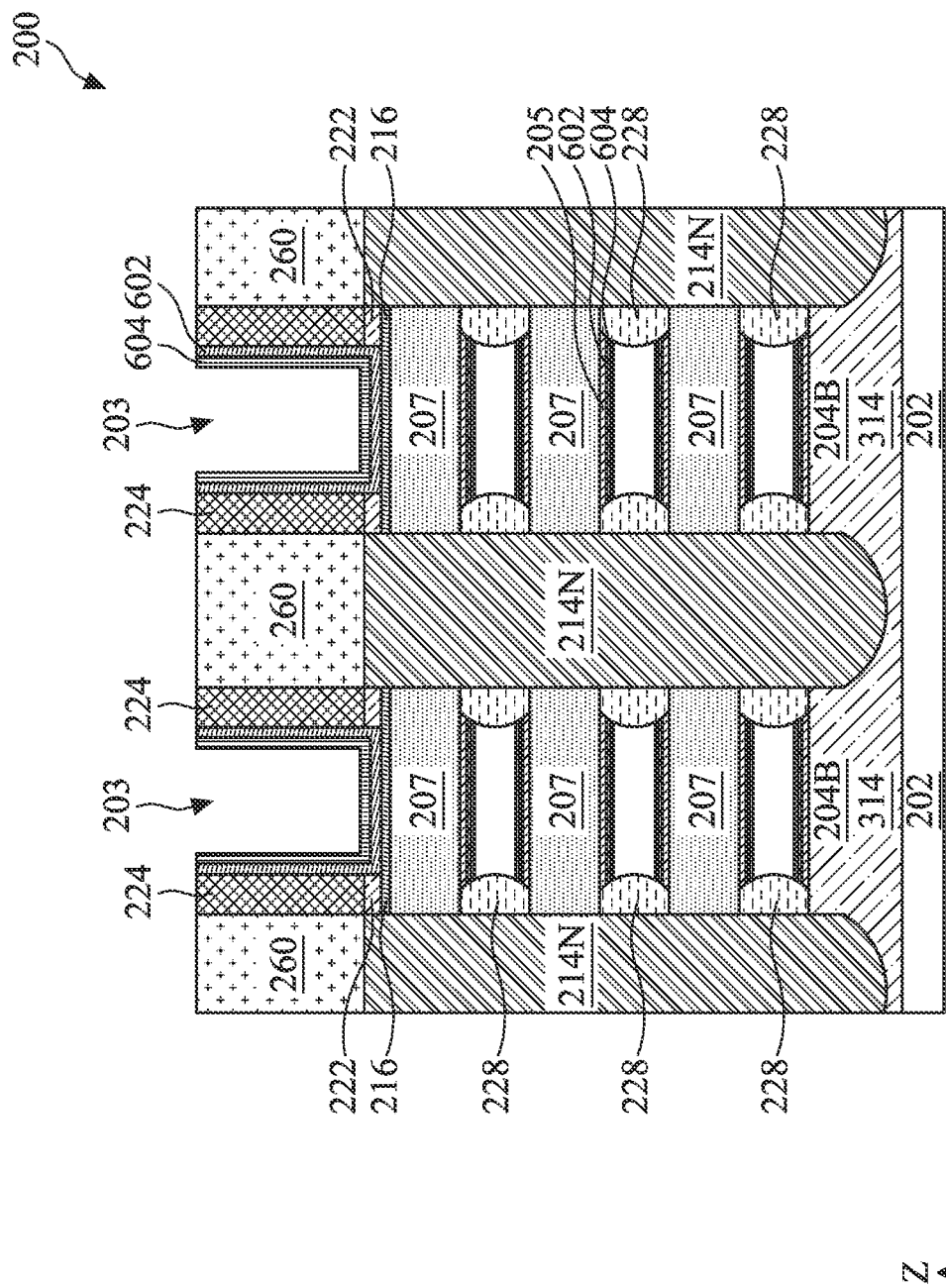

Referring to FIGS. 18A and 18B, the method 100 forms a gate dielectric layer 604 over the interfacial layer 602. The gate dielectric layer 604 is deposited conformally over the interfacial layer 602 and wrapped around the each of the channel layers 207 and each of the channel layers 209. The gate dielectric layer 604 of the gate stacks 620 may include a high-K dielectric layer such as hafnium oxide ($HfO_2$). Alternatively, the gate dielectric layer 604 of the gate stacks 620 may include other high-K dielectrics, such as $TiO_2$, HfZrO, $Ta_2O_3$, $HfSiO_4$, $ZrO_2$, $ZrSiO_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, oxynitrides (SiON), combinations thereof, or other suitable material. The gate dielectric layer 604 may be formed by ALD, physical vapor deposition (PVD), CVD, oxidation, and/or other suitable methods.

Figure 19A:
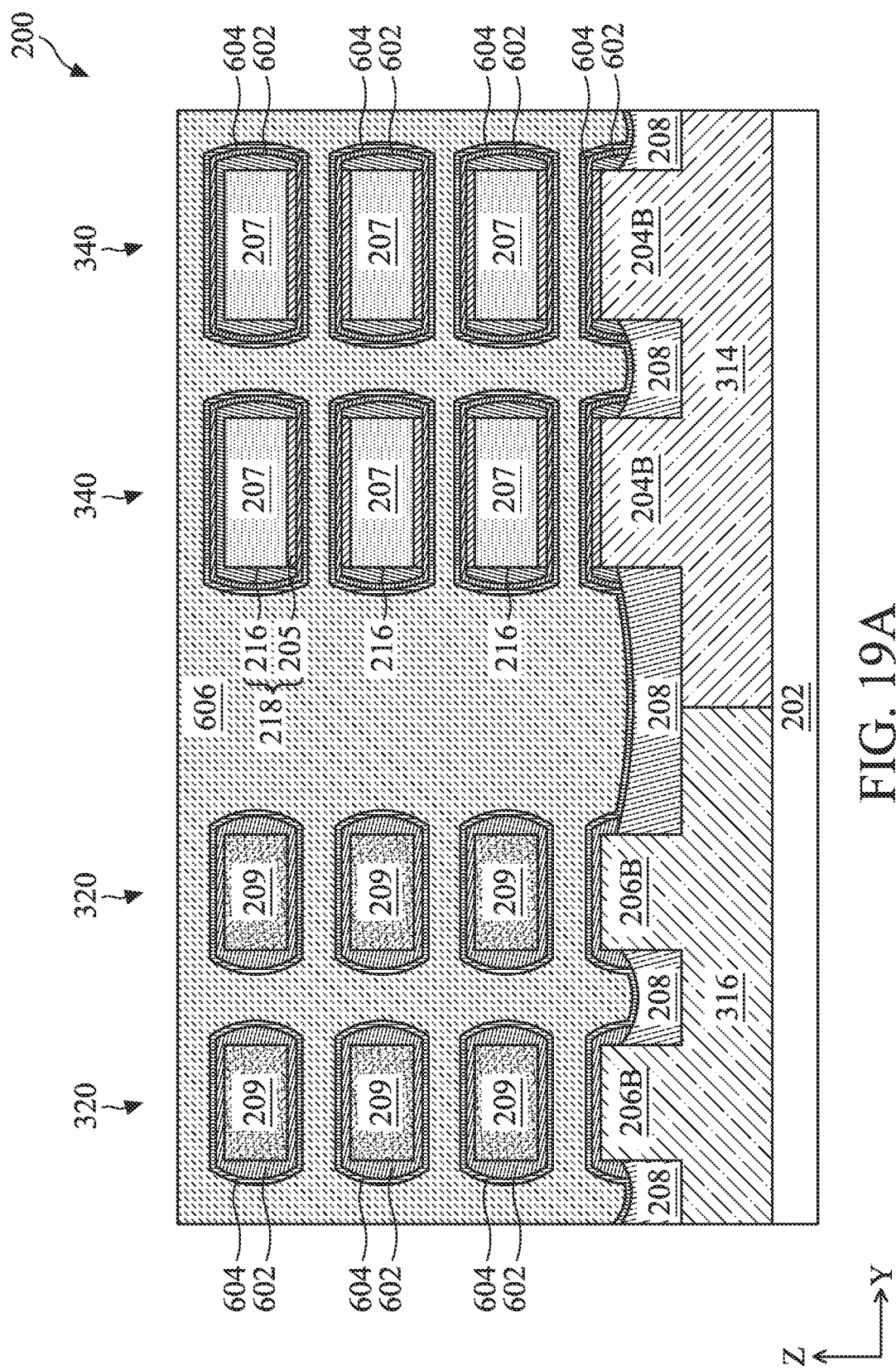
Figure 19B:
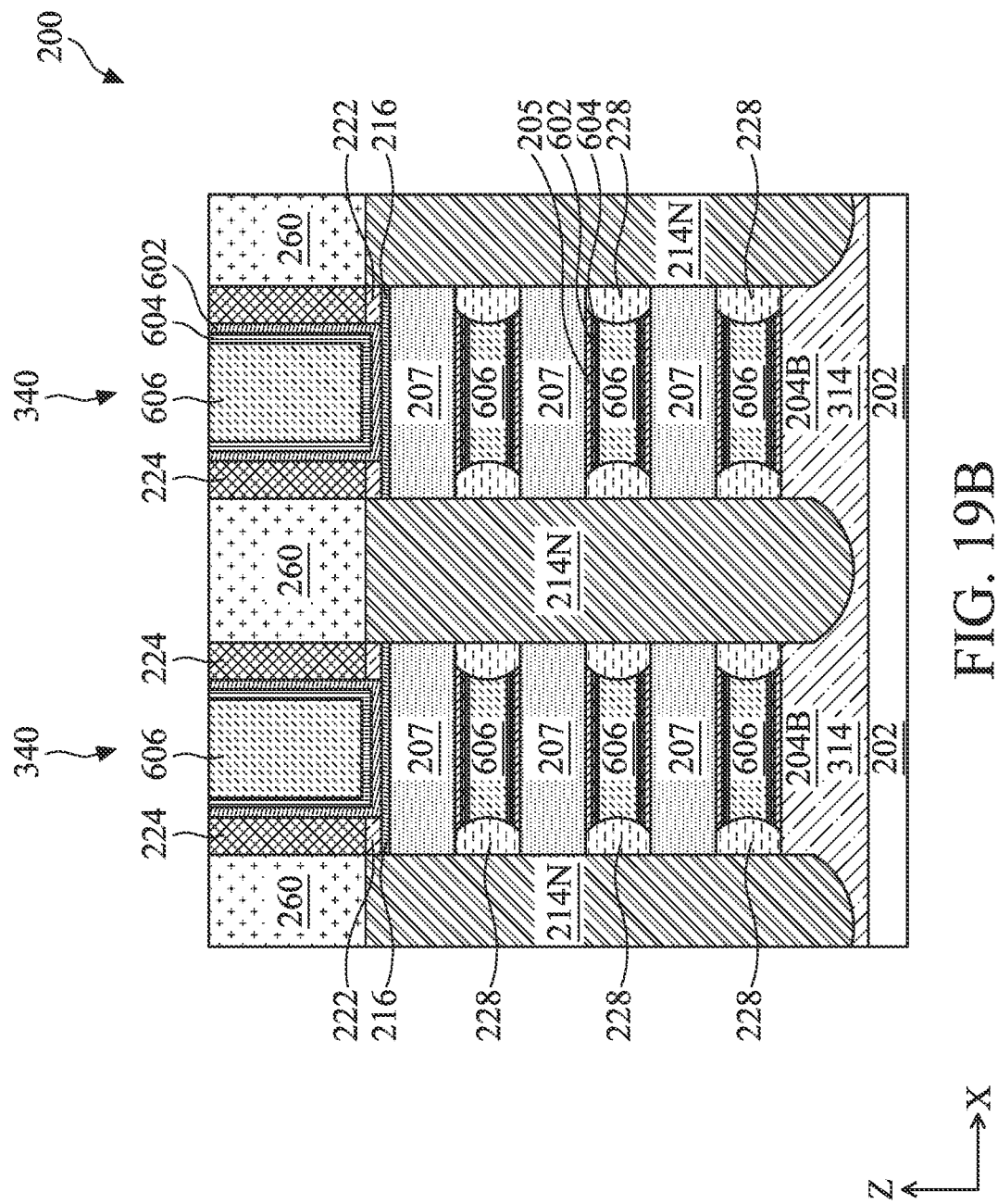

Referring to FIGS. 19A and 19B, the method 100 forms the WFM layer 606 over the gate dielectric layer 604. In the present embodiments, forming the WFM layer 606 completely fills the openings 211 and the gate trench 203, such that the outer sidewalls of the WFM layers 606 defines the sidewalls of the gate stacks 620 when viewed along a lengthwise direction of the gate stacks 620 (FIG. 19A). Generally, the method 100 forms the WFM layer 606 via a series of deposition and patterning processes, such that the composition and the work function of the WFM layers for the NS NFET 340 and the NS PFET 320 are different and suitable for tuning the V$_t$ of their respective NS FETs. In the present embodiments, the WFM layer 606 extends from the fins 204 to the fins 206. In other words, the WFM layer of the NS NFETs 340 and the WFM layer of the NS PFETs 320 are the same (e.g., in compositions or structures). One or more CMP process may be implemented thereafter to planarize the top surface of the WFM layers 606. The WFM layer may include more than one layers, where each of the WFM layers may be deposited by ALD, CVD, PVD, other suitable deposition processes, or combinations thereof. The deposition and patterning processes may be repeated if the WFM layer includes more than one WFMs.

Figure 20A:
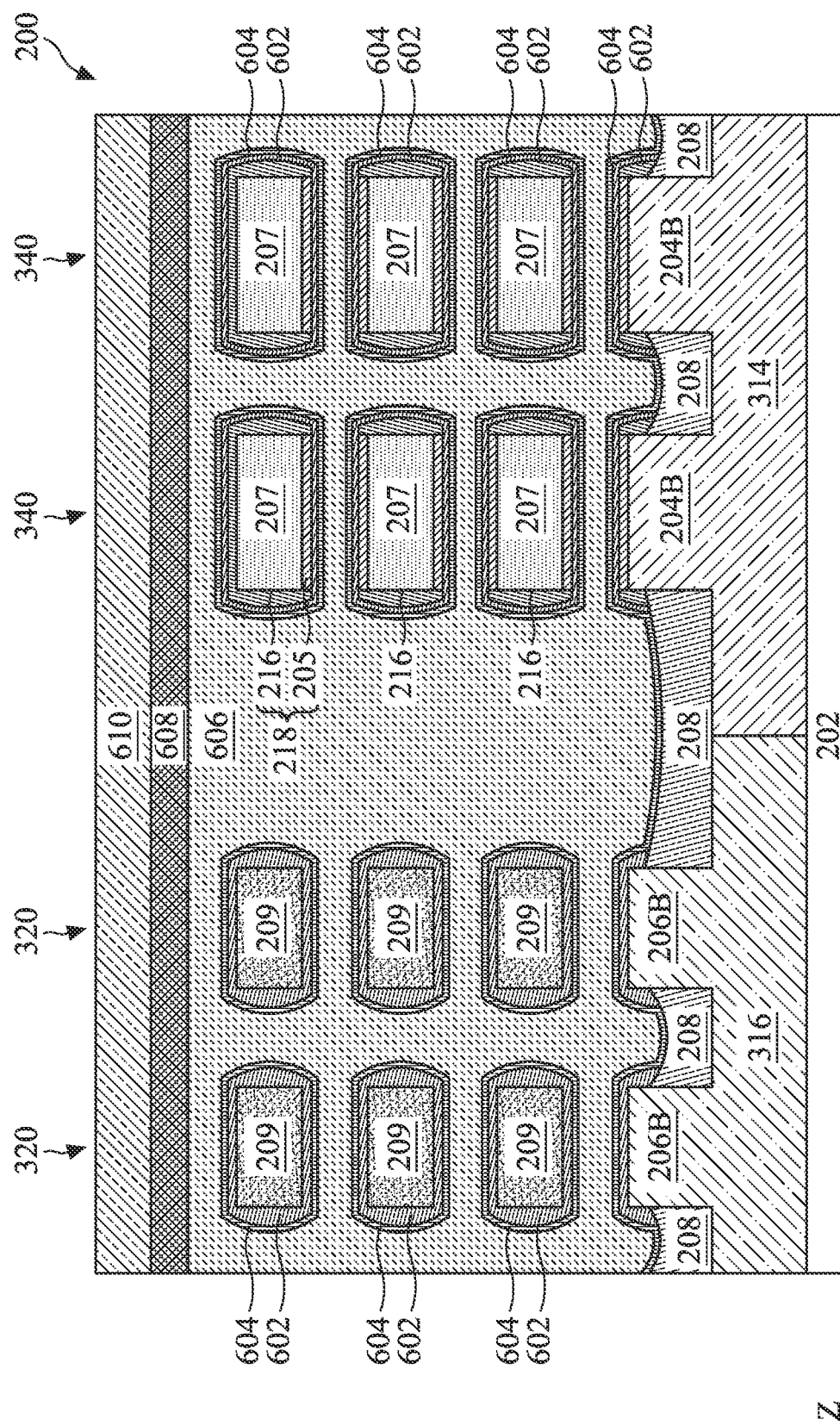
Figure 20B:
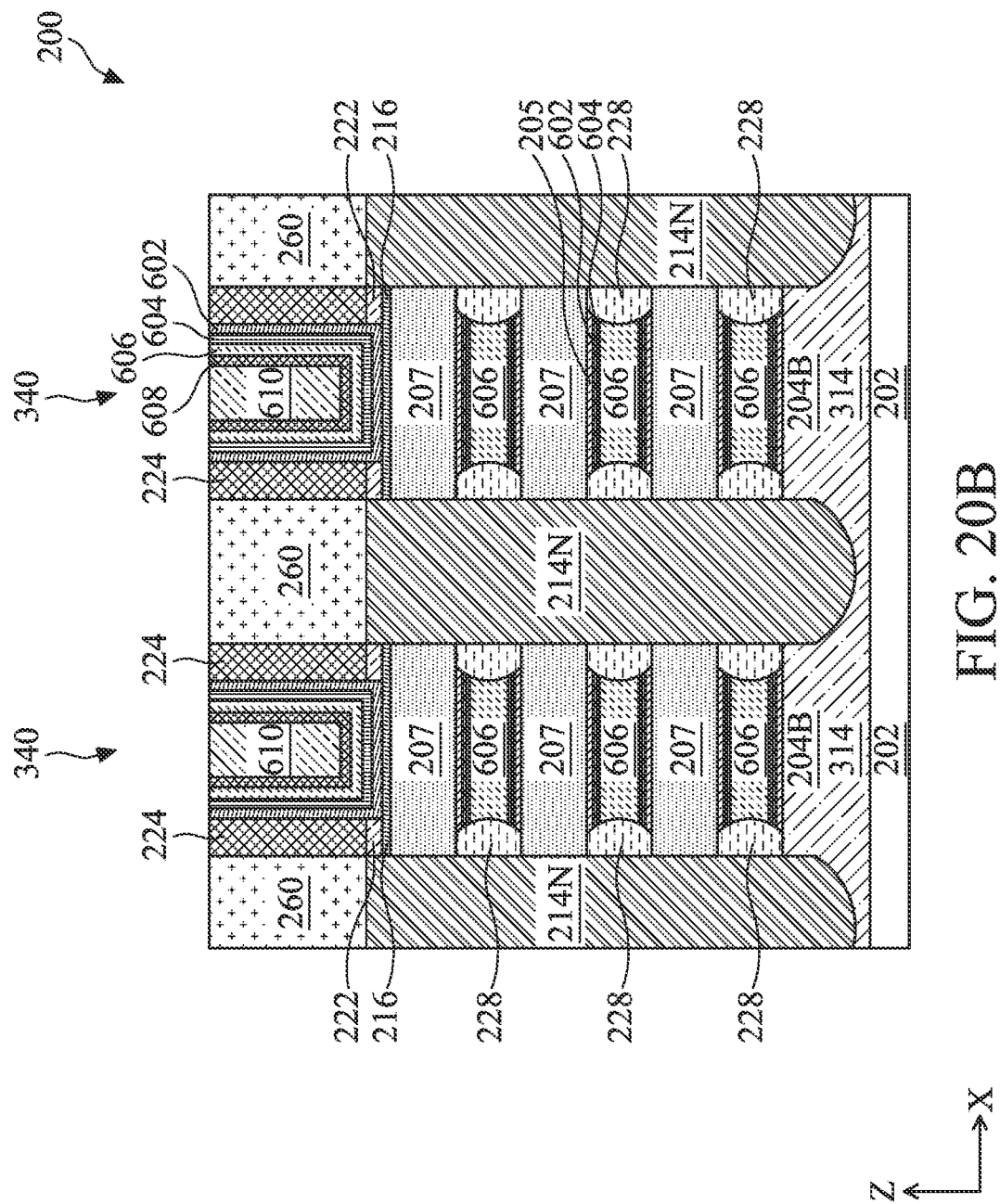

Referring to FIGS. 20A and 20B, the method 100 may form the liner layer 608 disposed over the WFM layer 606. In some embodiments, the liner layer 608 is configured to reduce the element (e.g., aluminum) diffusion of the WFM layer 606 to the subsequently formed metal fill layer 610 over the liner layer 608. In some embodiments, the method 100 may further form a wetting layer, an adhesion layer, a metal alloy, and/or a metal silicide over the WFM layer 606 to further enhance the device performance.

Still referring to FIGS. 20A and 20B, the method 100 forms the metal fill layer 610 over the liner layer 608. The method 100 first recesses the WFM layers 606 to form a trench (not shown). In the present embodiments, recessing the WFM layer 606 does not completely remove the portions of the WFM layer 606 disposed over the channel layers 207 and the channel layers 209. The WFM layers 606 may be recessed by a dry etching process and/or a wet etching process, using an etchant including a fluorine-based etchant (e.g., CF$_4$, SF$_6$), a chlorine-based etchant (e.g., CCl$_4$), hydrogen peroxide, an acid (e.g., H$_3$PO$_4$, HNO$_3$), other suitable etchants, or combinations thereof, where the type of and etchants used may be selected based on the compositions of the WFM layer 606.

Subsequently, still referring to FIGS. 20A and 20B, the method 100 forms the metal fill layer 610 in the trench, thereby filling the gate trench 203. The metal fill layer 610 may be formed by a deposition process, such as CVD, ALD, PVD, plating, other processes, or combinations thereof. In the present embodiments, the method 100 deposits W in the trench to form the metal fill layer 610. In some embodiments, the deposition process is an epitaxial growth process during which the metal fill layer 610 selectively grows from a metal-containing surface, e.g., the WFM layers 606, rather than from a dielectric-containing surface, e.g., the ILD layer 260 or the top gate spacers 224. In other words, the deposition process forms the metal fill layer 610 in a substantially bottom-up growth scheme in the trench. In some embodiments, such bottom-up growth scheme causes a top portion of the metal fill layer 610 to protrude from a top surface of the ILD layer 260. Accordingly, the method 100 subsequently performs one or more CMP process to remove the protruded top portion, thereby planarizing the metal fill layer 610 and completing the fabrication of the gate stacks 620 as depicted in FIGS. 20A and 20B. In the present embodiments, the metal fill layer 610 and the portions of the WFM layers 606 together constitute the top portion 620A, which is formed over the bottom portion 620B that includes portions of the WFM layers 606 but is free of the metal fill layer 610.

At operation 128, the method 100 performs additional processing steps including, for example, forming contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Figure 21:
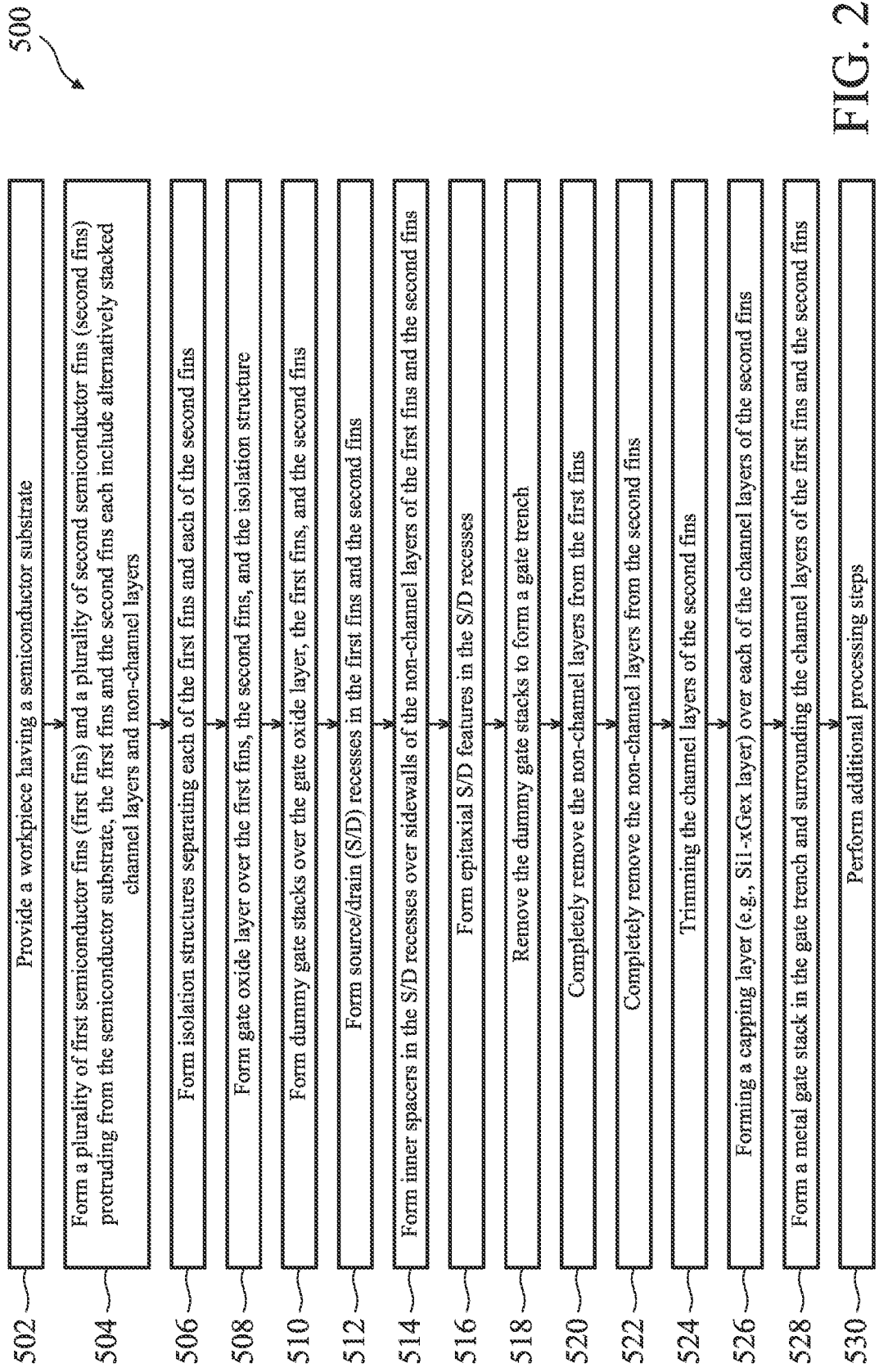
FIG. 21 illustrates a flow chart of a method for fabricating an IC device according to various aspects of the present disclosure.

Alternative to the method 100, device 200 can also be formed according to a method 500 as shown in FIG. 21. Different from the method 100, where the forming of the capping layer 216 is prior to the forming of the dummy gate stacks 220, method 500 forms the capping layer 216 after the removing of the dummy gate stacks 220. Except the forming of the capping layer 216, operations of the method 500 are consistent with these of the method 100 and the related components of the device 200 share the same reference numerals as those provided above with respect to the method 100, these operations will thus be omitted for the discussion of the method 500 below for purposes of simplicity.

Figure 22A:
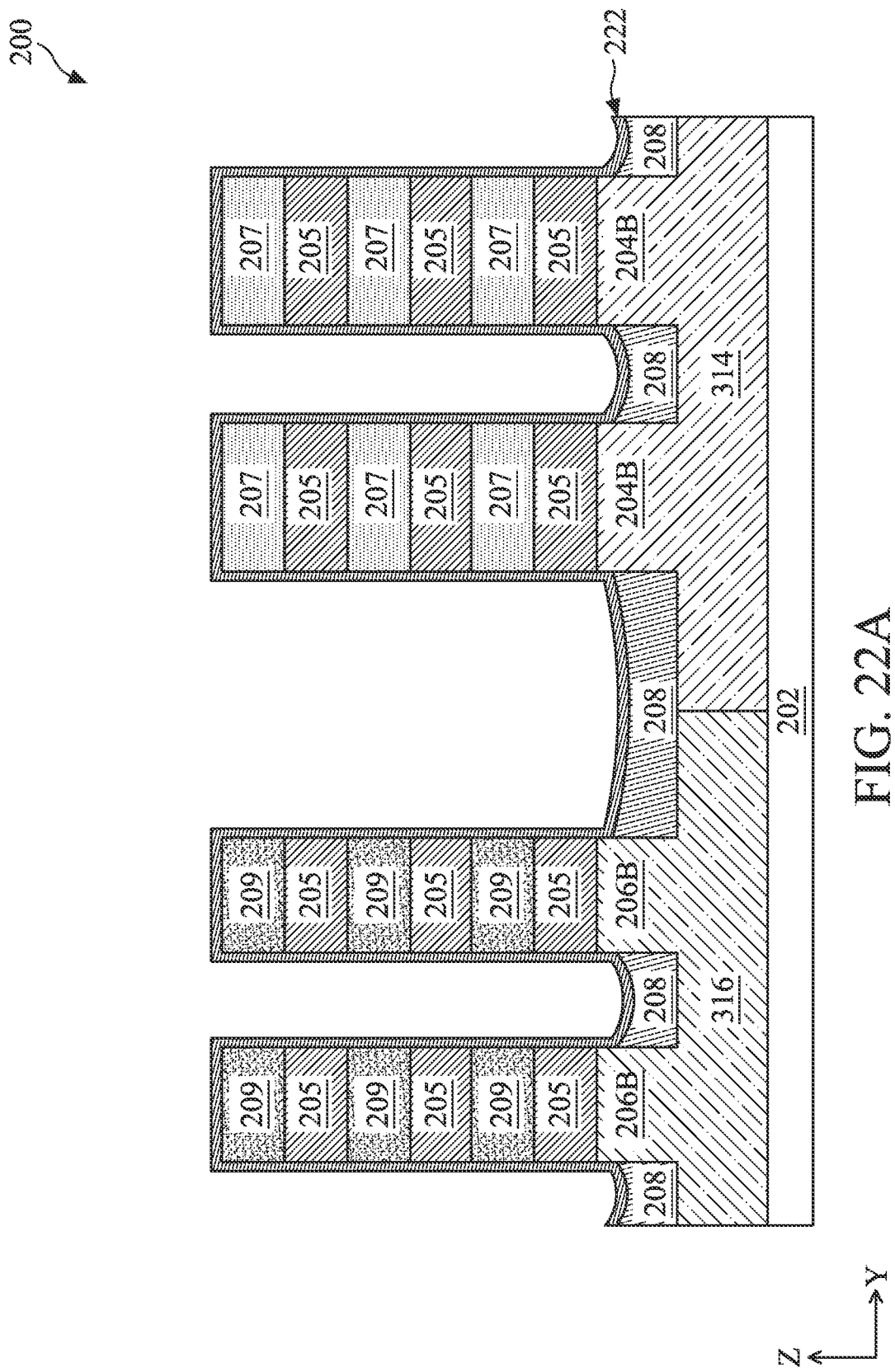
FIGS. 22A, 23A, 24A, 25A, and 26A are cross-sectional views of the semiconductor device taken along line A-A' as shown in FIG. 4 during intermediate stages of the method shown in FIG. 21 according to various embodiments of the present disclosure.
Figure 22B:
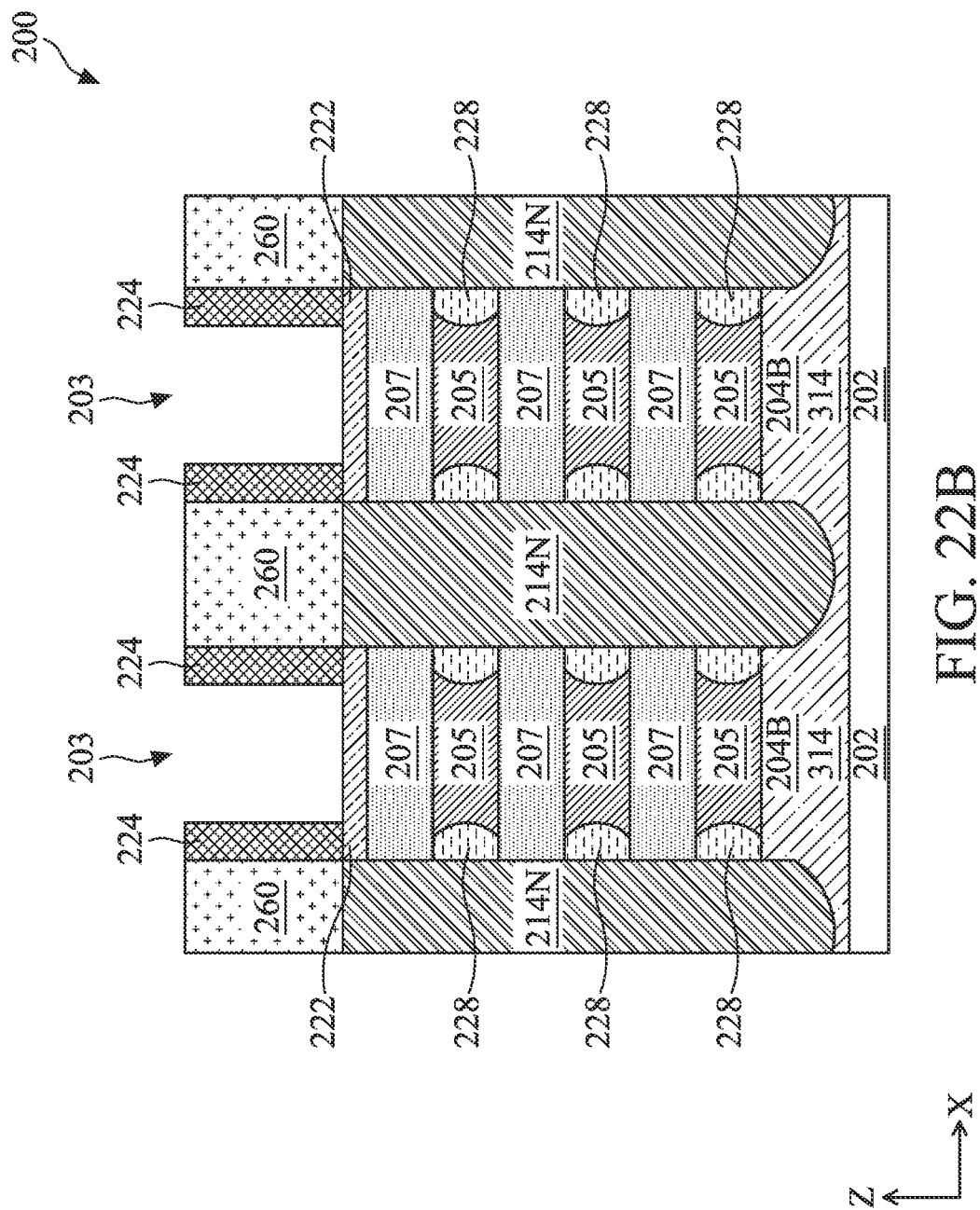
FIGS. 22B, 23B, 24B, 25B, and 26B are cross-sectional views of the semiconductor device taken along line B-B' as shown in FIG. 4 during intermediate stages of the method shown in FIG. 21 according to various embodiments of the present disclosure.
Figure 23A:
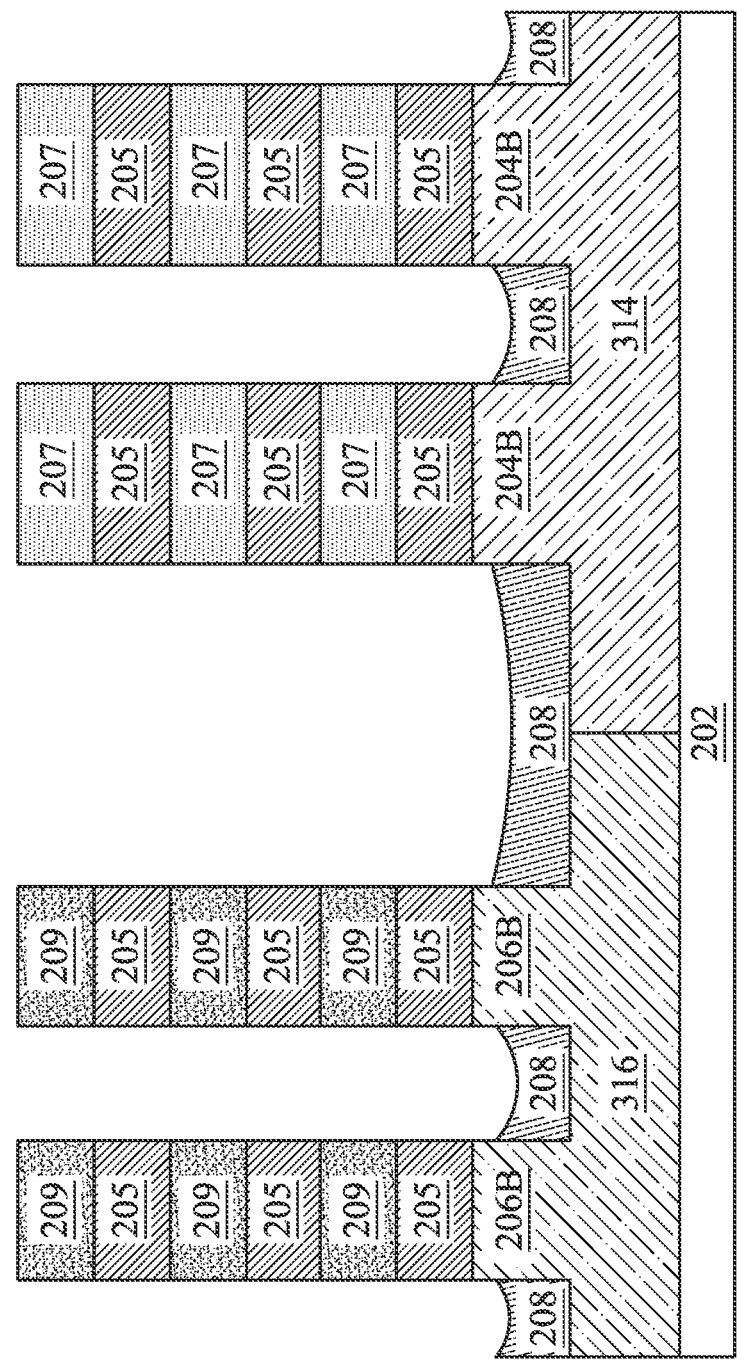
Figure 23B:
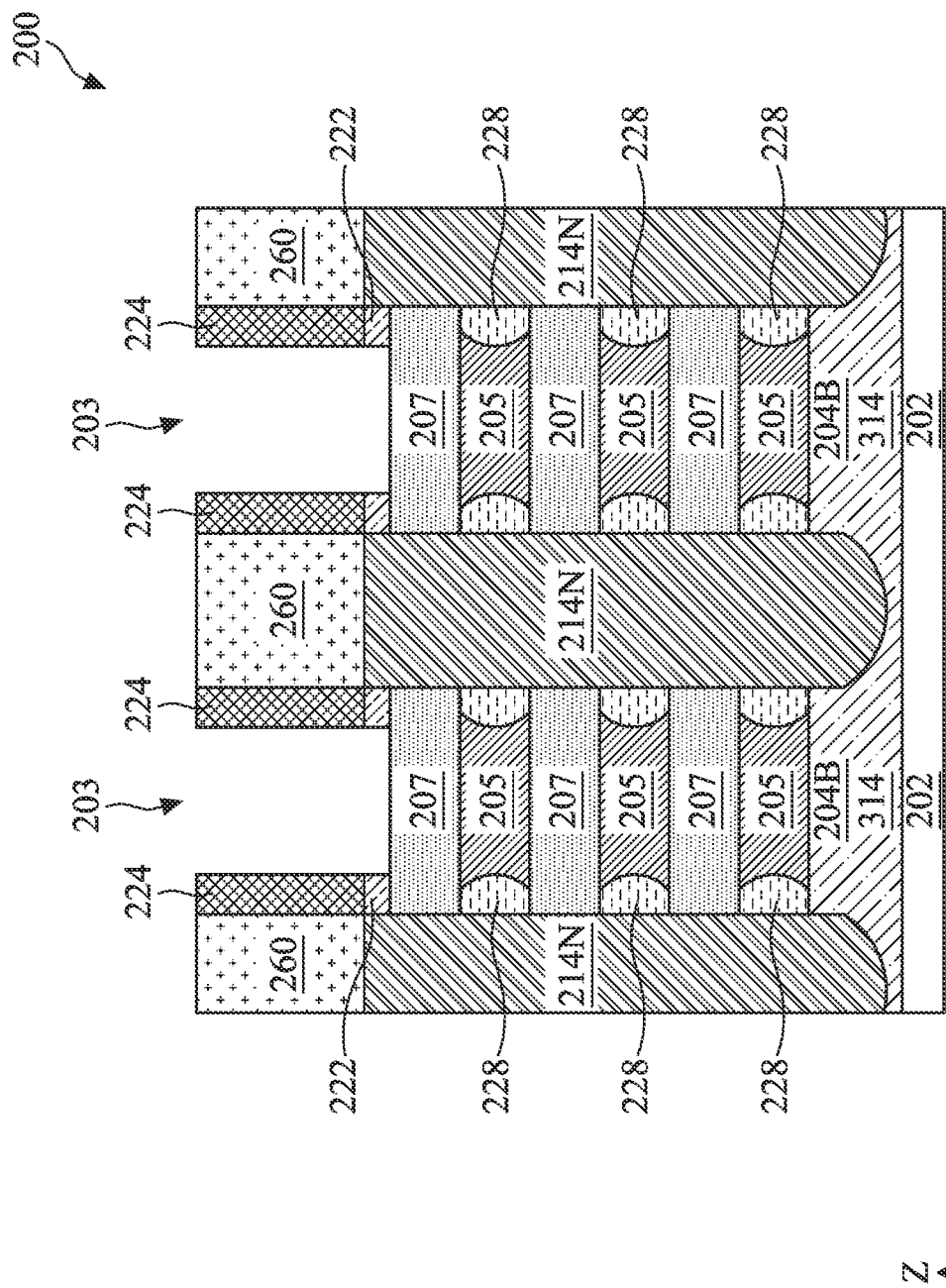
Figure 24A:
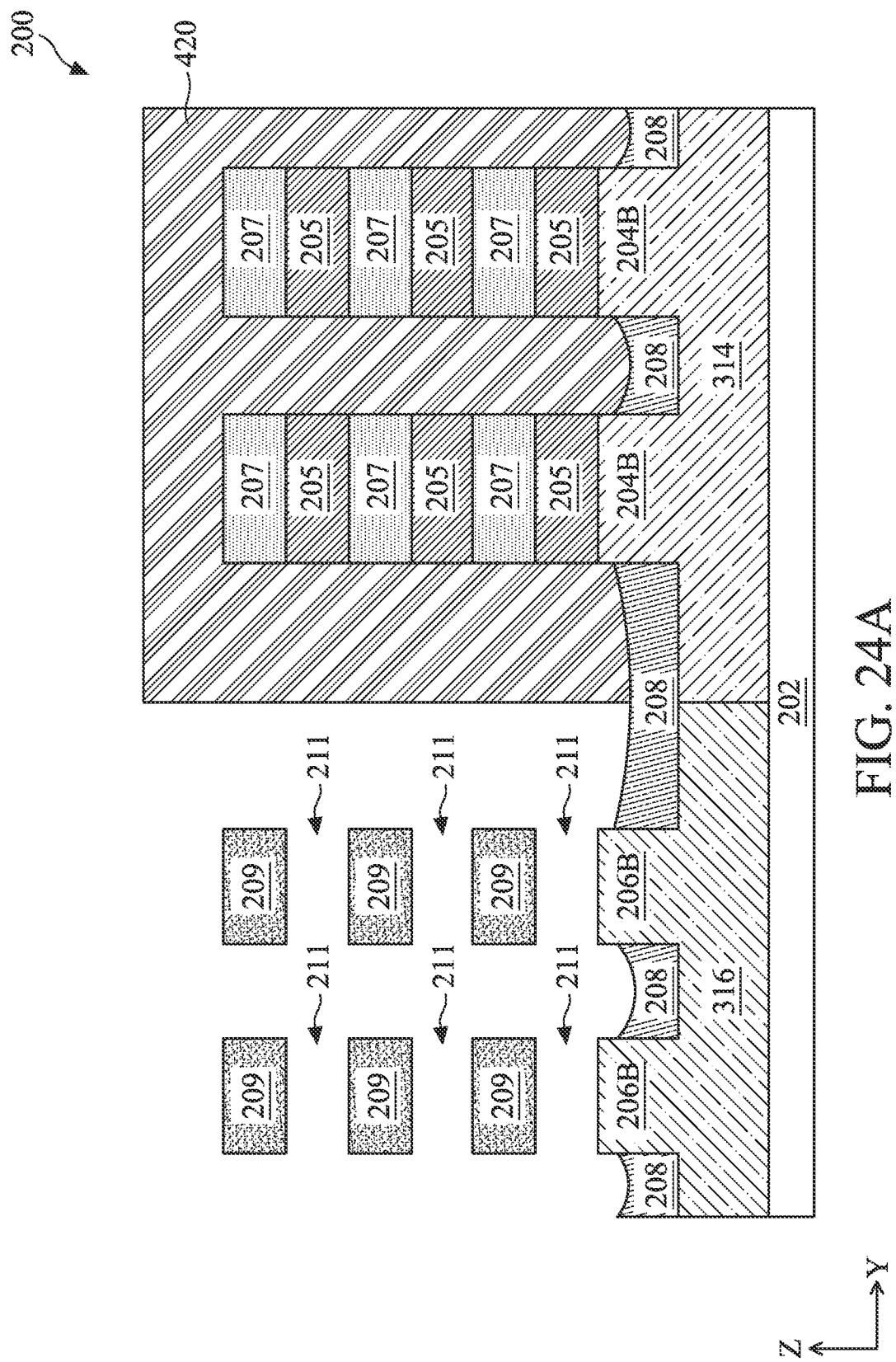
Figure 24B:
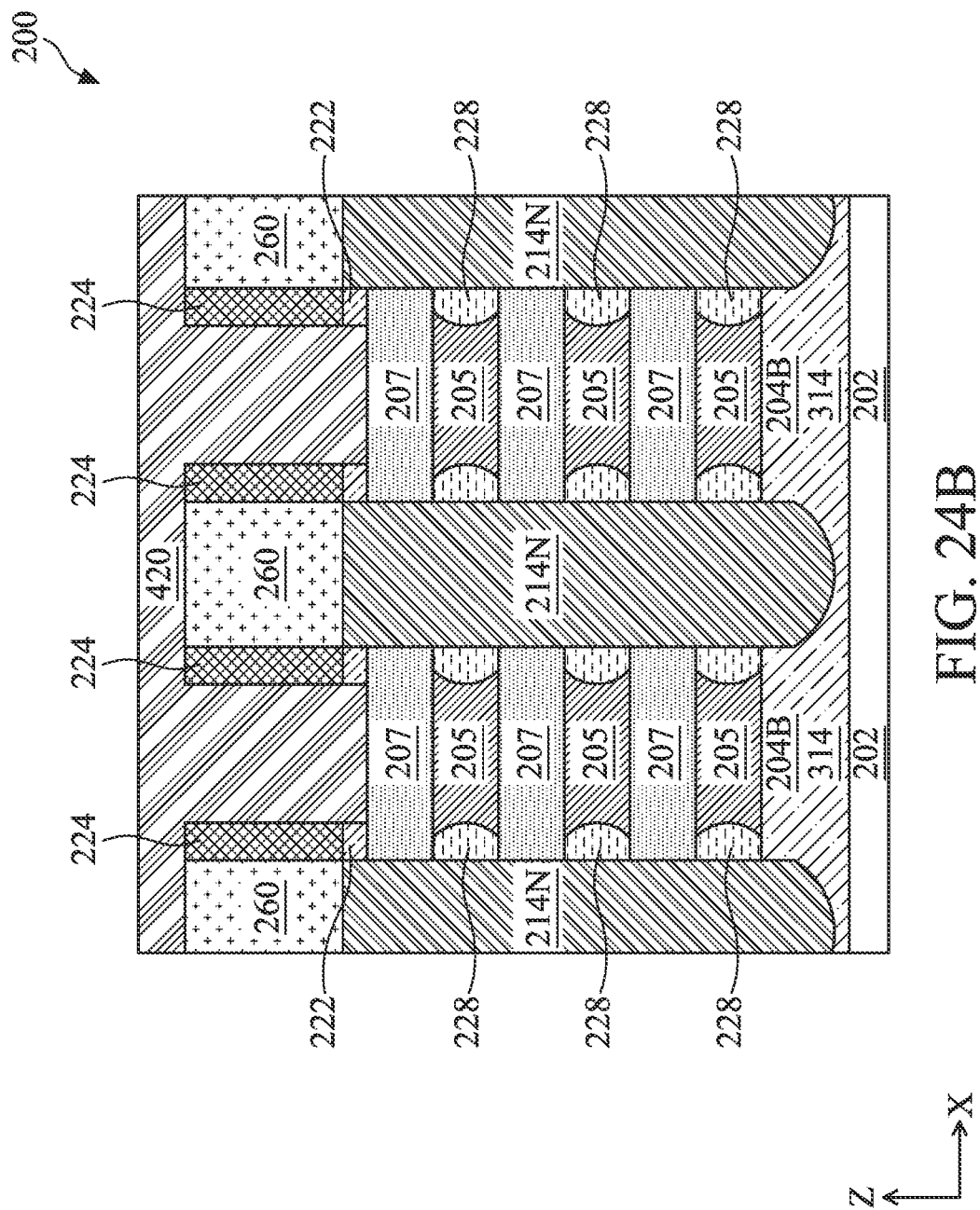

At operation 518, referring to FIGS. 22A and 22B, the method 500 removes the dummy gate stack 220. After the removing of the dummy gate stacks 220, the sacrificial dielectric layer 222 covers the fins 206 and the fins 204. Portions of the sacrificial dielectric layer 222 are exposed in the gate trenches 203. Referring to FIGS. 23A and 23B, the method 100 then removes the exposed portions of the sacrificial dielectric layer 222 from the gate trenches 203, where remaining portions of the sacrificial dielectric layer 222 are disposed between the top gate spacer 224 and the topmost channel layers 207 and the channel layers 209. Thereafter, referring to FIGS. 24A and 24B, the method 100 removes the sacrificial layers 205 of the fins 206 to form openings 211 at operation 520. The mask 420 is applied over the fins 204 during the removing of the sacrificial layers 205 of the fins 206, such that the fins 204 are intact or substantially intact. The mask 420 is subsequently removed to expose the fins 204. The method 100 then completely removes the sacrificial layers 205 of the fins 204 at operation 522. A mask 440 is formed over the fins 206 prior to the removing of the sacrificial layers 205 of the fins 204 as shown in FIGS. 25A and 25B.

Figure 25A:
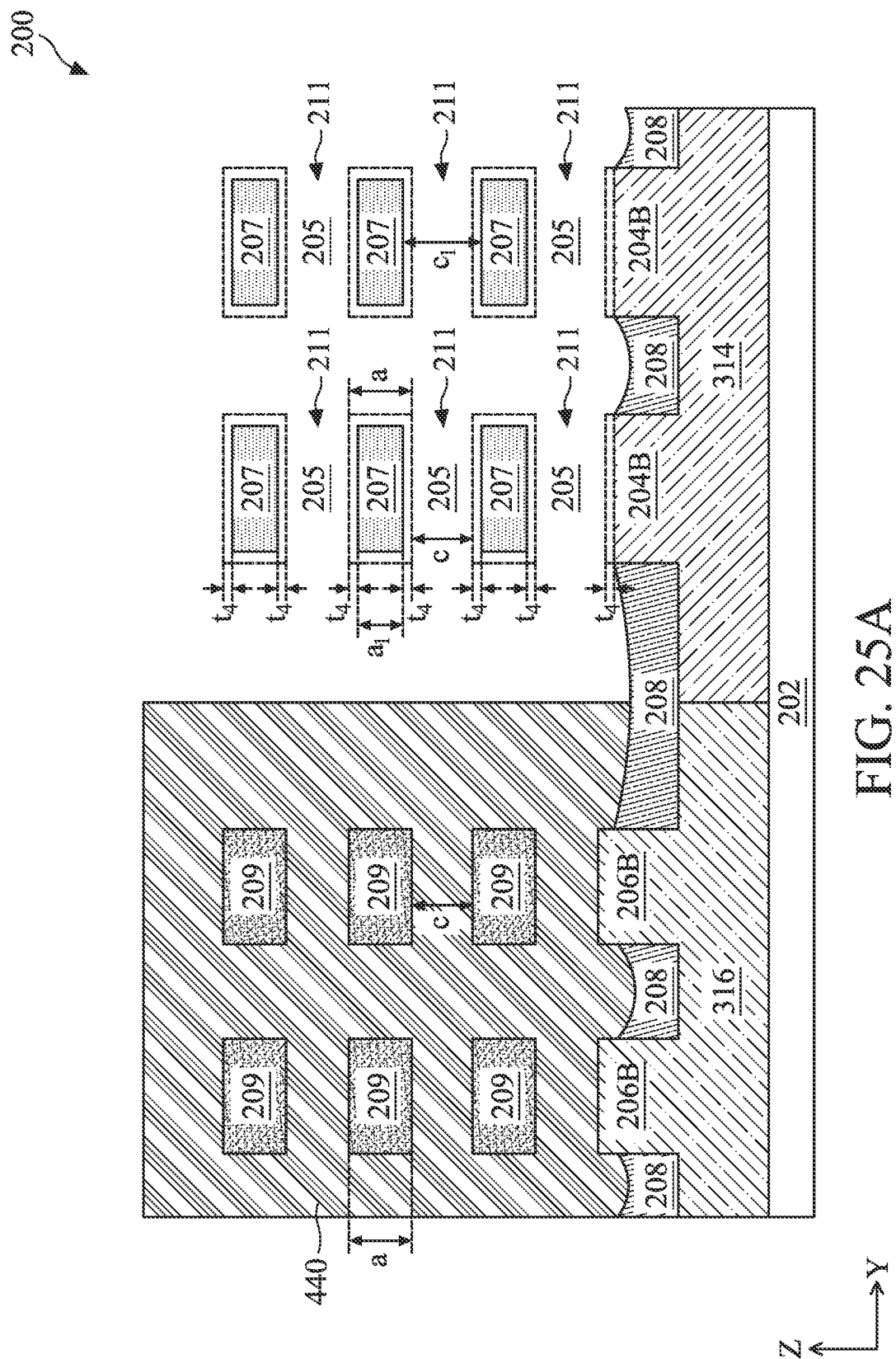
Figure 25B:
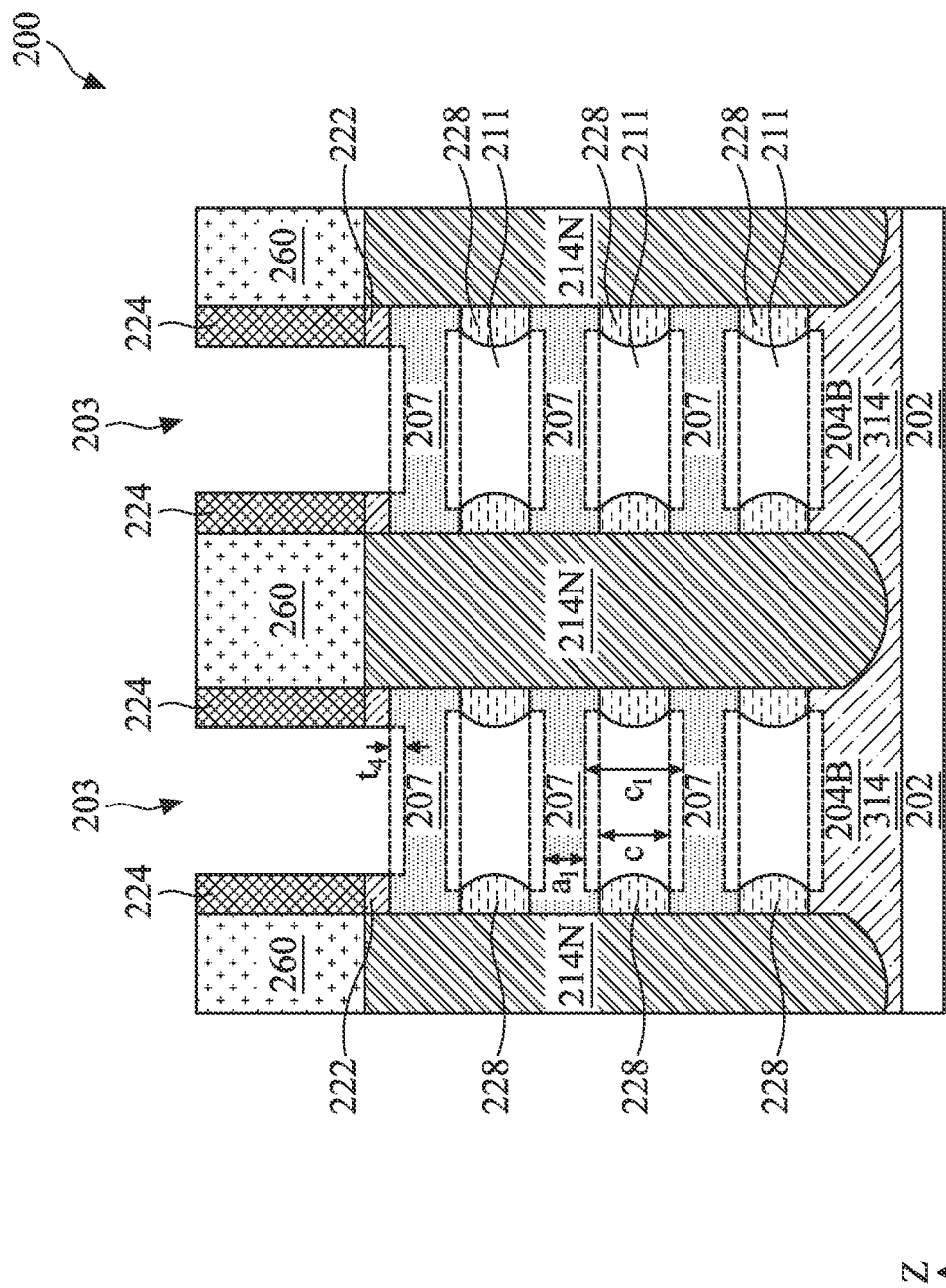

At operation 524, referring to FIGS. 25A and 25B, the method 500 trims the channel layers 207. The trimming reduced the thickness and width of the channel layers 207 and enlarge the thickness of the openings 211 between the channel layers 207, thereby allowing thicker $V_t$ modulation layer 118 to be formed between the channel layers 207 to further adjust the $V_t$. Each of the channel layers 207 are trimmed to remove a top portion, a bottom portions, and sidewall portions. The top portion of the base fins 204B may also be trimmed. The trimmed portions of the channel layers 207 are indicated in the dashed squares. In some embodiments, each of the trimmed portions of the channel layers 207 is defined by a thickness $t_4$. In some examples, the thickness $t_4$ is about 10% to about 30% of the thickness a. Each of the channel layers 207 is trimmed from a thickness a to a thickness $a_1$, and a distance between two channel layers 207 changes from a distance c to a distance $c_1$. In other words, each of the trimmed channel layers 207 has a thickness $a_1$ that is less than the thickness a of each of the channel layers 209. In some embodiments, the thickness $a_1$ is about 40% to about 80% of the thickness a. In some embodiments, the thickness $t_4$ is about 20% to about 80% of the distance c. In some embodiments, the distance $c_1$ is about 1.5 to about 3.5 times of the distance c. The thickness $t_4$ is selected to accommodate the subsequently formed $V_t$ modulation layer 118 and the gate stack 620. If the thickness $t_4$ is too large (e.g., greater than 30% of the thickness a), the subsequently formed modulation layer 118 may be too thick with respect to the thickness $a_1$ and falls out of the effective thickness range of modulating $V_t$. On the other hand, if the thickness $t_4$ is too small (e.g., less than 10% of the thickness a), there may not be sufficient distance between two adjacent channel layers 207 for forming the various layers of the gate stack 620 in subsequent processes.

Figure 26A:
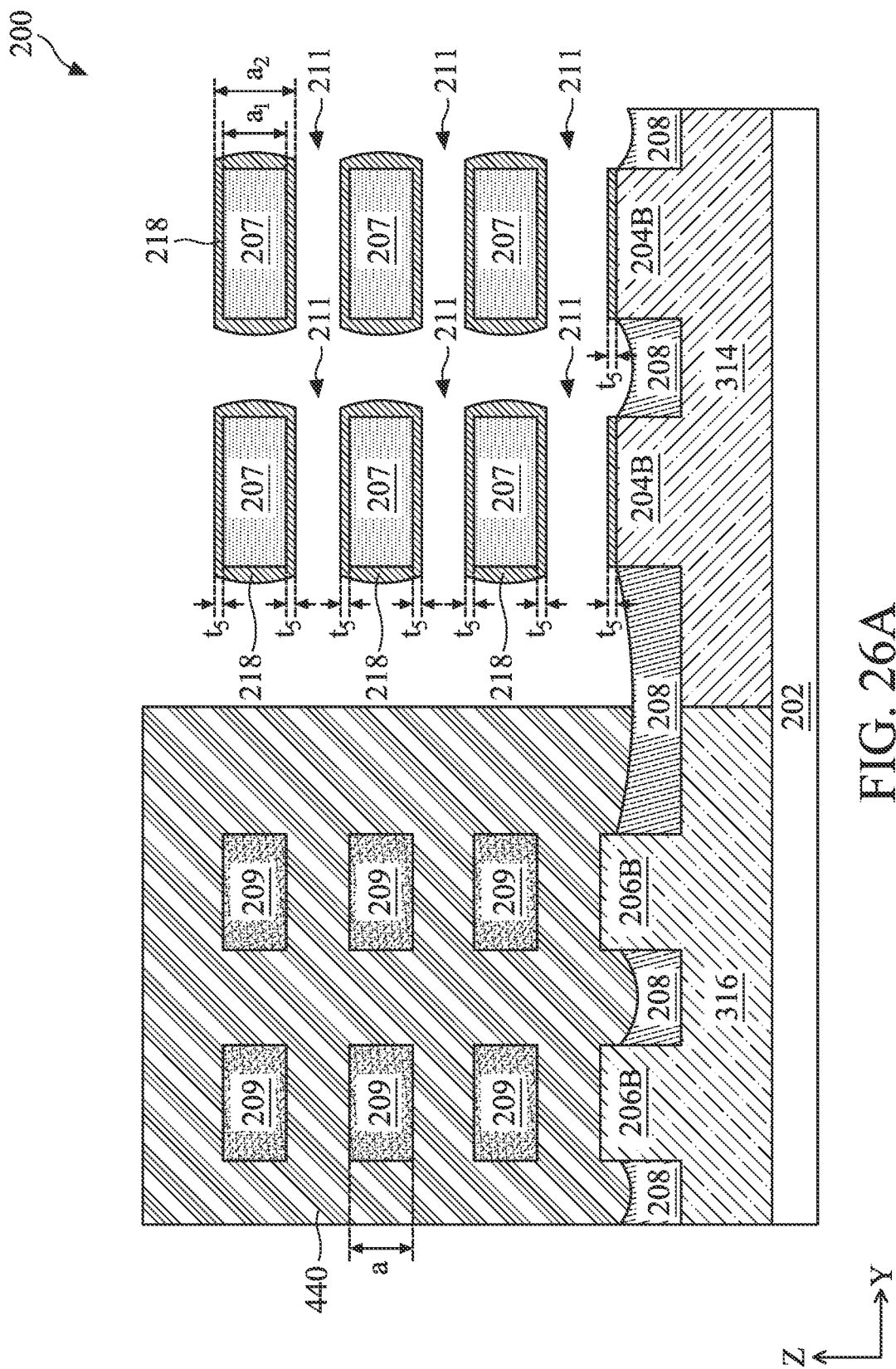
Figure 26B:
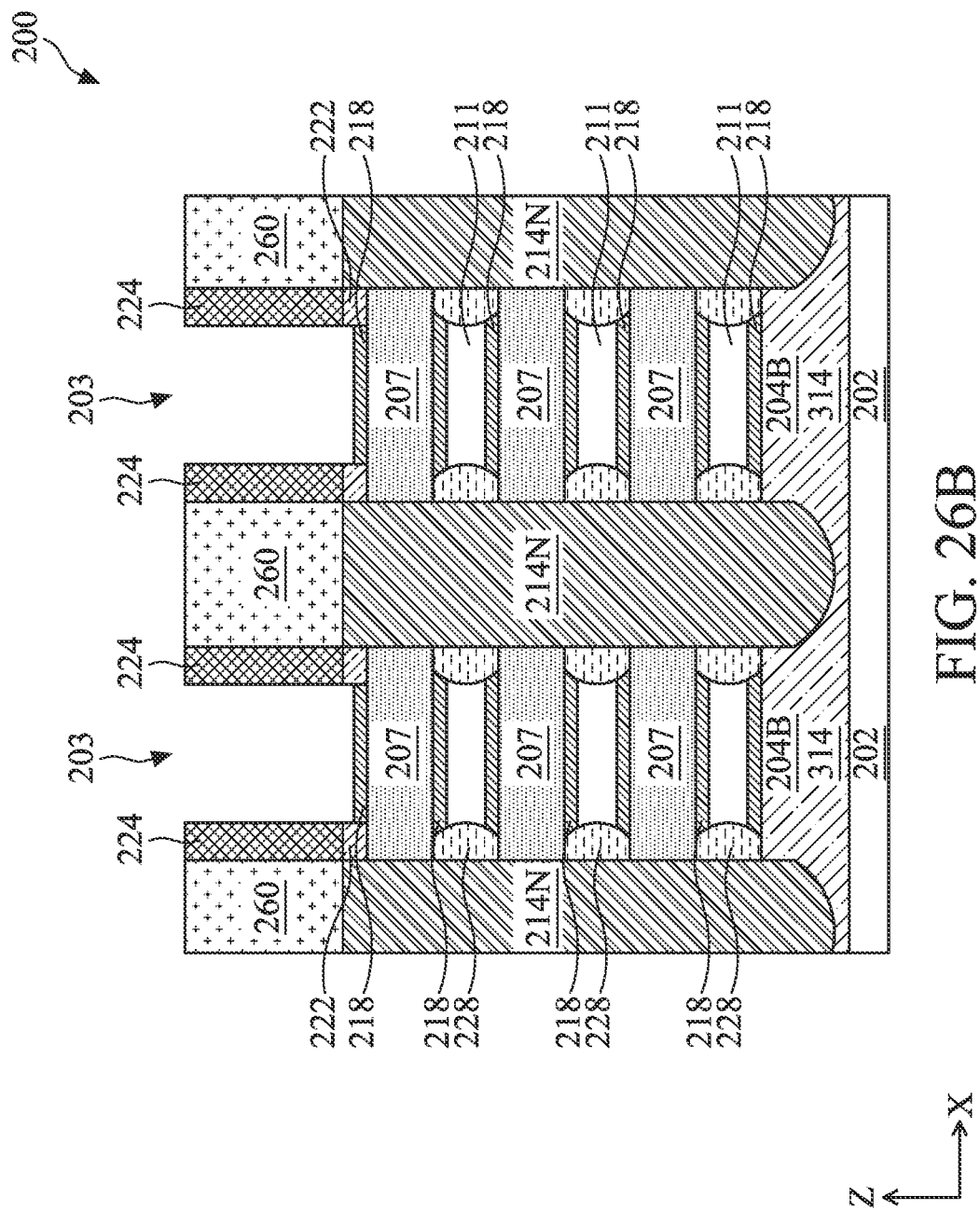

At operation 526, referring to FIGS. 26A and 26B, the method 500 forms the $V_t$ modulation layer 118 wrapping around the trimmed channel layers 207. The $V_t$ modulation layer 118 may be the same as or similar to the capping layer 216 discussed with respect to FIGS. 16A and 16B. The $V_t$ modulation layer 218 may be formed using a method similar to that explained with respect to FIGS. 8 to 9B, where the capping layer 212 is formed around each channel layers 207 first and then doped to form the capping layer 216. Alternatively, the capping layer 216 may be formed and doped in situ in one step. In some embodiments, the thickness of the $V_t$ modulation layer 218 is controlled by a deposition time. The mask 440 is removed after the forming of the capping layer 216.

In the embodiments depicted in FIGS. 26A and 26B, the $V_t$ modulation layer 218 covers the top surfaces, the bottom surfaces, and the sidewalls of the channel layers 207 and the base fins 204B. The channel layers 207 directly contact the $V_t$ modulation layer 118 without any sacrificial layers 205 disposed therebetween. The $V_t$ modulation layer 118 has a thickness $t_5$, while the thickness of the channel layers 207 together with the $V_t$ modulation layer 118 wrapped thereover is referred to as $a_2$. In some embodiments, the thickness $t_5$ is different from (e.g., less than) the thickness $t_4$ and the thickness $a_2$ is different from (e.g., less than) the thickness a. In the present embodiments, the thickness $t_5$ equals to or substantially equals to the thickness $t_4$, and the thickness $a_2$ equals or substantially equals to a. In the present embodiments, the thickness $t_5$ is about 10% to about 50% of the thickness $a_1$. In the present embodiments, the thickness $t_5$ is selected to effectively fine tune (or modulate) the $V_t$. If the thickness $t_5$ is too thin (e.g., less than 10% of the thickness $a_1$), the $V_t$ modulation layer 218 may not be able to modulate the $V_t$ effectively. On the other hand, if the thickness $t_5$ is too thick (e.g., greater than 50% of the thickness $a_1$), the opening 211 may be too narrow to form the various layers of the gate stack 620 in the subsequent processes.

Figure 28A:
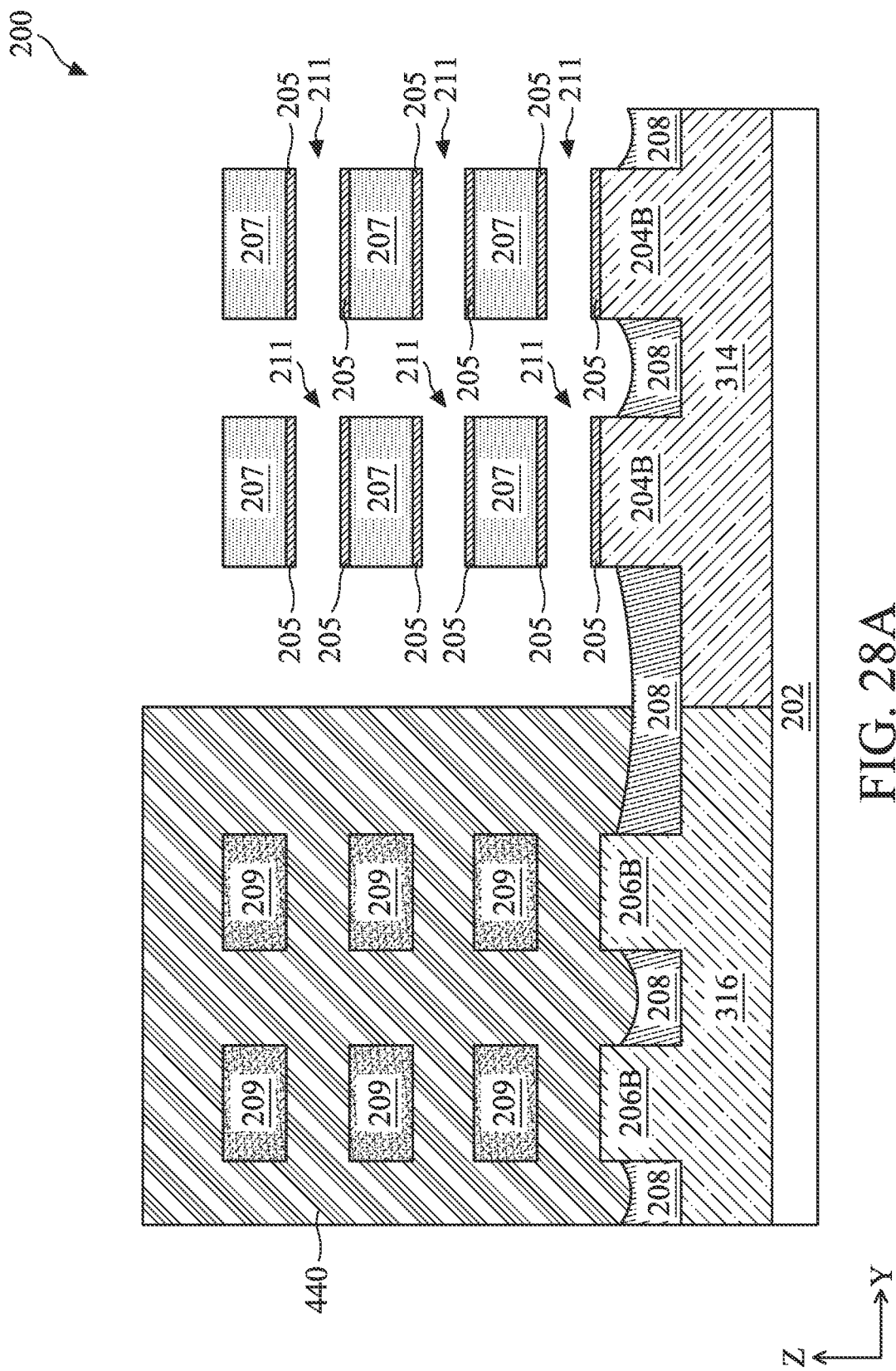
FIGS. 28A and 29A are cross-sectional views of the semiconductor device taken along line A-A' as shown in FIG. 4 during intermediate stages of the method shown in FIG. 27 according to various embodiments of the present disclosure.
Figure 28B:
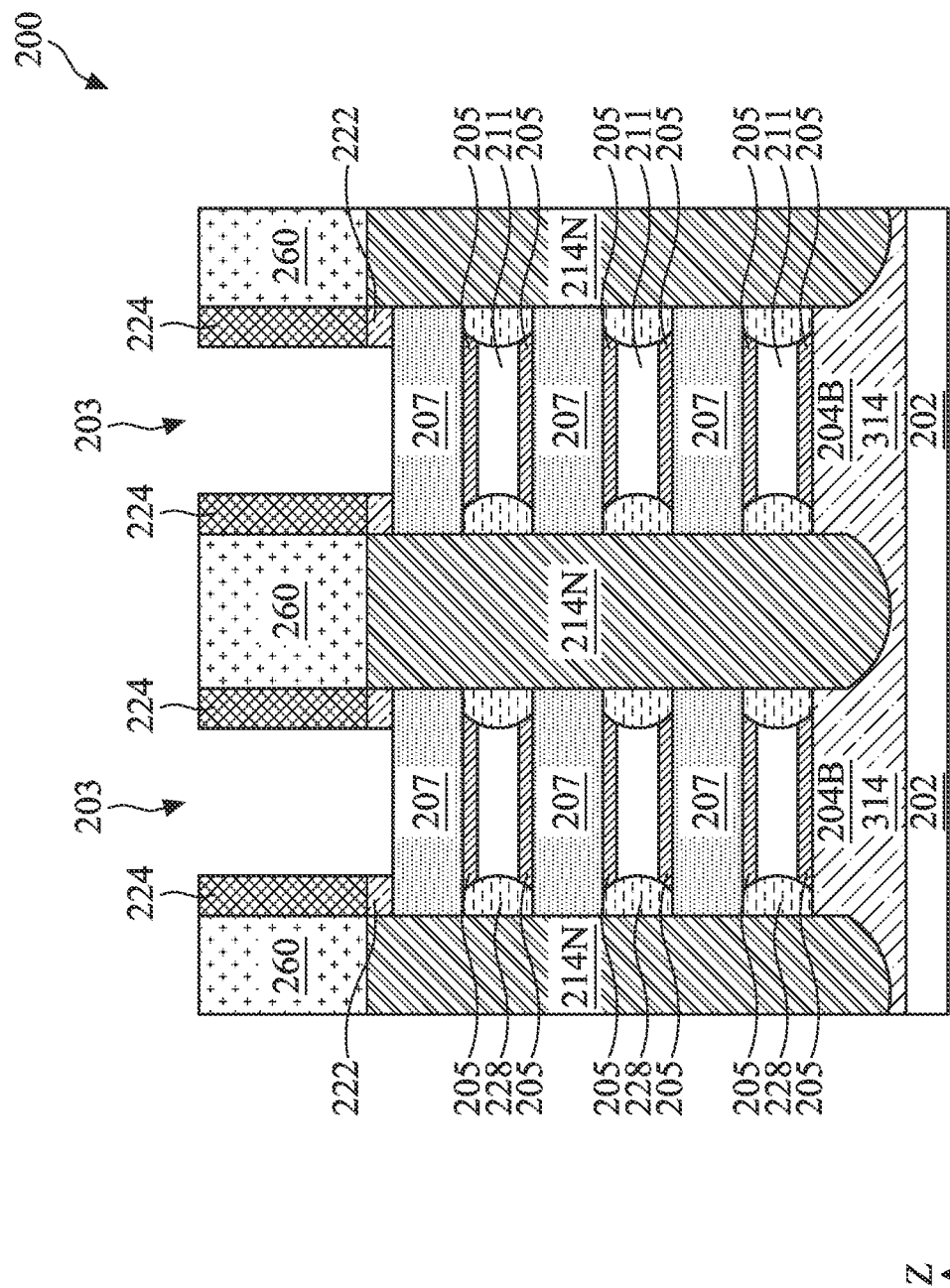
FIGS. 28B and 29B are cross-sectional views of the semiconductor device taken along line B-B' as shown in FIG. 4 during intermediate stages of the method shown in FIG. 27 according to various embodiments of the present disclosure.
Figure 29A:
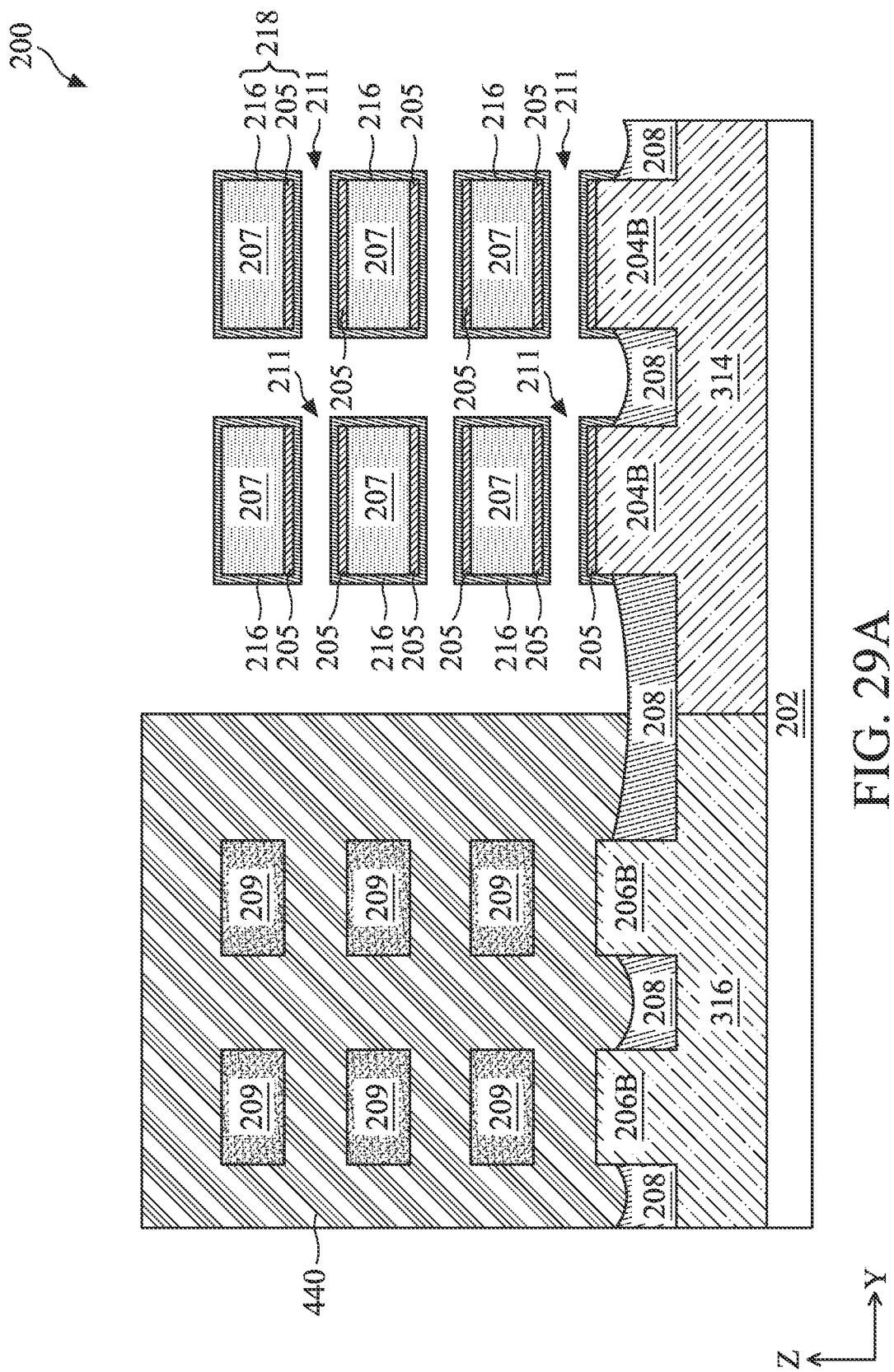
Figure 29B:
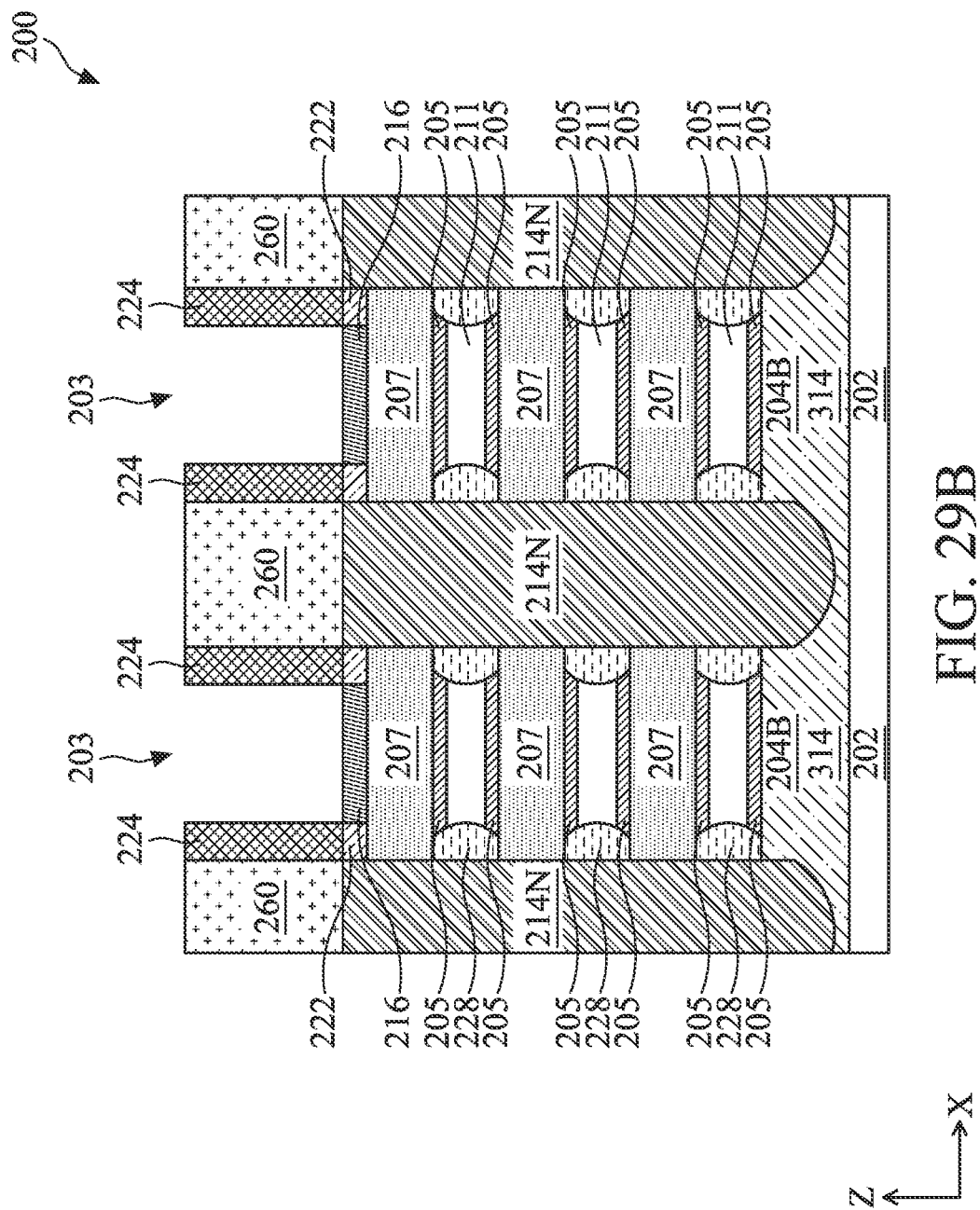

Referring to FIG. 27, alternative to completely removing the sacrificial layers 205 of the fins 204 at operation 522, the method 500 may partially remove the sacrificial layers 205 of the fins 204 at operation 722 as depicted in FIGS. 27, 28A and 28B. The remaining portions of the sacrificial layers 205 are disposed over the top and bottom surfaces of the channel layers 207 (except the top surface of the topmost channel layer 207) and the top surfaces of the base fins 204B. Thereafter, the method 500 forms the capping layer 216 over the channel layers 207 and the base fins 204B as shown in FIGS. 29A and 29B. The remaining portions of the sacrificial layers 205 and the capping layer 216 are collectively referred to as the $V_t$ modulation layer 218. In other words, the $V_t$ modulation layer 218 includes the remaining portions of the sacrificial layer 205 and the capping layer 216 wrapping around the sacrificial layer 205. The method 500 may then proceeds to operation 528 to form gate stacks as discussed in detail above.

Figure 30:
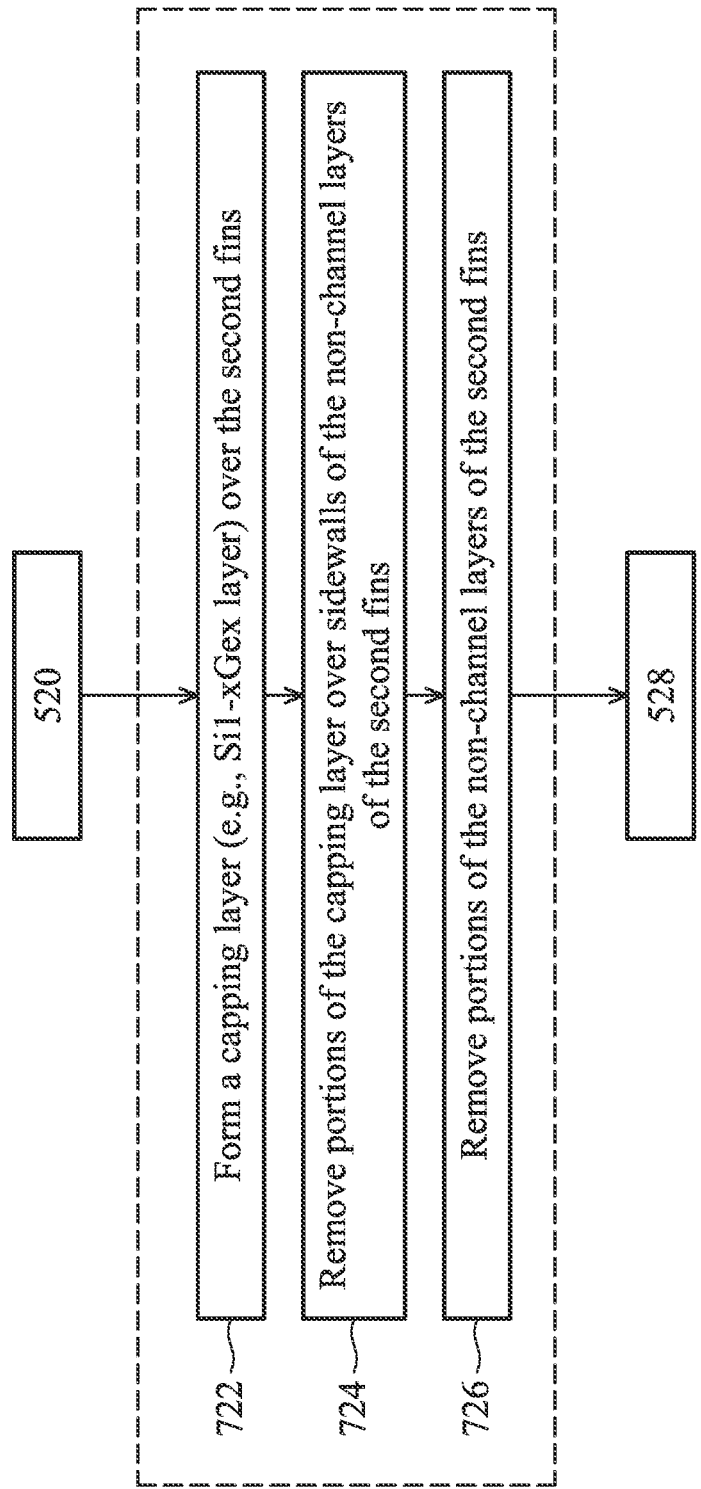
FIG. 30 illustrates a flow chart of a method for fabricating an IC device according to various aspects of the present disclosure.
Figure 31A:
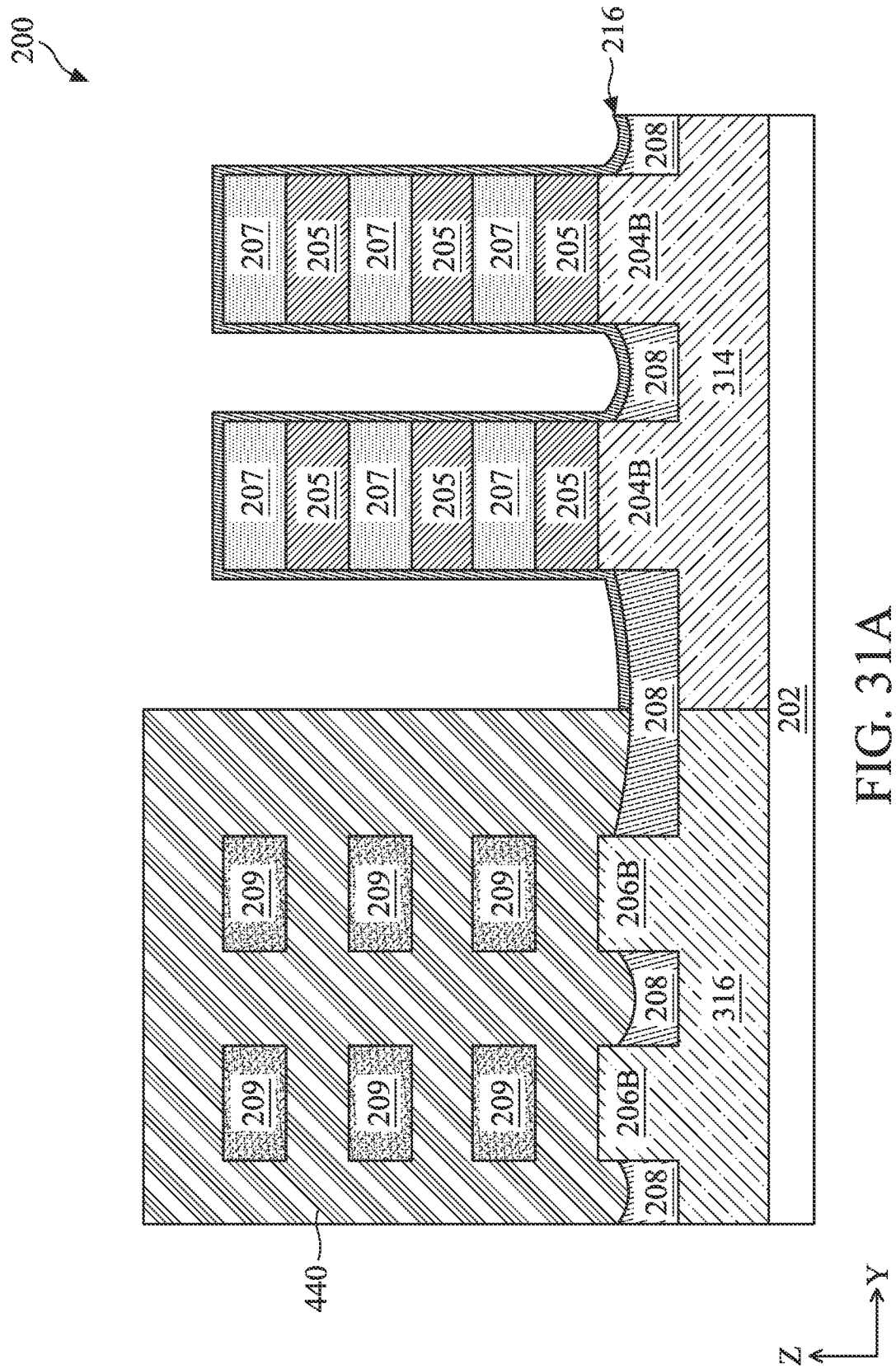
FIG. 31A is a cross-sectional view of the semiconductor device taken along line A-A' as shown in FIG. 4 during intermediate stages of the method shown in FIG. 30 according to various embodiments of the present disclosure.
Figure 31B:
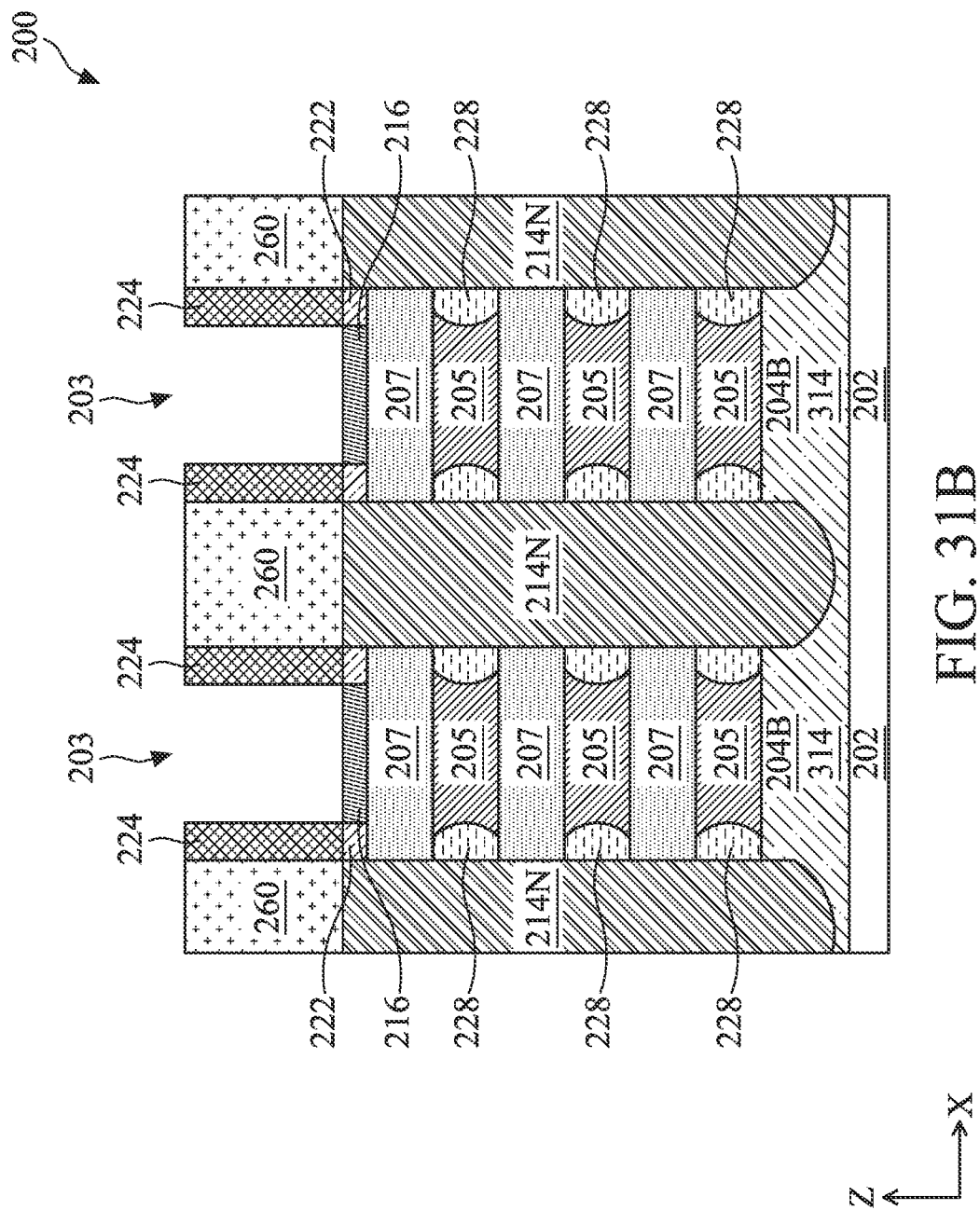
FIG. 31B is a cross-sectional view of the semiconductor device taken along line B-B' as shown in FIG. 4 during intermediate stages of the method shown in FIG. 30 according to various embodiments of the present disclosure.

Referring to FIG. 30, alternative to removing the sacrificial layers 205 of the fins 204 before forming the capping layer 216 as depicted in FIG. 21 from the operation 522 to the operation 526, the method 100 may form the capping layer 216 before the removing of the sacrificial layers 205 at operation 722. It is noted that the forming of the capping layer 216 is after the removing of the dummy gate stacks 220. The method 700 forms the capping layers 216 over the fins 204 (including the channel layers 207 and the sacrificial layers 205) and the adjacent isolation structures 208, during which the fins 206 are been protected under the mask 440 and are free of the capping layer 216 as depicted in FIGS. 31A and 31B. The method 100 removes portions of the capping layer 216 and portions of the sacrificial layers 205 of the fins 204 in the operations 724 and 726 similar to the operation 124 as explained in detail with respect to the FIGS. 16A and 16B. The method 100 then proceeds to operation 528 to form gate stacks as discussed in detail above.

Although not intended to be limiting, one or more embodiments of the present disclosure provide many benefits to a semiconductor device and the formation thereof. For example, the present disclosure provides a semiconductor structure including a $V_t$ modulation layer (e.g., a $Si_{1-x}Ge_x$ ($0.4 \leq x \leq 1$) layer) wrapping around each of the channel layers in a NS NFET, where an adjacent NS PFET is free of the $V_t$ modulation layer. The $V_t$ modulation layer 218 provides the $V_t$ between the NS PFETs and the NS NFETs, such that the work function metal layers of the metal gate stacks engaged with the n-type fins and the p-type fins can be the same (e.g., in composition and/or structure). Such configuration avoids complex patterning process of forming the metal gate stacks, reduces the metal boundary diffusion, and enhanced the mobilities of the electrons and holes through strain effect. Embodiments of the disclosed methods can be readily integrated into existing processes and technologies for manufacturing NS FETs, FinFETs, and/or other suitable devices.

In one aspect, the present disclosure provides a method that includes forming a first fin and a second fin protruding from a semiconductor substrate, where the first fin includes alternating first channel layers and first sacrificial layers, and where the second fin includes alternating second channel layers and second sacrificial layers, forming an isolation feature between the first fin and the second fin, forming a capping layer over the first fin, the second fin, and the isolation feature, forming a dummy gate stack over the capping layer, forming source/drain (S/D) features in the first fin and the second fin adjacent to the dummy gate stack, removing the dummy gate stack, thereby forming a gate trench, removing the capping layer over the first fin and the first sacrificial layers, thereby forming first gaps between the first channel layers, removing portions of the capping layer over the second fin and portions of the second sacrificial layers, thereby forming second gaps between the second channel layers, such that remaining portions of the second sacrificial layers and remaining portions of the capping layers form a threshold voltage ($V_t$) modulation layer, where the $V_t$ modulation layer wraps around each of the second channel layers, and forming a metal gate stack in the gate trench, the first gaps, and the second gaps.

In another aspect, the present disclosure provides a method that includes providing a semiconductor substrate, alternately stacking first and second semiconductors layers to form a semiconductor stack over the semiconductor substrate, patterning the semiconductor stack to form a first fin in a first region and a second fin parallel to the first fin in a second region, forming a dummy gate stack over the first fin and the second fin, epitaxially growing source/drain (S/D) features in S/D regions of the first fin and the second fin, removing the dummy gate stack to form a gate trench, removing the second semiconductor layers of the first fin and the second fin through the gate trench, forming a threshold voltage ($V_t$) modulation layer wrapping around each of the first semiconductor layers in the second region, and depositing a metal gate stack in the gate trench and engaging the first semiconductor layers in the first and second regions.

In yet another aspect, the present disclosure provides a semiconductor structure that includes a semiconductor substrate, first channel layers vertically stacked over the semiconductor substrate in a first region, second channel layers vertically stacked over the semiconductor substrate in a second region and adjacent to the first channel layers, a threshold voltage ($V_t$) modulation layer wrapping around each of the second channel layers in the second region, where the first region is free of the $V_t$ modulation layer, a dielectric layer wrapping around each of the first channel layers and the second channel layer over the $V_t$ modulation layer, and a metal gate stack disposed over and interposed with the first channel layers and the second channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first fin and a second fin protruding from a semiconductor substrate, wherein the first fin includes alternating first channel layers and first sacrificial layers, and wherein the second fin includes alternating second channel layers and second sacrificial layers;
    forming an isolation feature between the first fin and the second fin;
    forming a capping layer over the first fin, the second fin, and the isolation feature;
    forming a dummy gate stack over the capping layer;
    forming source/drain (S/D) features in the first fin and the second fin adjacent to the dummy gate stack;
    removing the dummy gate stack, thereby forming a gate trench;
    removing the first sacrificial layers and the capping layer over the first fin, thereby forming first gaps between the first channel layers;
    removing portions of the capping layer over the second fin and portions of the second sacrificial layers, thereby forming second gaps between the second channel layers, such that remaining portions of the second sacrificial layers and remaining portions of the capping layer form a threshold voltage (Vt) modulation layer, wherein the $V_t$ modulation layer wraps around each of the second channel layers; and
    forming a metal gate stack in the gate trench, the first gaps, and the second gaps.

2. The method of claim 1, wherein the capping layer includes $Si_{1-x}Ge_x$ (0.4≤x≤1) and the second sacrificial layers include $Si_{1-y}Ge_y$ (0≤y≤1), wherein x is different from y.

3. The method of claim 1, wherein the forming of the $V_t$ modulation layer includes:
    forming a silicon layer over the first fin and the second fin; and
    doping the silicon layer with germanium.

4. The method of claim 1, wherein the removing of the portions of the capping layer over the second fin and the portions of the second sacrificial layers includes:
    forming a mask over the first fin after the removing of the capping layer over the first fin and the first sacrificial layers;
    removing portions of the capping layer on sidewalls of the second sacrificial layers; and
    removing portions of the second sacrificial layers, thereby forming the second gaps between the second channel layers.

5. The method of claim 1, wherein the first fin is a portion of a pull-up transistor of a static random-access memory (SRAM) cell, and wherein the second fin is a portion of a pull-down transistor of the SRAM cell.

6. The method of claim 1, wherein the forming of the metal gate stack includes:
    forming a gate dielectric layer wrapping around each of the first channel layers and the $V_t$ modulation layer, thereby partially filling the first gaps and the second gaps;
    forming a work-function metal (WFM) layer over the gate dielectric layer, thereby completely filling the first gaps and the second gaps;
    forming a gate cap layer over the WFM layer; and
    forming a metal fill layer over the gate cap layer.

7. The method of claim 6, wherein the WFM layer spans from the first fin to the second fin.

8. The method of claim 1, further comprising:
    forming a protecting layer over the capping layer before the forming of the dummy gate stack; and
    removing the protecting layer after removing the dummy gate stack.

9. A method, comprising:
    providing a semiconductor substrate;
    alternately stacking first semiconductor layers and second semiconductors layers to form a semiconductor stack over the semiconductor substrate;
    patterning the semiconductor stack to form a first fin in a first region and a second fin parallel to the first fin in a second region;

forming a dummy gate stack over the first fin and the second fin;
epitaxially growing source/drain (S/D) features in S/D regions of the first fin and the second fin;
removing the dummy gate stack to form a gate trench;
removing the second semiconductor layers of the first fin and the second fin through the gate trench;
forming a threshold voltage ($V_t$) modulation layer wrapping around each of the first semiconductor layers in the second region; and
depositing a metal gate stack in the gate trench, the metal gate stack wrapping around each of the first semiconductor layers in the first region, the metal gate stack extending into gaps vertically between the first semiconductor layers in the second region and thereby dividing the $V_t$ modulation layer as segments.

10. The method of claim 9, wherein the $V_t$ modulation layer includes $Si_{1-x}Ge_x$, wherein x is about 40% to about 50%, and wherein a thickness of the $V_t$ modulation layer is about 10% to about 30% of a thickness of the first semiconductor layers wrapped thereover.

11. The method of claim 9, wherein the forming of the $V_t$ modulation layer includes:
covering the first fin with a mask;
depositing a silicon layer over each of the first semiconductor layers of the second fin;
doping the silicon layer with germanium; and
removing the mask.

12. The method of claim 9, further comprising trimming the first semiconductor layers in the second region prior to the forming of the $V_t$ modulation layer.

13. The method of claim 9, wherein the first fin is from a pull-up transistor of a static random-access memory (SRAM) cell and the second fin is from a pull-down transistor of the SRAM cell.

14. The method of claim 9, wherein the forming of the metal gate stack includes:
forming a gate dielectric layer wrapping around each of the first semiconductor layers in the first region and each portion of the $V_t$ modulation layer in the second region;
forming a work-function metal (WFM) layer over the gate dielectric layer, wherein portions of the WFM layer are disposed between the first semiconductor layers of the first fin and the second fin;
forming a liner layer over the WFM layer; and
forming a metal fill layer over the liner layer.

15. A method, comprising:
forming a first fin and a second fin protruding from a semiconductor substrate, wherein the first fin includes alternating first channel layers and first sacrificial layers, and wherein the second fin includes alternating second channel layers and second sacrificial layers;
forming a capping layer on top and sidewall surfaces of the first fin and the second fin;
forming a dummy gate stack over the capping layer;
forming gate spacers on sidewalls of the dummy gate stack;
removing the dummy gate stack, thereby forming a gate trench;
removing the capping layer from the first fin and removing the first sacrificial layers;
partially removing the capping layer from the second fin and partially removing the second sacrificial layers, such that remaining portions of the capping layer and remaining portions of the second sacrificial layers form a threshold voltage modulation layer wrapping around each of the second channel layers; and
forming a metal gate stack in the gate trench.

16. The method of claim 15, wherein a thickness of the threshold voltage modulation layer is about 10% to about 30% of a thickness of the second channel layers.

17. The method of claim 15, wherein the threshold voltage modulation layer includes $Si_{1-x}Ge_x$, wherein x is about 40% to about 100%.

18. The method of claim 15, wherein the first channel layers are portions of a pull-up transistor of a static random-access memory (SRAM) cell, and the second channel layers are portions of a pull-down transistor of the SRAM cell.

19. The method of claim 15, wherein a thickness of a single one of the first channel layers equals to a sum of a thickness of a single one of the second channel layers and two times of a thickness of the threshold voltage modulation layer.

20. The method of claim 15, further comprising:
forming an isolation feature between the first fin and the second fin, wherein the forming of the capping layer includes depositing the capping layer on a top surface of the isolation feature.

* * * * *